United States Patent
Kato et al.

(12) 
(10) Patent No.: US 6,570,194 B2
(45) Date of Patent: May 27, 2003

(54) COMPOUND SEMICONDUCTOR FIELD EFFECT TRANSISTOR WITH IMPROVED OHMIC CONTACT LAYER STRUCTURE AND METHOD OF FORMING THE SAME

(75) Inventors: Takehiko Kato, Tokyo (JP); Naotaka Iwata, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/793,656

(22) Filed: Feb. 27, 2001

(65) Prior Publication Data

US 2001/0019123 A1 Sep. 6, 2001

(30) Foreign Application Priority Data

Feb. 28, 2000 (JP) ........................ 2000-051963

(51) Int. Cl.⁷ .................. H01L 31/0328; H01L 31/0336
(52) U.S. Cl. ...................... 257/194; 257/192; 257/195; 257/20; 257/24; 438/167; 438/172
(58) Field of Search ............................... 257/192, 194, 257/20, 24, 201, 195; 438/172, 285, 590, 167, 168, 169

(56) References Cited

U.S. PATENT DOCUMENTS 5,844,261 A * 12/1998 Kuo et al. .................. 257/194
5,949,096 A * 9/1999 Ohkubo et al. ............. 257/192

FOREIGN PATENT DOCUMENTS

| JP | A 62-232170 | 10/1987 | |
| JP | 3-286540 A * | 12/1991 | ............... 257/194 |
| JP | A 10-64924 | 3/1998 | |

* cited by examiner

*Primary Examiner*—Tom Thomas
*Assistant Examiner*—Donghee Kang
(74) *Attorney, Agent, or Firm*—Young & Thompson

(57) ABSTRACT

The present invention provides a structure of a semiconductor device, the structure comprising: a compound semiconductor multi-layer structure having at least a channel region; and at least an ohmic contact layer provided adjacent to a first side face of the multi-layer structure, and the ohmic contact layer being in contact with at least a part of the first side face, wherein the ohmic contact layer has a top extending portion which extends in contact with a part of a top surface of the multi-layer structure.

23 Claims, 17 Drawing Sheets

COMPOUND SEMICONDUCTOR FIELD EFFECT TRANSISTOR WITH IMPROVED OHMIC CONTACT LAYER STRUCTURE AND METHOD OF FORMING THE SAME

BACKGROUND OF THE INVENTION

The present invention relates to a compound semiconductor field effect transistor and a method of forming the same, and more particularly to a group III–V compound semiconductor hetero-junction field effect transistor.

The group III–V compound semiconductor hetero-junction field effect transistor is a high speed and high frequency device which is superior in low noise, high output and high efficiency. The typical group III–V compound semiconductor is, for example, GaAs based compound semiconductor and InP-based compound semiconductor. A high electron mobility transistor and a p-n junction field effect transistor are the typical compound semiconductor hetero-junction field effect transistors. An ON-resistance is a total resistance between a source electrode and a drain electrode through a channel layer or an active region. The possible reduction in contact resistance is important for obtaining high output and high efficiency in low voltage driving condition.

FIG. 1 is a fragmentary cross sectional elevation view illustrative of a first conventional hetero-junction field effect transistor. The first conventional hetero-junction field effect transistor has the following structure. An AlGaAs buffer layer 203 is provided on a top surface of a semi-insulating GaAs substrate 201. An undoped InGaAs layer 204 is provided on a top surface of the AlGaAs buffer layer 203. An n-AlGaAs layer 205 is provided on a top surface of the undoped InGaAs layer 204. A pair of n+-GaAs ohmic contact layers 202 are selectively provided on a top surface of the n-AlGaAs layer 205. The n+-GaAs ohmic contact layers 202 may be formed by forming a single n+-GaAs ohmic contact layer on a top surface of the n-AlGaAs layer 205 and then selectively etching the single n+-GaAs ohmic contact layer to form, a recessed portion in the n+-GaAs ohmic contact layer, thereby to form the n+-GaAs ohmic contact layers 202, wherein a part of the top surface of the n-AlGaAs layer 205 is shown under the recessed portion. A gate electrode 208 is selectively provided on the shown part of the top surface of the n-AlGaAs layer 205, wherein the gate electrode 208 is distanced from the n+-GaAs ohmic contact layers 202. Source and drain electrodes 206 and 207 are respectively provided on the top surfaces of the n+-GaAs ohmic contact layers 202. The three laminated layers, for example, the n+-GaAs ohmic contact layers 202, the n-AlGaAs layer 205 and the undoped InGaAs layer 204 provide potential barriers to electron currents between the source and drain electrodes 206 and 207 and a two-dimensional electron gas layer formed in the undoped InGaAs layer 204. Those potential barriers increase the contact resistance.

In Japanese laid-open patent publication No. 5-175245, it is disclosed that in order to reduce the contact resistance or reduce the potential barrier, n+-GaAs ohmic contact layers are selectively provided on parts of a top surface of a semi-insulating GaAs substrate and source and drain electrodes are respectively provided on top surfaces of the n+-GaAs ohmic contact layers, and a multi-layer structure is also selectively provided on the top surface of the semi-insulating GaAs substrate and the multi-layer structure is sandwiched between the n+-GaAs ohmic contact layers.

FIG. 2 is a fragmentary cross sectional elevation view illustrative of a second conventional hetero-junction field effect transistor. The second conventional hetero-junction field effect transistor has the following structure. An AlGaAs buffer layer 303 is selectively provided on a part of a top surface of a semi-insulating GaAs substrate 301. An undoped InGaAs layer 304 is provided on a top surface of the AlGaAs buffer layer 303. An n-AlGaAs layer 305 is provided on a top surface of the undoped InGaAs layer 304. The laminations of the AlGaAs buffer layer 303, the undoped InGaAs layer 304 and the n-AlGaAs layer 305 form a multi-layer structure. A first n+-GaAs ohmic contact layer 302-1 is selectively provided on the top surface of the semi-insulating GaAs substrate 301 and the first n+GaAs ohmic contact layer 302-1 is adjacent to and in contact with a first side face of the multi-layer structure. A top level of the first n+-GaAs ohmic contact layer 302-1 is higher than the top surface of the multi-layer structure. A second n+-GaAs ohmic contact layer 302-2 is selectively provided on the top surface of the semi-insulating GaAs substrate 301 and the second n+-GaAs ohmic contact layer 302-2 is adjacent to and in contact with a second side face of the multi-layer structure, wherein the second side face of the multi-layer structure is positioned in opposite side to the first side face of the multi-layer structure. A top level of the second n+-GaAs ohmic contact layer 302-2 is higher than the top surface of the multi-layer structure. The multi-layer structure is sandwiched between the first and second n+-GaAs ohmic contact layers 302-1 and 302-2. A source electrode 306 is provided on the first n+-GaAs ohmic contact layer 302-1. A drain electrode 307 is provided on the second n+-GaAs ohmic contact layer 302-2. A gate electrode 308 is selectively provided on a part of a top surface of the n-AlGaAs layer 305, so that the gate electrode 308 is distanced from the first and second n+-GaAs ohmic contact layers 302-1 and 302-2 and also from the source and drain electrodes 306 and 307. Only the first and second n+-GaAs ohmic contact layers 302-1 and 302-2 provide potential barriers to electron currents between the source and drain electrodes 306 and 307 and a two-dimensional electron gas layer formed in the undoped InGaAs layer 304. The n-AlGaAs layer 305 and the undoped InGaAs layer 304 provide no potential barriers to the electron currents. Those potential barrier, to which the electron currents sense, is lower than that of the first conventional structure of FIG. 1. The lower potential barrier results in a lower contact resistance. The current path is defined by a contact area between a channel layer and the first and second n+-GaAs ohmic contact layers 302-1 and 302-2. Namely, the contact area between a channel layer and the first and second n+-Gas ohmic contact layers 302-1 and 302-2 depends upon a thickness of the channel layer. The channel layer is, however, thin. In case of the high electron mobility field effect transistor, the thickness of the channel layer is approximately 15 nanometers. It is difficult for the advanced compound semiconductor hetero-junction field effect transistor to increase the thickness of the channel layer.

The above second conventional structure of the ohmic contact layers 302 may be formed by either one of the following three methods. The first conventional fabrication method is that the above multi-layer structure is epitaxially grown for subsequent selective ion-implantation into source and drain regions in the multi-layer structure. The second conventional fabrication method is that a single ohmic contact layer having a high impurity concentration is formed for subsequent selective etching process to form a recessed portion, whereby the single ohmic contact layer is divided into two parts, before the multi-layer structure having the channel layer is then formed in the recessed portion, so that the multi-layer structure is interposed between the two ohmic contact layers. This second conventional method is disclosed in the above Japanese laid-open patent publication No. 5-175245. The third conventional fabrication method is that the multilayer structure having the channel layer is epitaxially grown for subsequent selective etching to the multilayer structure in source and drain regions before ohmic contact layers are selectively formed on the source and drain regions so that the multi-layer structure is sandwiched between the ohmic contact layers.

As long as it is difficult to reduce the thickness of the channel layer in the advanced compound semiconductor field effect transistor, it is difficult to further reduce the contact resistance from the electrodes to the channel layer.

In the above circumstances, it had been required to develop a novel field effect transistor and method of forming the same free from the above problem.

SUMMARY OF THE INVENTION

Accordingly, it is an object of the present invention to provide a novel ohmic contact layer structure in a compound semiconductor device free from the above problems.

It is a further object of the present invention to provide a novel ohmic contact layer structure in a compound semiconductor device, wherein a contact resistance from electrode to a channel layer is reduced.

It is a still further object of the present invention to provide a novel compound semiconductor field effect transistor free from the above problems.

It is yet a further object of the present invention to provide a novel compound semiconductor field effect transistor reduced in a contact resistance from electrode to a channel layer.

It is a still further object of the present invention to provide a novel method of forming a compound semiconductor field effect transistor free from the above problems.

It is yet a further object of the present invention to provide a novel method of forming a compound semiconductor field effect transistor reduced in a contact resistance from electrode to a channel layer The first present invention provides a structure of a semiconductor device, the structure comprising a compound semiconductor multi-layer structure having at least a channel region; and at least an ohmic contact layer provided adjacent to a first side face of the multi-layer structure, and the ohmic contact layer being in contact with at least a part of the first side face, wherein the ohmic contact layer has a top extending portion which extends in contact with a part of a top surface of the multi-layer structure.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
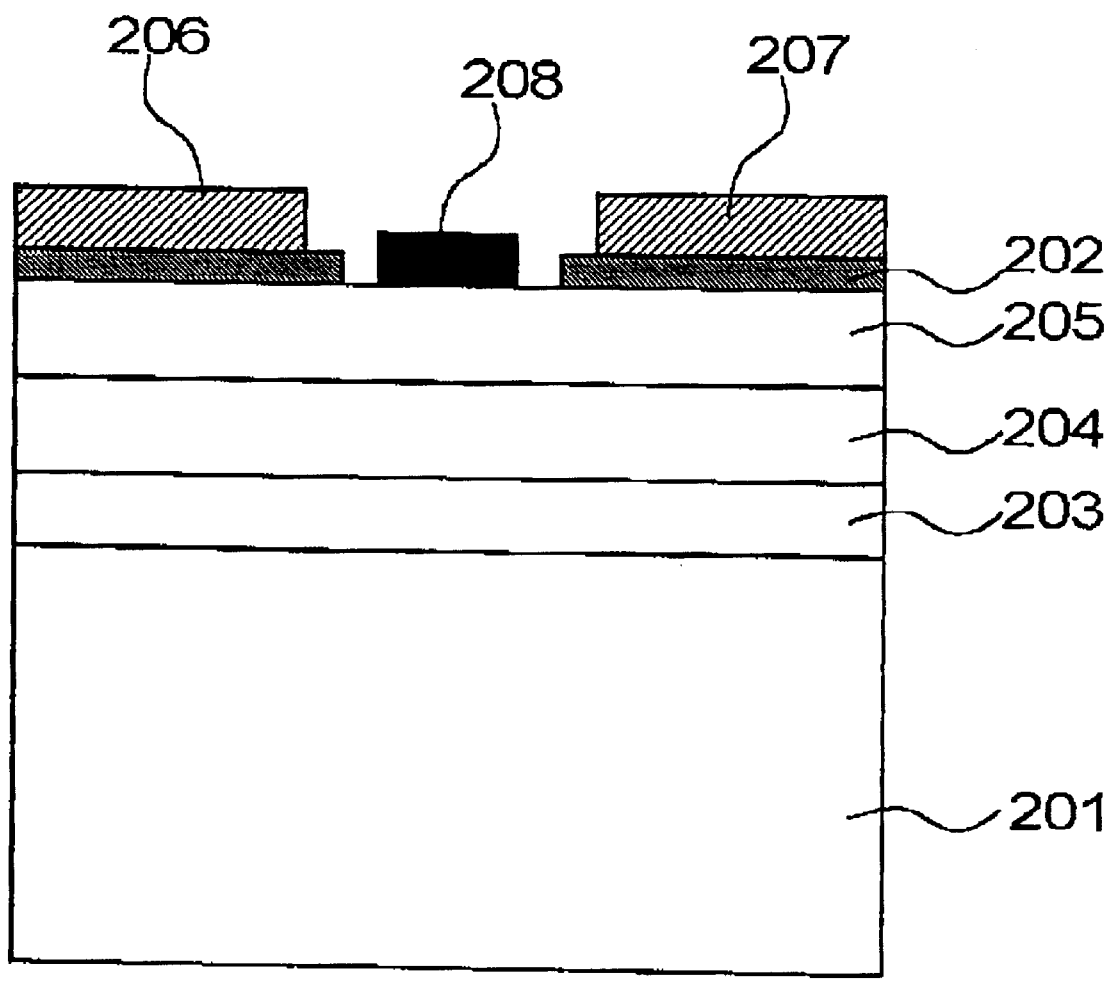
FIG. 1 is a fragmentary cross sectional elevation view illustrative of the first conventional hetero-junction field effect transistor.
Figure 2:
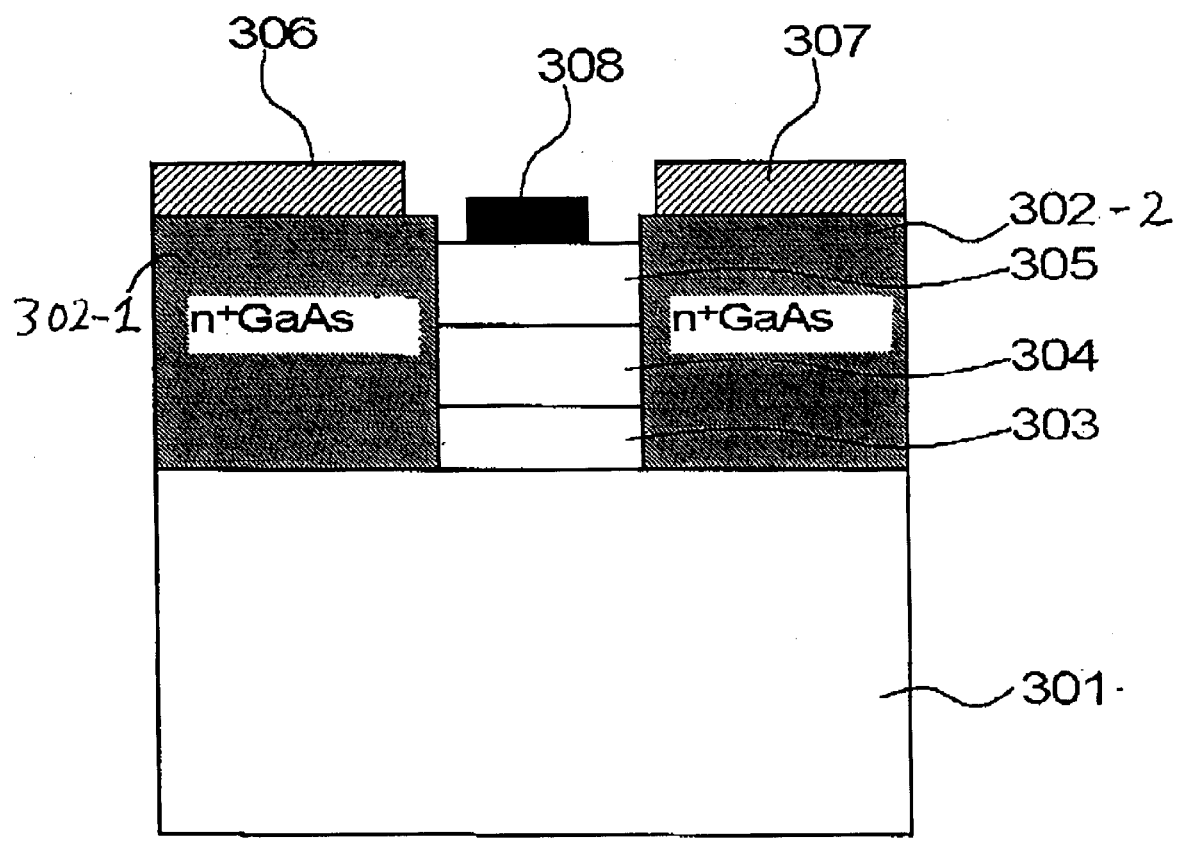
FIG. 2 is a fragmentary cross sectional elevation view illustrative of the second conventional hetero-junction field effect transistor.

The first present invention provides a structure of a semiconductor device, the structure comprising: a compound semiconductor multi-layer structure having at least a channel region and at least an ohmic contact layer provided adjacent to a first side face of the multi-layer structure, and the ohmic contact layer being in contact with at least a part of the first side face, wherein the ohmic contact layer has a top extending portion which extends in contact with a part of a top surface of the multi-layer structure.

The above top-extending portion of the ohmic contact layer provides an additional current path between the ohmic contact layer and the channel region, which may provide a reduction in contact resistance between the electrode on the ohmic contact layer through the channel region in the multi-layer structure.

It is preferable that the ohmic contact layer is in contact with at least the channel region on the first side face of the multi-layer structure.

It is further preferable that the ohmic contact layer extends in contact with an entire part of the first side face of the multi-layer structure.

It is also preferable that the top extending portion of the ohmic contact layer extends continuously from an edge of the top surface of the multi-layer structure inwardly.

It is further preferable that the top extending portion of the ohmic contact layer has a first lateral length which is defined between an inside edge of the top extending portion and the edge of the top surface of the multi-layer structure, and the first lateral length is not less than a total thickness of the multi-layer structure.

It is further more preferable that the first lateral length is not more than a half of a distance between the edge of the top surface of the multi-layer structure and an edge of a gate electrode provided over the top surface of the multi-layer structure.

It is moreover preferable that the gate electrode is provided on an epitaxial layer selectively provided on the top surface of the multi-layer structure, and the epitaxial layer has an opposite electrical conductivity to the channel region.

It is also preferable that the gate electrode is provided on the top surface of the multi-layer structure.

It is also preferable that the multi-layer structure has a top layer comprising an AlGaAs layer having Al-index of not less than 0.3.

It is also preferable that the ohmic contact layer comprises a compound semiconductor layer.

It is also preferable that the ohmic contact layer further has at least a side extending portion which extends in contact with at least a part of at least one of two adjacent side faces to the first side face of the multi-layer structure.

The above side-extending portion of the ohmic contact layer provides an additional current path between the ohmic contact layer and the channel region, which may provide a reduction in contact resistance between the electrode on the ohmic contact layer through the channel region in the multi-layer structure.

It is further preferable that the side extending portion of the ohmic contact layer is in contact with at least the channel region.

It is also preferable that the ohmic contact layer has two of the side extending portion extending in contact with both the two adjacent side faces from a bottom level to a top level of the multi-layer structure.

It is also preferable that the at least side extending portion of the ohmic contact layer extends continuously from an edge of the adjacent side face of the multi-layer structure inwardly.

It is further preferable that the at least side extending portion of the ohmic contact layer increases in lateral length from a top level toward the same level as the channel region, so that the at least side extending portion has a maximum lateral length in the same level as the channel region.

It is also preferable that the ohmic contact layer moreover has a bottom extending portion which extends in contact with at least a part of a bottom face of the multi-layer structure.

The above bottom-extending portion of the ohmic contact layer provides an additional current path between the ohmic contact layer and the channel region, which may provide a reduction in contact resistance between the electrode on the ohmic contact layer through the channel region in the multi-layer structure.

It is further preferable that the bottom extending portion of the ohmic contact layer extends continuously from a bottom edge of the bottom face of the multi-layer structure inwardly.

It is also preferable that the ohmic contact layer further more has a top extending portion which extends in contact with a part of a top surface of the multi-layer structure, and the ohmic contact layer furthermore has the two side extending portions which extend in contact with at least parts of two adjacent side faces to the first side face of the multi-layer structure from a bottom level to a top level of the multi-layer structure, and the ohmic contact layer moreover has a bottom extending portion which extends in contact with at least a part of a bottom face of the multi-layer structure.

It is further preferable that the top extending portion of the ohmic contact layer extends continuously from an edge of the top surface of the multi-layer structure inwardly, and the two side extending portions extend continuously from edges of the adjacent side faces of the multi-layer structure inwardly so that the two side extending portions increase in lateral length from a top level toward the same level as the channel region, whereby the at least side extending portion has a maximum lateral length in the same level as the channel region, and also wherein the bottom extending portion of the ohmic contact layer extends continuously from a bottom edge of the bottom face of the multi-layer structure inwardly.

It is also preferable that the multi-layer structure and the at least ohmic contact layer are provided over a buffer layer which is provided over a semiconductor substrate.

The second present invention provides a structure of a semiconductor device. The structure comprises: a compound semiconductor multi-layer structure having at least a channel region; and at least an ohmic contact layer provided adjacent to a first side face of the multi-layer structure, and the ohmic contact layer being in contact with at least a part of the first side face, wherein the ohmic contact layer further has at least a side extending portion which extends in contact with at least a part of at least one of two adjacent side faces to the first side face of the multi-layer structure.

The above side-extending portion of the ohmic contact layer provides an additional current path between the ohmic contact layer and the channel region, which may provide a reduction in contact resistance between the electrode on the ohmic contact layer through the channel region in the multi-layer structure.

It is also preferable that the ohmic contact layer is in contact with at least the channel region on the first side face of the multi-layer structure.

It is also preferable that the ohmic contact layer extends in contact with an entire part of the first side face of the multi-layer structure.

It is also preferable that the side extending portion of the ohmic contact layer is in contact with at least the channel region.

It is also preferable that the ohmic contact layer has two of the side extending portion extending in contact with both the two adjacent side faces from a bottom level to a top level of the multi-layer structure.

It is also preferable that the at least side extending portion of the ohmic contact layer extends continuously from an edge of the adjacent side face of the multi-layer structure inwardly.

It is further preferable that the at least side extending portion of the ohmic contact layer increases in lateral length from a top level toward the same level as the channel region, so that the at least side extending portion has a maximum lateral length in the same level as the channel region.

It is also preferable that the ohmic contact layer moreover has a bottom extending portion which extends in contact with at least a part of a bottom face of the multi-layer structure.

The above bottom-extending portion of the ohmic contact layer provides an additional current path between the ohmic contact layer and the channel region, which may provide a reduction in contact resistance between the electrode on the ohmic contact layer through the channel region in the multi-layer structure.

It is further preferable that the bottom extending portion of the ohmic contact layer extends continuously from a bottom edge of the bottom face of the multi-layer structure inwardly.

It is also preferable that the ohmic contact layer furthermore has a top extending portion which extends in contact with a part of a top surface of the multi-layer structure.

The above top-extending portion of the ohmic contact layer provides an additional current path between the ohmic contact layer and the channel region, which may provide a reduction in contact resistance between the electrode on the ohmic contact layer through the channel region in the multi-layer structure.

It is further preferable that the top extending portion of the ohmic contact layer extends continuously from an edge of the top surface of the multi-layer structure inwardly.

It is further preferable that the top extending portion of the ohmic contact layer has a first lateral length which is defined between an inside edge of the top extending portion and the edge of the top surface of the multi-layer structure, and the first lateral length is not less than a total thickness of the multi-layer structure.

It is farther more preferable that the first lateral length is not more than a half of a distance between the edge of the top surface of the multi-layer structure and an edge of a gate electrode provided over the top surface of the multi-layer structure.

It is moreover preferable that the gate electrode is provided on an epitaxial layer selectively provided on the top surface of the multi-layer structure, and the epitaxial layer has an opposite electrical conductivity to the channel region.

It is also preferable that the gate electrode is provided on the top surface of the multi-layer structure.

It is also preferable that the multi-layer structure has a top layer comprising an AlGaAs layer having Al-index of not less than 0.3.

It is also preferable that the ohmic contact layer comprises a compound semiconductor layer.

It is also preferable that the ohmic contact layer further more has a top extending portion which extends in contact with a part of a top surface of the multi-layer structure, and the ohmic contact layer furthermore has the two side extending portions which extend in contact with at least parts of two adjacent side faces to the first side face of the multi-layer structure from a bottom level to a top level of the multi-layer structure, and the ohmic contact layer moreover has a bottom extending portion which extends in contact with at least a part of a bottom face of the multi-layer structure.

The above top-extending portion of the ohmic contact layer provides an additional current path between the ohmic contact layer and the channel region, which may provide a reduction in contact resistance between the electrode on the ohmic contact layer through the channel region in the multi-layer structure.

It is further more preferable that the top extending portion of the ohmic contact layer extends continuously from an edge of the top surface of the multi-layer structure inwardly, and the two side extending portions extend continuously from edges of the adjacent side faces of the multi-layer structure inwardly so that the two side extending portions increase in lateral length from a top level toward the same level as the channel region, whereby the at least side extending portion has a maximum lateral length in the same level as the channel region, and also wherein the bottom extending portion of the ohmic contact layer extends continuously from a bottom edge of the bottom face of the multi-layer structure inwardly.

It is also preferable that the multi-layer structure and the at least ohmic contact layer are provided over a buffer layer which is provided over a semiconductor substrate.

The third present invention provides a structure of a semiconductor device. The structure comprises: a compound semiconductor multi-layer structure having at least a channel region; and at least an ohmic contact layer provided adjacent to a first side face of the multi-layer structure, and the ohmic contact layer being in contact with at least a part of the first side face, wherein the ohmic contact layer has a bottom extending portion which extends in contact with at least a part of a bottom face of the multi-layer structure.

The above bottom-extending portion of the ohmic contact layer provides an additional current path between the ohmic contact layer and the channel region, which may provide a reduction in contact resistance between the electrode on the ohmic contact layer through the channel region in the multi-layer structure.

It is preferable that the bottom extending portion of the ohmic contact layer extends continuously from a bottom edge of the bottom face of the multi-layer structure inwardly.

It is also preferable that the ohmic contact layer is in contact with at least the channel region on the first side face of the multi-layer structure.

It is further preferable that the ohmic contact layer extends in contact with an entire part of the first side face of the multi-layer structure.

It is also preferable that the ohmic contact layer has a top extending portion which extends in contact with a part of a top surface of the multi-layer structure.

It is further preferable that the top extending portion of the ohmic contact layer extends continuously from an edge of the top surface of the multi-layer structure inwardly.

It is furthermore preferable that the top extending portion of the ohmic contact layer has a first lateral length which is defined between an inside edge of the top extending portion and the edge of the top surface of the multi-layer structure, and the first lateral length is not less than a total thickness of the multi-layer structure.

It is moreover preferable that the first lateral length is not more than a half of a distance between the edge of the top surface of the multi-layer structure and an edge of a gate electrode provided over the top surface of the multi-layer structure.

It is still more preferable that the gate electrode is provided on an epitaxial layer selectively provided on the top surface of the multi-layer structure, and the epitaxial layer has an opposite electrical conductivity to the channel region.

It is also preferable that the gate electrode is provided on the top surface of the multi-layer structure.

It is also preferable that the multi-layer structure has a top layer comprising an AlGaAs layer having Al-index of not less than 0.3.

It is also preferable that the ohmic contact layer comprises a compound semiconductor layer.

It is also preferable that the ohmic contact layer further has at least a side extending portion which extends in contact with at least a part of at least one of two adjacent side faces to the first side face of the multi-layer structure.

The above side-extending portion of the ohmic contact layer provides an additional current path between the ohmic contact layer and the channel region, which may provide a reduction in contact resistance between the electrode on the ohmic contact layer through the channel region in the multi-layer structure.

It is also preferable that the side extending portion of the ohmic contact layer is in contact with at least the channel region.

It is also preferable that the ohmic contact layer has two of the side extending portion extending in contact with both the two adjacent side faces from a bottom level to a top level of the multi-layer structure.

It is also preferable that the at least side extending portion of the ohmic contact layer extends continuously from an edge of the adjacent side face of the multi-layer structure inwardly.

It is further preferable that the at least side extending portion of the ohmic contact layer increases in lateral length from a top level toward the same level as the channel region, so that the at least side extending portion has a maximum lateral length in the same level as the channel region.

It is also preferable that the ohmic contact layer furthermore has a top extending portion which extends in contact with a part of a top surface of the multi-layer structure, and the ohmic contact layer furthermore has the two side extending portions which extend in contact with at least parts of two adjacent side faces to the first side face of the multi-layer structure from a bottom level to a top level of the multi-layer structure, and the ohmic contact layer moreover has a bottom extending portion which extends in contact with at least a part of a bottom face of the multi-layer structure.

The above bottom-extending portion of the ohmic contact layer provides an additional current path between the ohmic contact layer and the channel region, which may provide a reduction in contact resistance between the electrode on the ohmic contact layer through the channel region in the multi-layer structure.

It is further preferable that the top extending portion of the ohmic contact layer extends continuously from an edge of the top surface of the multi-layer structure inwardly, and the two side extending portions extend continuously from edges of the adjacent side faces of the multi-layer structure inwardly so that the two side extending portions increase in lateral length from a top level toward the same level as the channel region, whereby the at least side extending portion has a maximum lateral length in the same level as the channel region, and also wherein the bottom extending portion of the ohmic contact layer extends continuously from a bottom edge of the bottom face of the multi-layer structure inwardly.

It is also preferable that the multi-layer structure and the at least ohmic contact layer are provided over a buffer layer which is provided over a semiconductor substrate.

The fourth present invention provides a semiconductor device comprising: a semiconductor substrate; at least a buffer layer extending over the semiconductor substrate; a multi-layer structure selectively provided over the buffer layer, and the multi-layer structure having at least a channel region; a first ohmic contact layer selectively provided over the buffer layer and extending in contact with a first side face of the multi-layer structure; a second ohmic contact layer selectively provided on the buffer layer and extending in contact with a second side face of the multi-layer structure, and the second side face being positioned in opposite side to the first side face; and a gate electrode provided over a top surface of the multi-layer structure, wherein the first ohmic contact layer has a first top extending portion which extends in contact with a first part of the top surface of the multi-layer structure continuously from a first edge of the top surface inwardly, so that the first top extending portion has a first inside edge distanced from the gate electrode, and wherein the second ohmic contact layer has a second top extending portion which extends in contact with a second part of the top surface of the multi-layer structure continuously from a second edge of the top surface inwardly, so that the second top extending portion has a second inside edge distanced from the gate electrode.

The above top-extending portion of the ohmic contact layer provides an additional current path between the ohmic contact layer and the channel region, which may provide a reduction in contact resistance between the electrode on the ohmic contact layer through the channel region in the multi-layer structure.

It is also preferable that the first top extending portion of the ohmic contact layer has a first lateral length which is defined between the first inside edge of the top extending portion and the first edge of the top surface of the multi-layer structure, and the first lateral length is not less than a total thickness of the multi-layer structure, and the first lateral length is not more than a half of a first distance between the first edge of the top surface of the multi-layer structure and a first side edge of the gate electrode, as well as wherein the second top extending portion of the ohmic contact layer has a second lateral length which is defined between the second inside edge of the top extending portion and the second edge of the top surface of the multi-layer structure, and the second lateral length is not less than the total thickness of the multi-layer structure, and the second lateral length is not more than a half of a second distance between the second edge of the top surface of the multi-layer structure and a second side edge of the gate electrode.

It is also preferable that the gate electrode is provided on an epitaxial layer selectively provided on the top surface of the multi-layer structure, and the epitaxial layer has an opposite electrical conductivity to the channel region.

It is also preferable that the gate electrode is provided on the top surface of the multi-layer structure.

It is also preferable that the multi-layer structure has a top layer comprising an AlGaAs layer having Al-index of not less than 0.3.

It is also preferable that the first and second ohmic contact layers comprise compound semiconductor layers.

It is also preferable that the first ohmic contact layer moreover has a first bottom extending portion which extends in contact with a first part of a bottom face of the multi-layer structure and also extends continuously from a first bottom edge of the bottom face, and wherein the second ohmic contact layer moreover has a second bottom extending portion which extends in contact with a second part of a bottom face of the multi-layer structure and also extends continuously from a second bottom edge of the bottom face.

The above bottom-extending portion of the ohmic contact layer provides an additional current path between the ohmic contact layer and the channel region, which may provide a reduction in contact resistance between the electrode on the ohmic contact layer through the channel region in the multi-layer structure.

It is also preferable that the first ohmic contact layer farther has first side extending portions which extend in contact with parts of two adjacent side faces to the first side face of the multi-layer structure from a bottom level to a top level of the multi-layer structure, so that the first side extending portions are in contact with at least the channel region, and the first side extending portions extend continuously from first side edges of the two adjacent side faces of the multi-layer structure inwardly, and wherein the second ohmic contact layer further has second side extending portions which extend in contact with parts of two adjacent side faces to the second side face of the multi-layer structure from the bottom level to the top level of the multi-layer structure, so that the second side extending portions are in contact with at least the channel region, and the second side extending portions extend continuously from second side edges of the two adjacent side faces of the multi-layer structure inwardly.

It is further preferable that each of the first side extending portions of the ohmic contact layer increases in lateral length from the top level toward the same level as the channel region, so that each of the first side extending portions has a first maximum lateral length in the same level as the channel region, and wherein each of the second side extending portions of the ohmic contact layer increases in lateral length from the top level toward the same level as the channel region, so that each of the second side extending portions has a second maximum lateral length in the same level as the channel region.

It is further more preferable that the first ohmic contact layer moreover has a first bottom extending portion which extends in contact with a first part of a bottom face of the multi-layer structure and also extends continuously from a first bottom edge of the bottom face, and wherein the second ohmic contact layer moreover has a second bottom extending portion which extends in contact with a second part of a bottom face of the multi-layer structure and also extends continuously from a second bottom edge of the bottom face.

The above bottom-extending portion of the ohmic contact layer provides an additional current path between the ohmic contact layer and the channel region, which may provide a reduction in contact resistance between the electrode on the ohmic contact layer through the channel region in the multi-layer structure.

The fifth present invention provides a semiconductor device comprising: a semiconductor substrate; at least a buffer layer extending over the semiconductor substrate; a multi-layer structure selectively provided over the buffer layer, and the multi-layer structure having at least a channel region; a first ohmic contact layer selectively provided over the buffer layer and extending in contact with a first side face of the multi-layer structure; a second ohmic contact layer selectively provided on the buffer layer and extending in contact with a second side face of the multi-layer structure, and the second side face being positioned in opposite side to the first side face; and a gate electrode provided over a top surface of the multi-layer structure, wherein the first ohmic contact layer further has first side extending portions which extend in contact with parts of two adjacent side faces to the first side face of the multi-layer structure from a bottom level to a top level of the multi-layer structure, so that the first side extending portions are in contact with at least the channel region, and the first side extending portions extend continuously from first side edges of the two adjacent side faces of the multi-layer structure inwardly, and wherein the second ohmic contact layer further has second side extending portions which extend in contact with parts of two adjacent side faces to the second side face of the multi-layer structure from the bottom level to the top level of the multi-layer structure, so that the second side extending portions are in contact with at least the channel region, and the second side extending portions extend continuously from second side edges of the two adjacent side faces of the multi-layer structure inwardly.

The above side-extending portion of the ohmic contact layer provides an additional current path between the ohmic contact layer and the channel region, which may provide a reduction in contact resistance between the electrode on the ohmic contact layer through the channel region in the multi-layer structure.

It is also preferable that each of the first side extending portions of the ohmic contact layer increases in lateral length from the top level toward the same level as the channel region, so that each of the first side extending portions has a first maximum lateral length in the same level as the channel region, and wherein each of the second side extending portions of the ohmic contact layer increases in lateral length from the top level toward the same level as the channel region, so that each of the second side extending portions has a second maximum lateral length in the same level as the channel region.

It is further preferable that the first ohmic contact layer moreover has a first bottom extending portion which extends in contact with a first part of a bottom face of the multi-layer structure and also extends continuously from a first bottom edge of the bottom face, and wherein the second ohmic contact layer moreover has a second bottom extending portion which extends in contact with a second part of a bottom face of the multi-layer structure and also extends continuously from a second bottom edge of the bottom face.

It is moreover preferable that the first ohmic contact layer further more has a first top extending portion which extends in contact with a first part of the top surface of the multi-layer structure continuously from a first edge of the top surface inwardly, so that the first top extending portion has a first inside edge distanced from the gate electrode, and wherein the second ohmic contact layer further more has a second top extending portion which extends in contact with a second part of the top surface of the multi-layer structure continuously from a second edge of the top surface inwardly, so that the second top extending portion has a second inside edge distanced from the gate electrode.

The above side-extending portion of the ohmic contact layer provides an additional current path between the ohmic contact layer and the channel region, which may provide a reduction in contact resistance between the electrode on the ohmic contact layer through the channel region in the multi-layer structure.

It is also preferable that the first ohmic contact layer further more has a first top extending portion which extends in contact with a first part of the top surface of the multi-layer structure continuously from a first edge of the top surface inwardly, so that the first top extending portion has a first inside edge distanced from the gate electrode, and wherein the second ohmic contact layer further more has a second top extending portion which extends in contact with a second part of the top surface of the multi-layer structure continuously from a second edge of the top surface inwardly, so that the second top extending portion has a second inside edge distanced from the gate electrode.

The above top-extending portion of the ohmic contact layer provides an additional current path between the ohmic contact layer and the channel region, which may provide a reduction in contact resistance between the electrode on the ohmic contact layer through the channel region in the multi-layer structure.

It is also preferable that the first top extending portion of the ohmic contact layer has a first lateral length which is defined between the first inside edge of the top extending portion and the first edge of the top surface of the multi-layer structure, and the first lateral length is not less than a total thickness of the multi-layer structure, and the first lateral length is not more than a half of a first distance between the first edge of the top surface of the multi-layer structure and a first side edge of the gate electrode, as well as wherein the second top extending portion of the ohmic contact layer has a second lateral length which is defined between the second inside edge of the top extending portion and the second edge of the top surface of the multi-layer structure, and the second lateral length is not less than the total thickness of the multi-layer structure, and the second lateral length is not more than a half of a second distance between the second edge of the top surface of the multi-layer structure and a second side edge of the gate electrode.

It is also preferable that the gate electrode is provided on an epitaxial layer selectively provided on the top surface of the multi-layer structure, and the epitaxial layer has an opposite electrical conductivity to the channel region.

It is also preferable that the gate electrode is provided on the top surface of the multi-layer structure.

It is also preferable that the multi-layer structure has a top layer comprising an AlGaAs layer having Al-index of not less than 0.3.

It is also preferable that the first and second ohmic contact layers comprise compound semiconductor layers.

The sixth present invention provides a semiconductor device comprising: a semiconductor substrate; at least a buffer layer extending over the semiconductor substrate; a multi-layer structure selectively provided over the buffer layer, and the multi-layer structure having at least a channel region; a first ohmic contact layer selectively provided over the buffer layer and extending in contact with a first side face of the multi-layer structure; a second ohmic contact layer selectively provided on the buffer layer and extending in contact with a second side face of the multi-layer structure, and the second side face being positioned in opposite side to the first side face; and a gate electrode provided over a top surface of the multi-layer structure, wherein the first ohmic contact layer has a first bottom extending portion which extends in contact with a first part of a bottom face of the multi-layer structure and also extends continuously from a first bottom edge of the bottom face, and wherein the second ohmic contact layer has a second bottom extending portion which extends in contact with a second part of a bottom face of the multi-layer structure and also extends continuously from a second bottom edge of the bottom face.

The above bottom-extending portion of the ohmic contact layer provides an additional current path between the ohmic contact layer and the channel region, which may provide a reduction in contact resistance between the electrode on the ohmic contact layer through the channel region in the multi-layer structure.

It is also preferable that the first ohmic contact layer moreover has a first top extending portion which extends in contact with a first part of the top surface of the multi-layer structure continuously from a first edge of the top surface inwardly, so that the first top extending portion has a first inside edge distanced from the gate electrode, and wherein the second ohmic contact layer has a second top extending portion which extends in contact with a second part of the top surface of the multi-layer structure continuously from a second edge of the top surface inwardly, so that the second top extending portion has a second inside edge distanced from the gate electrode.

The above top-extending portion of the ohmic contact layer provides an additional current path between the ohmic contact layer and the channel region, which may provide a reduction in contact resistance between the electrode on the ohmic contact layer through the channel region in the multi-layer structure.

It is further preferable that the first top extending portion of the ohmic contact layer has a first lateral length which is defined between the first inside edge of the top extending portion and the first edge of the top surface of the multi-layer structure, and the first lateral length is not less than a total thickness of the multi-layer structure, and the first lateral length is not more than a half of a first distance between the first edge of the top surface of the multi-layer structure and a first side edge of the gate electrode, as well as wherein the second top extending portion of the ohmic contact layer has a second lateral length which is defined between the second inside edge of the top extending portion and the second edge of the top surface of the multi-layer structure, and the second lateral length is not less than the total thickness of the multi-layer structure, and the second lateral length is not more than a half of a second distance between the second edge of the top surface of the multi-layer structure and a second side edge of the gate electrode.

The above top-extending portion of the ohmic contact layer provides an additional current path between the ohmic contact layer and the channel region, which may provide a reduction in contact resistance between the electrode on the ohmic contact layer through the channel region in the multi-layer structure.

It is also preferable that the gate electrode is provided on an epitaxial layer selectively provided on the top surface of the multi-layer structure, and the epitaxial layer has an opposite electrical conductivity to the channel region.

It is also preferable that the gate electrode is provided on the top surface of the multi-layer structure.

It is also preferable that the multi-layer structure has a top layer comprising an AlGaAs layer having Al-index of not less than 0.3.

It is also preferable that the first and second ohmic contact layers comprise compound semiconductor layers.

It is also preferable that the first ohmic contact layer further-has first side extending portions which extend in contact with parts of two adjacent side faces to the first side face of the multi-layer structure from a bottom level to a top level of the multi-layer structure, so that the first side extending portions are in contact with at least the channel region, and the first side extending portions extend continuously from first side edges of the two adjacent side faces of the multi-layer structure inwardly, and wherein the second ohmic contact layer further has second side extending portions which extend in contact with parts of two adjacent side faces to the second side face of the multi-layer structure from the bottom level to the top level of the multi-layer structure, so that the second side extending portions are in contact with at least the channel region, and the second side extending portions extend continuously from second side edges of the two adjacent side faces of the multi-layer structure inwardly.

The above side-extending portion of the ohmic contact layer provides an additional current path between the ohmic contact layer and the channel region, which may provide a reduction in contact resistance between the electrode on the ohmic contact layer through the channel region in the multi-layer structure.

It is further preferable that each of the first side extending portions of the ohmic contact layer increases in lateral length from the top level toward the same level as the channel region, so that each of the first side extending portions has a first maximum lateral length in the same level as the channel region, and wherein each of the second side extending portions of the ohmic contact layer increases in lateral length from the top level toward the same level as the channel region, so that each of the second side extending portions has a second maximum lateral length in the same level as the channel region.

The above side-extending portion of the ohmic contact layer provides an additional current path between the ohmic contact layer and the channel region, which may provide a reduction in contact resistance between the electrode on the ohmic contact layer through the channel region in the multi-layer structure.

It is further more preferable that the first ohmic contact layer moreover has a first top extending portion which extends in contact with a first part of the top surface of the multi-layer structure continuously from a first edge of the top surface inwardly, so that the first top extending portion has a first inside edge distanced from the gate electrode, and wherein the second ohmic contact layer has a second top extending portion which extends in contact with a second part of the top surface of the multi-layer structure continuously from a second edge of the top surface inwardly, so that the second top extending portion has a second inside edge distanced from the gate electrode.

The above top-extending portion of the ohmic contact layer provides an additional current path between the ohmic contact layer and the channel region, which may provide a reduction in contact resistance between the electrode on the ohmic contact layer through the channel region in the multi-layer structure.

The seventh present invention provides a method of forming ohmic contact layers in a semiconductor device. The method comprises the steps of: forming a multi-layer structure having a channel layer over a buffer layer over a substrate; forming an insulating layer over a top surface of the multi-layer structure; selectively etching the multi-layer structure by use of the insulating layer as a mask, so that first and second predetermined regions of a top surface of the buffer layer are shown; selectively etching the insulating layer, so that third and fourth predetermined regions of the top surface of the multi-layer structure are shown; and forming a first ohmic contact layer on the first predetermined region and on a first side face of the multi-layer structure as well as the third predetermined region and on a first side face of the insulating layer and also forming a second ohmic contact layer on the second predetermined region and on a second side face of the multi-layer structure as well as the fourth predetermined region and on a second side face of the insulating layer, provided that the second side face of the multi-layer structure is positioned opposite to the first side face of the multi-layer structure, and the second side face of the insulating layer is positioned opposite to the first side face of the insulating layer.

It is also preferable that the third and fourth predetermined regions of the top surface of the multi-layer structure have a lateral length which is larger than a thickness of the multi-layer structure.

The eighth present invention provides a method of forming a semiconductor device. The method comprises the steps of: forming a multi-layer structure having a channel layer over a buffer layer over a substrate; selectively forming an epitaxial layer having an opposite conductivity type to the multi-layer structure on a predetermined region of a top surface of the multi-layer structure; forming an insulating layer over a top surface of the multi-layer structure and the epitaxial layer, so that the epitaxial layer is completely buried within the insulating layer; selectively etching the multi-layer structure by use of the insulating layer as a mask, so that first and second predetermined regions of the top surface of the buffer layer are shown; selectively etching the insulating layer, so that third and fourth predetermined regions of the top surface of the multi-layer structure are shown; forming a first ohmic contact layer on the first predetermined region and on a first side face of the multi-layer structure as well as the third predetermined region and on a first side face of the insulating layer and also forming a second ohmic contact layer on the second predetermined region and on a second side face of the multi-layer structure as well as the fourth predetermined region and on a second side face of the insulating layer, provided that the second side face of the multi-layer structure is positioned opposite to the first side face of the multi-layer structure, and the second side face of the insulating layer is positioned opposite to the first side face of the insulating layer; and removing the insulating layer, and forming a gate electrode on the epitaxial layer and forming source and drain electrodes on top surfaces of the first and second ohmic contact layers.

It is also preferable that the third and fourth predetermined regions of the top surface of the multi-layer structure have a lateral length which is not less than a thickness of the multi-layer structure.

It is also preferable that the lateral length of the third and fourth predetermined regions of the top surface of the multi-layer structure is not more than a half of a distance defined between an edge of the top surface of the multi-layer structure and an edge of the epitaxial layer.

The ninth present invention provides a method of forming a semiconductor device. The method comprises the steps of: forming a multi-layer structure having a channel layer over a buffer layer over a substrate; selectively forming an epitaxial layer having an opposite conductivity type to the multi-layer structure on a predetermined region of a top surface of the multi-layer structure; forming a gate electrode on a top surface of the epitaxial layer; forming an insulating layer over a top surface of the multi-layer structure and gate electrode, so that the gate electrode is completely buried within the insulating layer; selectively etching the multi-layer structure by use of the insulating layer as a mask, so that first and second predetermined regions of the top surface of the buffer layer are shown; selectively etching the insulating layer, so that third and fourth predetermined regions of the top surface of the multi-layer structure are shown; forming a first ohmic contact layer on the first predetermined region and on a first side face of the multi-layer structure as well as the third predetermined region and on a first side face of the insulating layer and also forming a second ohmic contact layer on the second predetermined region and on a second side face of the multi-layer structure as well as the fourth predetermined region and on a second side face of the insulating layer, provided that the second side face of the multi-layer structure is positioned opposite to the first side face of the multi-layer structure, and the second side face of the insulating layer is positioned opposite to the first side face of the insulating layer; and removing the insulating layer, and forming source and drain electrodes on top surfaces of the first and second ohmic contact layers.

It is also preferable that the third and fourth predetermined regions of the top surface of the multi-layer structure have a lateral length which is not less than a thickness of the multi-layer structure.

It is further preferable that the lateral length of the third and fourth predetermined regions of the top surface of the multi-layer structure is not more than a half of a distance defined between an edge of the top surface of the multi-layer structure and an edge of the epitaxial layer.

Figure 3:
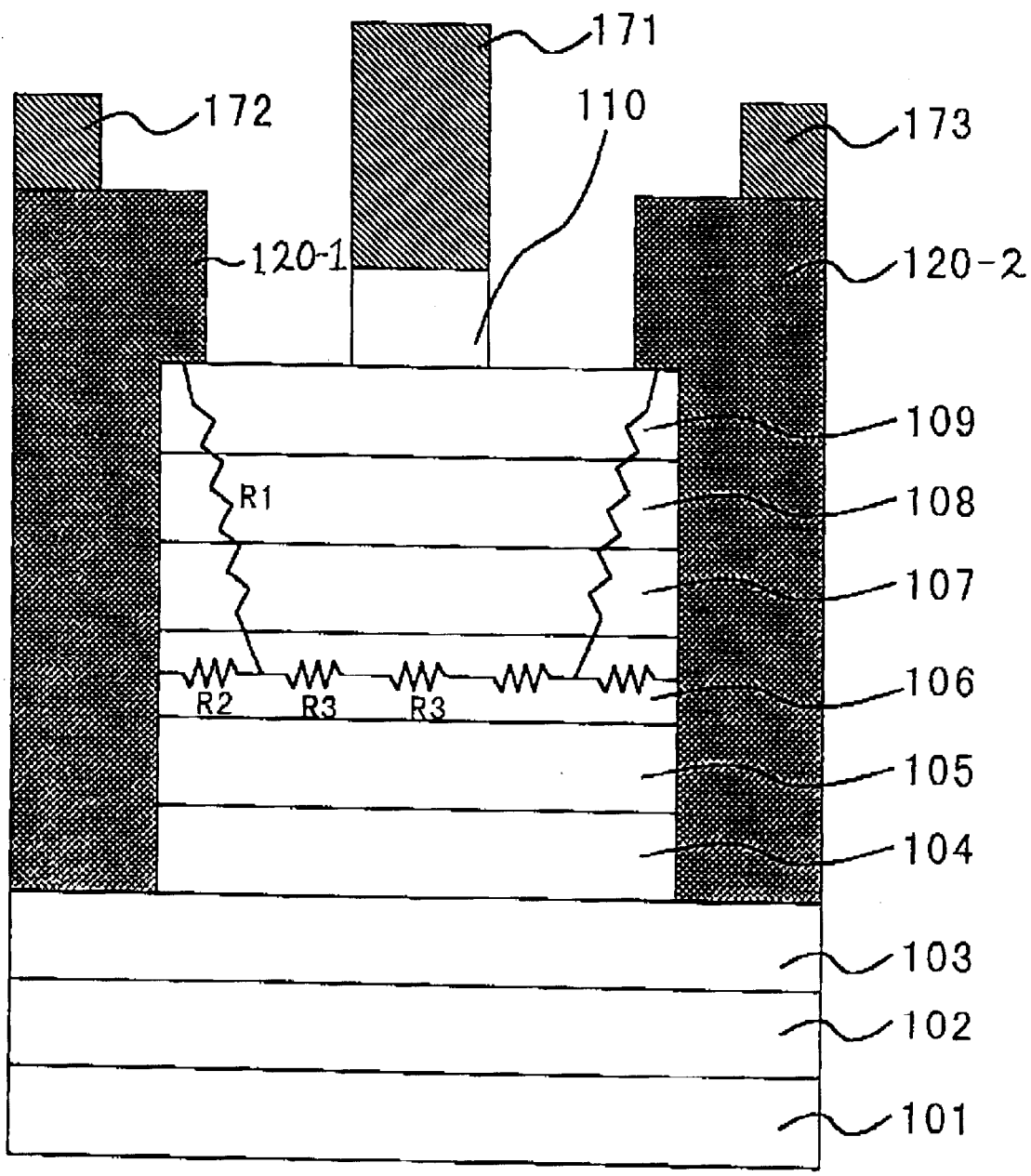
FIG. 3 is a fragmentary cross sectional elevation view illustrative of a first novel compound semiconductor field effect transistor in a first embodiment in accordance with the present invention.

PREFERRED EMBODIMENTS
FIRST EMBODIMENT:

A first embodiment according to the present invention will be described in detail with reference to the drawings. FIG. 3 is a fragmentary cross sectional elevation view illustrative of a first novel compound semiconductor field effect transistor in a first embodiment in accordance with the present invention. A GaAs buffer layer 102 having a thickness of 400 nanometers is provided on a top surface of a semi-insulating GaAs substrate 101. An $Al_{0.2}Ga_{0.8}As$ buffer layer 103 having a thickness of 100 nanometers is provided on a top surface of the GaAs buffer layer 102. A multi-layer structure is selectively provided on a predetermined region of the top surface of the $Al_{0.2}Ga_{0.8}As$ buffer layer 103. The multi-layer structure comprises laminations of the following six layers. An Si-doped $Al_{0.2}Ga_{0.8}As$ electron donor layer 104 having a thickness of 4 nanometers and an Si impurity concentration of $4E18\ cm^{-3}$ is selectively provided on the predetermined region of the top surface of the $Al_{0.2}Ga_{0.8}As$ buffer layer 103. An undoped $Al_{0.2}Ga_{0.8}As$ spacer layer 105 having a thickness of 2 nanometers is provided on a top surface of the Si-doped $Al_{0.2}Ga_{0.8}As$ electron donor layer 104. An undoped $In_{0.2}Ga_{0.8}As$ channel layer 106 having a thickness of 15 nanometers is provided on a top surface of the undoped $Al_{0.2}Ga_{0.8}As$ spacer layer 105. An undoped $Al_{0.2}Ga_{0.8}As$ spacer layer 107 having a thickness of 2 nanometers is provided on a top surface of the undoped $In_{0.2}Ga_{0.8}As$ channel layer 106. An Si-doped $Al_{0.2}Ga_{0.8}As$ electron donor layer 108 having a thickness of 12 nanometers and an Si impurity concentration of $4E18\ cm^{-3}$ is selectively provided on a top surface of the undoped $Al_{0.2}Ga_{0.8}As$ spacer layer 107. An undoped $Al_{0.2}Ga_{0.8}As$ layer 109 having a thickness of 15 nanometers is provided on a top surface of the Si-doped $Al_{0.2}Ga_{0.8}As$ electron donor layer 108. The multi-layer structure thus comprises the above lamination structure of the six layers, for example, the Si-doped $Al_{0.2}Ga_{0.8}As$ electron donor layer 104, the undoped $Al_{0.2}Ga_{0.8}As$ spacer layer 105, the undoped $In_{0.2}Ga_{0.8}As$ channel layer 106, the undoped $Al_{0.2}Ga_{0.8}As$ spacer layer 107, the Si-doped $Al_{0.2}Ga_{0.8}As$ electron donor layer 108, and the undoped $Al_{0.2}Ga_{0.8}As$ layer 109. A C-doped GaAs layer 110 having a thickness of 50 nanometers is selectively provided on a predetermined region of a top surface of the undoped $Al_{0.2}Ga_{0.8}As$ layer 109 or the top surface of the multi-layer structure. A gate electrode 171 is provided on the C-doped GaAs layer 110.

A first ohmic contact layer 120-1 is selectively provided over a predetermined region of the top surface of the $Al_{0.2}Ga_{0.8}As$ buffer layer 103, so that the first ohmic contact layer 120-1 extends in contact with an entire of a first side face of the multi-layer structure. The first ohmic contact layer 120-1 may comprise an Si-doped GaAs layer having an impurity concentration of $4E18\ cm^{-3}$. The first ohmic contact layer 120-1 has a top surface which is higher in level than the top surface of the multi-layer structure. The first ohmic contact layer 120-1 has a first top-extending portion which extends over a first side region of the top surface of the multi-layer structure. The first top-extending portion continuously extends from an edge of the top surface of the multi-layer structure toward the C-doped GaAs layer 110, provided that a first inside edge of the first top-extending portion of the first ohmic contact layer 120-1 is distanced from the C-doped GaAs layer 110 and from the gate electrode 171. The first top-extending portion of the first ohmic contact layer 120-1 has a first lateral length which is defined between the first edge of the top surface of the multi-layer structure to the first inside edge of the first top-extending portion. It is preferable that the first lateral length of the first top-extending portion of the first ohmic contact layer 120-1 is not less than a thickness of the multi-layer structure or a total thickness of the above six layers 104, 105, 106, 107, 108 and 109 but not more than a half of a first distance defined between the gate electrode 171 and the first edge of the top surface of the multi-layer structure. Namely, it is preferable that the first inside edge of the first top-extending portion of the first ohmic contact layer 120-1 is positioned outside the half position between the edge of the gate electrode 171 and the first edge of the top surface of the multi-layer structure and inside the lateral distance from the first edge of the top surface of the multi-layer structure, wherein the lateral distance corresponds to the thickness of the multi-layer structure or the total thickness of the above six layers 104, 105, 106, 107, 108 and 109. It is most preferable that the first lateral length of the first top-extending portion of the first ohmic contact layer 120-1 is about a half of a first distance defined between the gate electrode 171 and the first edge of the top surface of the multi-layer structure. Namely, the first inside edge of the first top-extending portion of the first ohmic contact layer 120-1 is positioned at an intermediate point between the edge of the gate electrode 171 and the first edge of the top surface of the multi-layer structure. A source electrode 172 is provided on a top surface of the first ohmic contact layer 120-1. The first ohmic contact layer 120-1 in contact with the first side face of the multi-layer structure provides a primary current path between the channel layer 106 and the source electrode 172. As described above, the thickness of the channel layer 106 is extremely thin and the contact resistance between the source electrode 172 and the channel layer 106 is not sufficiently low. However, the first ohmic contact layer 120-1 has the first top-extending portion in contact with the part of the top surface of the multi-layer structure. The first top-extending portion of the first ohmic contact layer 120-1 provides a secondary current path between the source electrode 172 and the channel layer 106. In the drawing, the primary current path is represented by "R2" and "R3", whilst the secondary current path is represented by "R1". The further provision of the secondary current path in addition to the primary current path surely reduces the contact resistance between the source electrode 172 and the channel layer 106. Namely, the first top-extending portion of the first ohmic contact layer 120-1 provides the additional current path for electron current between the source electrode 172 and the channel layer 106, whereby the further reduction in the contact resistance between the source electrode 172 and the channel layer 106 is surely obtained.

A second ohmic contact layer 120-2 is selectively provided over another predetermined region of the top surface of the $Al_{0.2}Ga_{0.8}As$ buffer layer 103, so that the second ohmic contact layer 120-2 extends in contact with an entire of a second side face of the multi-layer structure. The second ohmic contact layer 120-2 may comprise an Si-doped GaAs layer having an impurity concentration of 4E18 cm$^{-3}$. The second ohmic contact layer 120-2 has a top surface which is higher in level than the top surface of the multi-layer structure. The second ohmic contact layer 120-2 has a second top-extending portion which extends over a second side region of the top surface of the multi-layer structure. The second top-extending portion continuously extends from an edge of the top surface of the multi-layer structure toward the C-doped GaAs layer 110, provided that a second inside edge of the second top-extending portion of the second ohmic contact layer 120-2 is distanced from the C-doped GaAs layer 110 and from the gate electrode 171. The second top-extending portion of the second ohmic contact layer 120-2 has a second lateral length which is defined between the second edge of the top surface of the multi-layer structure to the second inside edge of the second top-extending portion. It is preferable that the second lateral length of the second top-extending portion of the second ohmic contact layer 120-2 is not less than a thickness of the multi-layer structure or a total thickness of the above six layers 104, 105, 106, 107, 108 and 109 but not more than a half of a second distance defined between the gate electrode 171 and the second edge of the top surface of the multi-layer structure. Namely, it is preferable that the second inside edge of the second top-extending portion of the second ohmic contact layer 120-2 is positioned outside the half position between the edge of the gate electrode 171 and the second edge of the top surface of the multi-layer structure and inside the lateral distance from the second edge of the top surface of the multi-layer structure, wherein the lateral distance corresponds to the thickness of the multi-layer structure or the total thickness of the above six layers 104, 105, 106, 107, 108 and 109. It is most preferable that the second lateral length of the second top-extending portion of the second ohmic contact layer 120-2 is about a half of a second distance defined between the gate electrode 171 and the second edge of the top surface of the multi-layer structure. Namely, the second inside edge of the second top-extending portion of the second ohmic contact layer 120-2 is positioned at an intermediate point between the edge of the gate electrode 171 and the second edge of the top surface of the multi-layer structure. A drain electrode 173 is provided on a top surface of the second ohmic contact layer 120-2. The second ohmic contact layer 120-2 in contact with the second side face of the multi-layer structure provides a primary current path between the channel layer 106 and the drain electrode 173. As described above, the thickness of the channel layer 106 is extremely thin and the contact resistance between the drain electrode 173 and the channel layer 106 is not sufficiently low. However, the second ohmic contact layer 120-2 has the second top-extending portion in contact with the part of the top surface of the multi-layer structure. The second top-extending portion of the second ohmic contact layer 120-2 provides a secondary current path between the drain electrode 173 and the channel layer 106. In the drawing, the primary current path is represented by "R2" and "R3", whilst the secondary current path is represented by "R1". The further provision of the secondary current path in addition to the primary current path surely reduces the contact resistance between the drain electrode 173 and the channel layer 106. Namely, the second top-extending portion of the second ohmic contact layer 120-2 provides the additional current path for electron current between the drain electrode 173 and the channel layer 106, whereby the further reduction in the contact resistance between the drain electrode 173 and the channel layer 106 is surely obtained.

As described above, the above first and second top-extending portions of the first and second ohmic contact layers 120-1 and 120-2 may provide a reduction in contact resistance, for example, about 0.1 ohm millimeter between the source and drain electrodes 172 and 173 through the channel region.

In this embodiment, the above described novel ohmic contact layer structure is applied to the p-n junction field effect transistor of the Group III–V compound semiconductors. It is, however, possible to apply the above described novel ohmic contact layer structure to other semiconductor devices, such as high electron mobility transistor and heterojunction field effect transistor.

As described above, the top layer 109 of the multi-layer structure comprises the undoped $Al_{0.2}Ga_{0.8}As$ layer, wherein the compositional index of Al is 0.2. It is, however, more effective that the above novel ohmic contact structure is applied to when the compositional index of Al is not less than 0.3.

The following descriptions will focus on the fabrication process for the above described first novel field effect transistor. FIGS. 4A through 4F are fragmentary cross sectional elevation views illustrative of first novel compound semiconductor field effect transistors sequential steps involved in a first novel fabrication method in a first embodiment in accordance with the present invention.

Figure 4A:
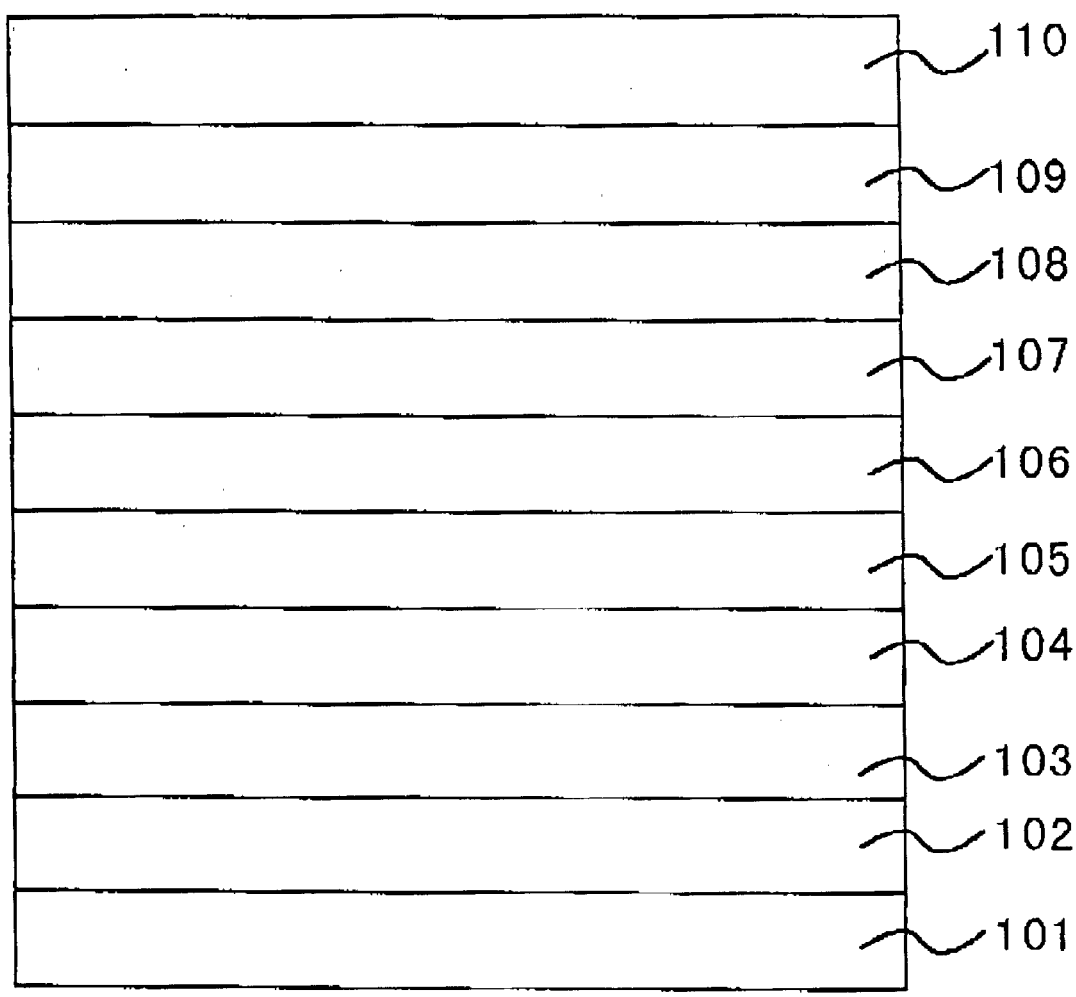
FIGS. 4A through 4F are fragmentary cross sectional elevation views illustrative of first novel compound semiconductor field effect transistors sequential steps involved in a first novel fabrication method in a first embodiment in accordance with the present invention.

With reference to FIG. 4A, a GaAs buffer layer 102 having a thickness of 400 nanometers is entirely formed on a top surface of a semi-insulating GaAs substrate 101. An $Al_{0.2}Ga_{0.8}As$ buffer layer 103 having a thickness of 100 nanometers is entirely formed on a top surface of the GaAs buffer layer 102. A multi-layer structure is entirely formed on a top surface of the $Al_{0.2}Ga_{0.8}As$ buffer layer 103. An Si-doped $Al_{0.2}Ga_{0.8}As$ electron donor layer 104 having a thickness of 4 nanometers and an Si impurity concentration of 4E18 cm$^{-3}$ is entirely formed on the predetermined region of the top surface of the $Al_{0.2}Ga_{0.8}As$ buffer layer 103. An undoped $Al_{0.2}Ga_{0.8}As$ spacer layer 105 having a thickness of 2 nanometers is entirely formed on a top surface of the Si-doped $Al_{0.2}Ga_{0.8}As$ electron donor layer 104. An undoped $In_{0.2}Ga_{0.8}As$ channel layer 106 having a thickness of 15 nanometers is entirely formed on a top surface of the undoped $Al_{0.2}Ga_{0.8}As$ spacer layer 105. An undoped $Al_{0.2}Ga_{0.8}As$ spacer layer 107 having a thickness of 2 nanometers is entirely formed on a top surface of the undoped $In_{0.2}Ga_{0.8}As$ channel layer 106. An Si-doped $Al_{0.2}Ga_{0.8}As$ electron donor layer 108 having a thickness of 12 nanometers and an Si impurity concentration of 4E18 cm$^{-3}$ is entirely formed on a top surface of the undoped $Al_{0.2}Ga_{0.8}As$ spacer layer 107. An undoped $Al_{0.2}Ga_{0.8}As$ layer 109 having a thickness of 15 nanometers is entirely formed on a top surface of the Si-doped $Al_{0.2}Ga_{0.8}As$ electron donor layer 108. A C-doped GaAs layer 110 having a thickness of 50 nanometers is entirely formed on a top surface of the undoped $Al_{0.2}Ga_{0.8}As$ layer 109 or the top surface of the multi-layer structure. The above layers may be epitaxially grown by either a molecular beam epitaxy method or a metal organic chemical vapor deposition method.

Figure 4B:
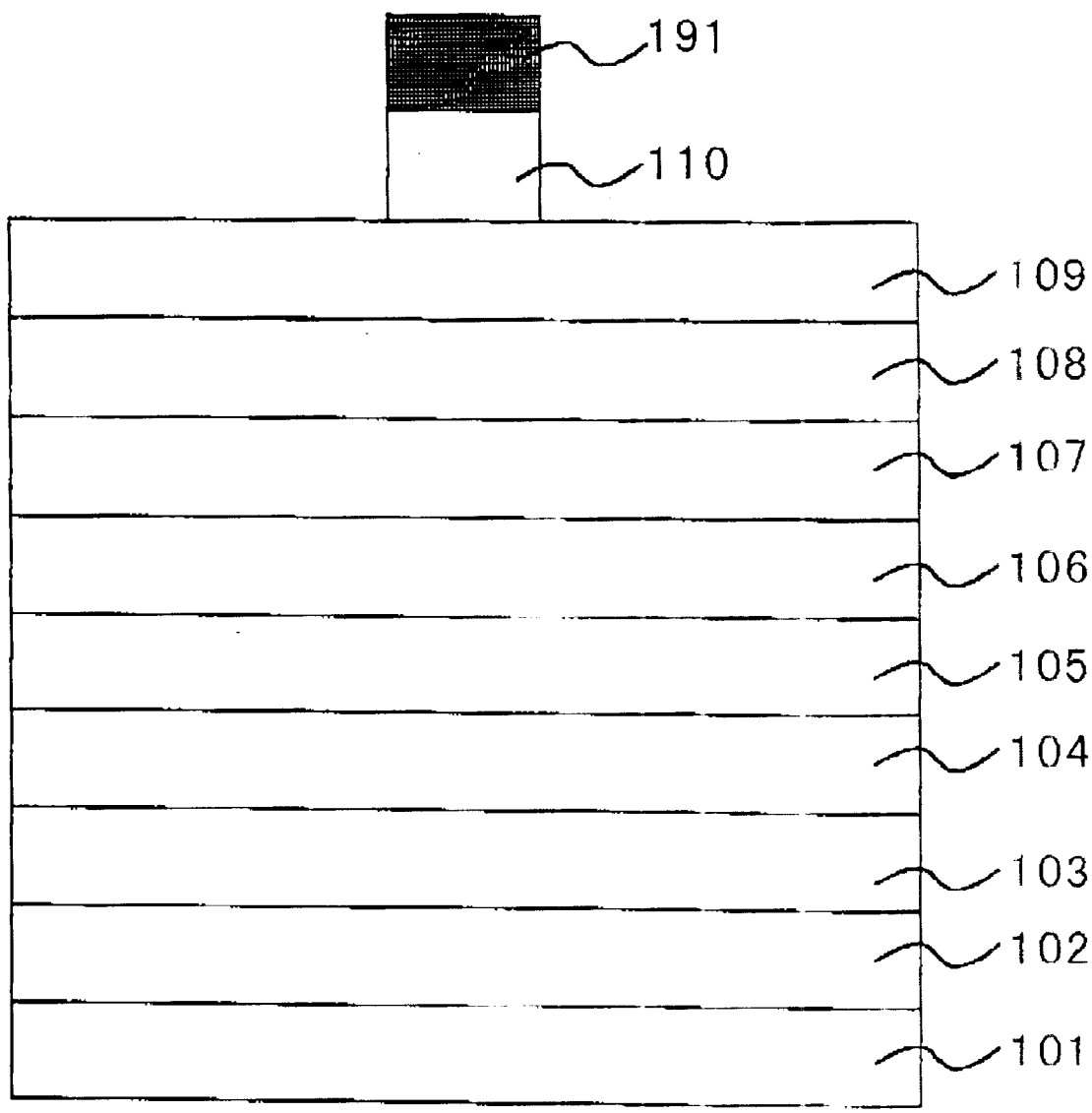

With reference to FIG. 4B, a resist film is entirely applied on the top surface of the C-doped GaAs layer 110. The resist film is subjected to an exposure and a subsequent development to selectively form a resist mask 191 over the top surface of the C-doped GaAs layer 110. The resist mask 191 is used as a mask for carrying out a selective anisotropic etching process for selectively etching to the C-doped GaAs layer 110, wherein the undoped $Al_{0.2}Ga_{0.8}As$ layer 109 underlying the C-doped GaAs layer 110 serves as an etching stopper.

Figure 4C:
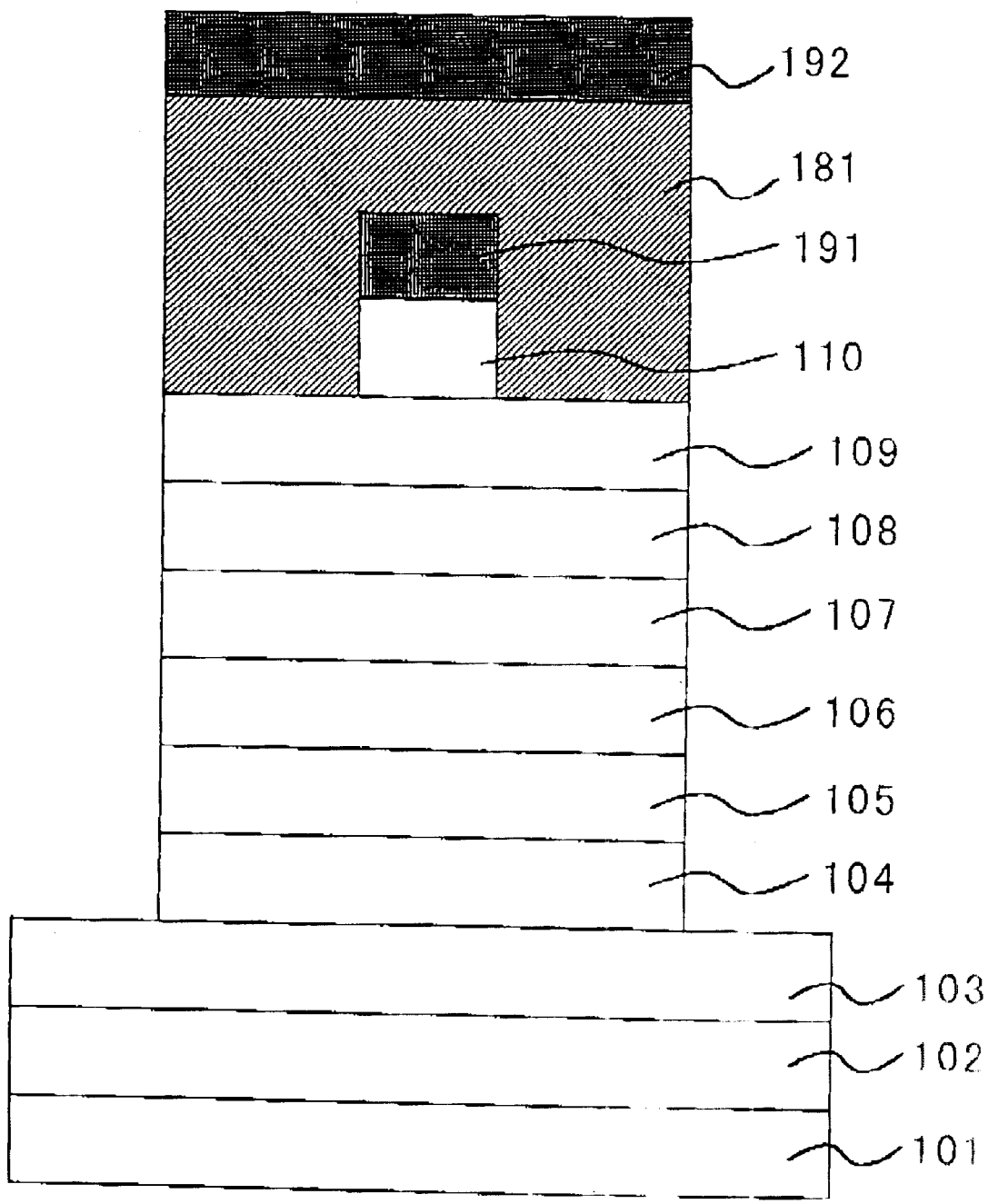

With reference to FIG. 4C, a silicon dioxide film 181 is entirely deposited over the top surface of the undoped $Al_{0.2}Ga_{0.8}As$ layer 109 and also over the resist mask 191 overlying the C-doped GaAs layer 110, so that the resist mask 191 is completely buried within the silicon dioxide film 181. A resist film 192 is entirely applied on a top surface of the silicon dioxide film 181. The resist film 192 is then subjected to an exposure and a subsequent development to selectively form a resist mask 192 over the silicon dioxide film 181. The resist mask 192 has first and second openings, wherein the first opening is formed on a source region whilst the second opening is formed on a drain region. The resist mask 192 is used as a mask for carrying out a selective anisotropic etching process for selectively etching the silicon dioxide film 181. The selectively etched silicon dioxide film 181 is also used as a mask for further selectively etching, on the source and drain regions, the laminations of the undoped $Al_{0.2}Ga_{0.8}As$ layer 109, the Si-doped $Al_{0.2}Ga_{0.8}As$ electron donor layer 108, the undoped $Al_{0.2}Ga_{0.8}As$ spacer layer 107, the undoped $In_{0.2}Ga_{0.9}As$ channel layer 106, the undoped $Al_{0.2}Ga_{0.8}As$ spacer layer 105, and the Si-doped $Al_{0.2}Ga_{0.8}As$ electron donor layer 104. As a result, the multi-layer structure is formed, which comprises the laminations of the undoped $Al_{0.2}Ga_{0.8}As$ layer 109, the Si-doped $Al_{0.2}Ga_{0.8}As$ electron donor layer 108, the undoped $Al_{0.2}Ga_{0.8}As$ spacer layer 107, the undoped $In_{0.2}Ga_{0.8}As$ channel layer 106, the undoped $Al_{0.2}Ga_{0.8}As$ spacer layer 105, and the Si-doped $Al_{0.2}Ga_{0.8}As$ electron donor layer 104.

Figure 4D:
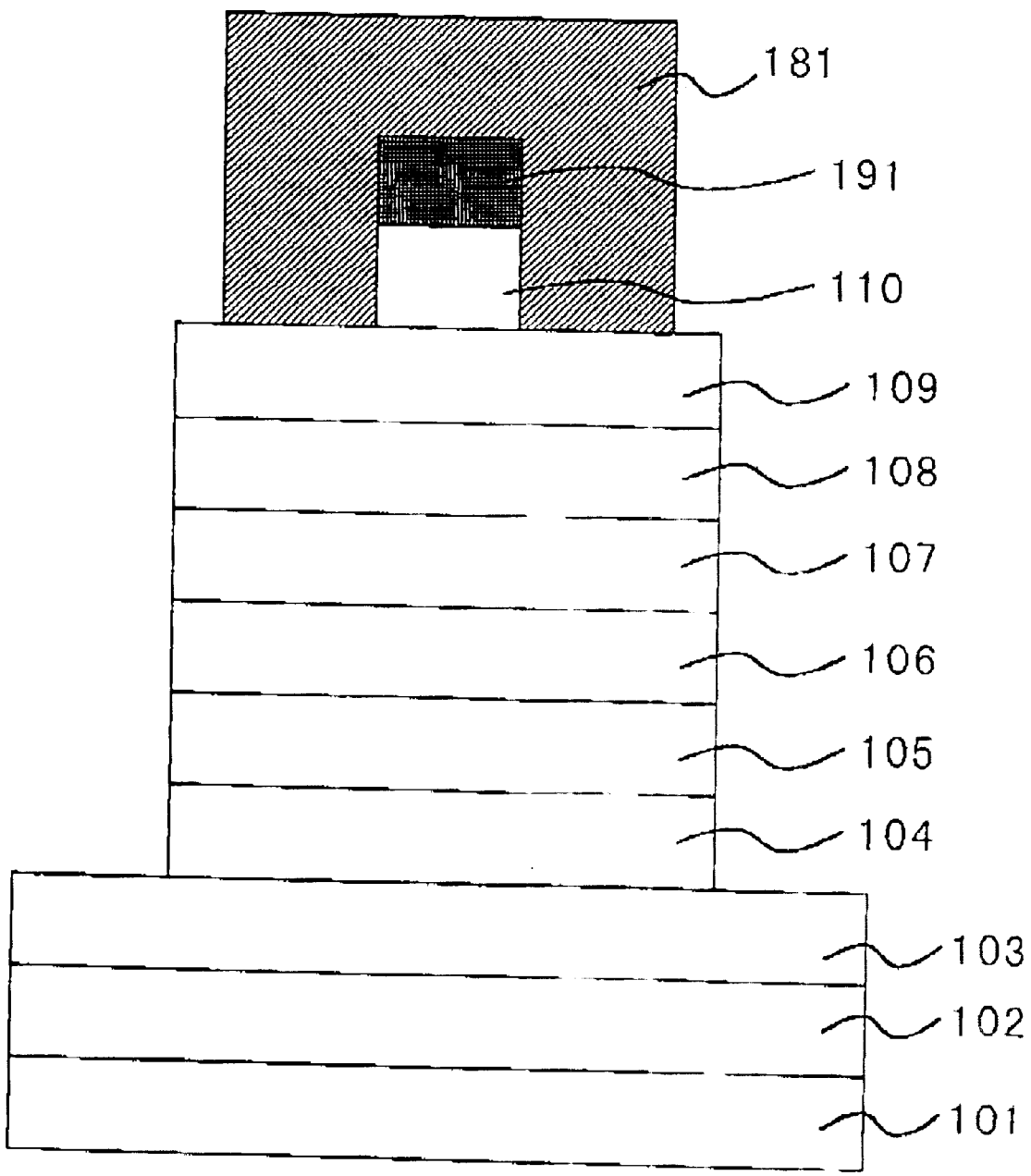
Figure 4E:
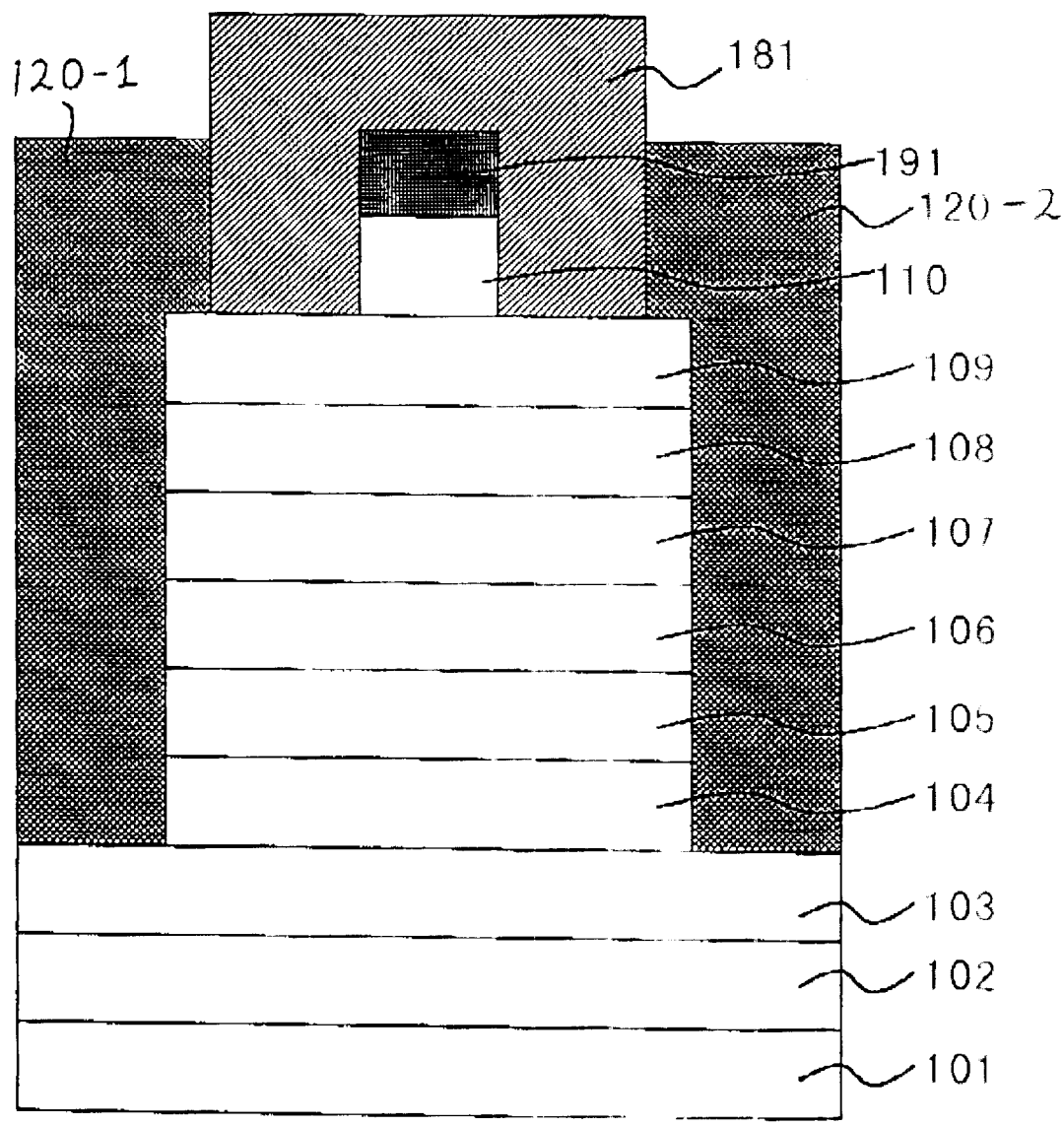

With reference to FIG. 4D, the silicon dioxide layer 181 is subjected to an isotropic etching process using a buffered fluorine acid solution so that the silicon dioxide layer 181 is etched in lateral directions, wherein each of lateral etching amount for etching the silicon dioxide layer 181 in the lateral directions is preferably not less than the thickness of multi-layer structure or the total thickness of the undoped $Al_{0.2}Ga_{0.8}As$ layer 109, the Si-doped $Al_{0.2}Ga_{0.8}As$ electron donor layer 108, the undoped $Al_{0.2}Ga_{0.8}As$ spacer layer 107, the undoped $In_{0.2}Ga_{0.8}As$ channel layer 106, the undoped $Al_{0.2}Ga_{0.8}As$ spacer layer 105, and the Si-doped $Al_{0.2}Ga_{0.8}As$ electron donor layer 104. Each of lateral etching amounts for etching the silicon dioxide layer 181 in the lateral directions may, for example, be not less than 40 nanometers. Each of lateral etching amounts for etching the silicon dioxide layer 181 in the lateral directions defines the above described lateral length of each of the first and second top-extending portions of the first and second ohmic contact layers, for which reason the lateral etching amounts for etching the silicon dioxide layer 181 in the lateral directions are important. In order to keep a sufficient distance of the inside edge of each of the first and second top-extending portions of the first and second ohmic contact layers, it is preferable that each of lateral etching amounts for etching the silicon dioxide layer 181 in the lateral directions is not more than a half of the lateral distance between the edge of the multi-layer structure and the edge of the C-doped GaAs layer 110. It is most preferable that the each of lateral etching amounts for etching the silicon dioxide layer 181 in the lateral directions corresponds a half of the lateral distance between the edge of the multi-layer structure and the edge of the C-doped GaAs layer 110. As a result of the etching process to the silicon dioxide layer 181, the first and second side regions of the top surface of the multi-layer structure or of the undoped $Al_{0.2}Ga_{0.8}As$ layer 109 are shown or exposed. The selectively etched silicon dioxide layer 181 is used as a mask for carrying out a metal organic chemical vapor deposition process at a growth temperature of 500°, in a metal organic chemical vapor deposition chamber for selectively depositing the first and second Si-doped GaAs ohmic contact layers 120-1 and 120-2 on the shown top surfaces of the $Al_{0.2}Ga_{0.8}As$ buffer layer 103. The first and second Si-doped GaAs ohmic contact layers 120-1 and 120-2 have a high impurity concentration of 4E18 $cm^{-3}$. The first and second Si-doped GaAs ohmic contact layers 120-1 and 120-2 are grown by the metal organic chemical vapor deposition on the shown top surfaces of the $Al_{0.2}Ga_{0.8}As$ buffer layer 103, so that the first and second Si-doped GaAs ohmic contact layers 120-1 and 120-2 extend in contact with the first and second side faces of the multi-layer structure, respectively and further the first and second Si-doped GaAs ohmic contact layers 120-1 and 120-2 extend on the first and second side regions of the top surface of the multi-layer structure or of the undoped $Al_{0.2}Ga_{0.8}As$ layer 109, whereby the first and second Si-doped GaAs ohmic contact layers 120-1 and 120-2 further more are in contact with the opposite sides of the silicon dioxide layer 181. Namely, the first top-extending portion of the first ohmic contact layer 120-1 is formed on the first side region of the top surface of the multi-layer structure or of the undoped $Al_{0.2}Ga_{0.8}As$ layer 109. The first top-extending portion of the first ohmic contact layer 120-1 is in contact with the first side of the silicon dioxide layer 181. The second top-extending portion of the second ohmic contact layer 120-2 is formed on the second side region of the top surface of the multi-layer structure or of the undoped $Al_{0.2}Ga_{0.8}As$ layer 109. The second top-extending portion of the second ohmic contact layer 120-2 is in contact with the second side of the silicon dioxide layer 181.

Figure 4F:
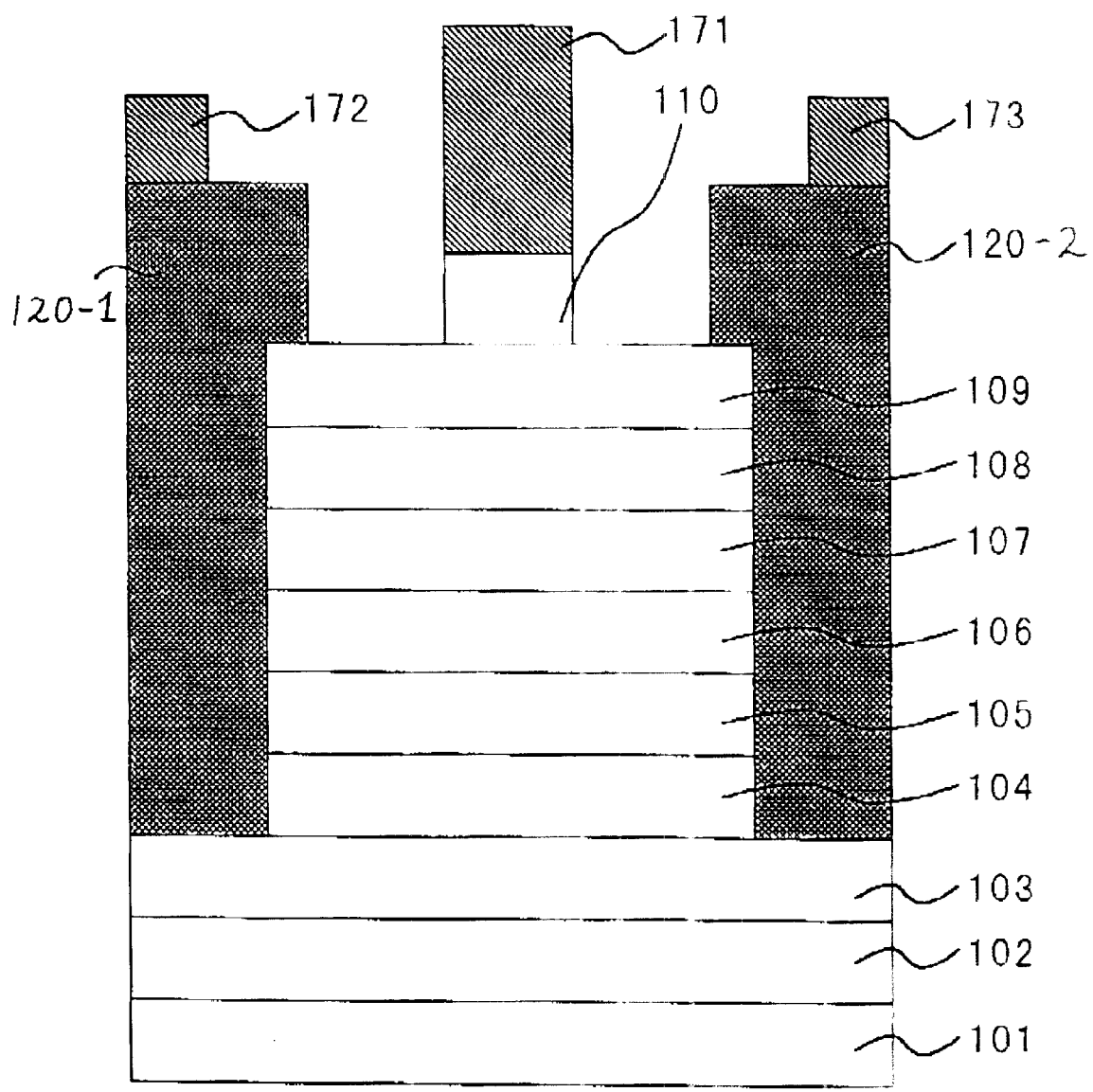

With reference to FIG. 4F, the silicon dioxide layer 181 is removed. Further, the resist mask 191 is removed. A gate electrode 171 is formed on the top surface of the C-doped GaAs layer 110. A source electrode 172 is formed on the top surface of the first ohmic contact layer 120-1. A drain electrode 173 is formed on the top surface of the second ohmic contact layer 120-2. As a result, the first novel field effect transistor of FIG. 3 is completed.

In accordance with the above described novel fabrication method, the gate electrode 171 is formed after the silicon dioxide layer 181 is removed. As a modification to the above novel fabrication method, it is possible that, subsequent to the formation of the C-doped GaAs layer 110 over the undoped $Al_{0.2}Ga_{0.8}As$ layer 109, the gate electrode 171 is selectively formed on the top surface of the C-doped GaAs layer 110, so that the gate electrode 171 is used as a mask for patterning the C-doped GaAs layer 110, before the silicon dioxide film 181 is then deposited, which completely buries the gate electrode 171.

In accordance with the above described novel fabrication method, the silicon dioxide layer 181 is once entirely removed, before the gate electrode 171 is formed. As a modification to the above described novel fabrication method, it is possible that the silicon dioxide layer 181 is selectively removed to form an opening in a gate region, so that the gate electrode 171 is formed in the opening of the silicon dioxide layer 181, whereby the silicon dioxide layer 181 serves as an insulator between the gate electrode 171 of the first and second ohmic contact layers 120-1 and 120-2.

It is moreover possible as a modification to change the thicknesses of the individual layers and the compositional ratios thereof

Figure 5:
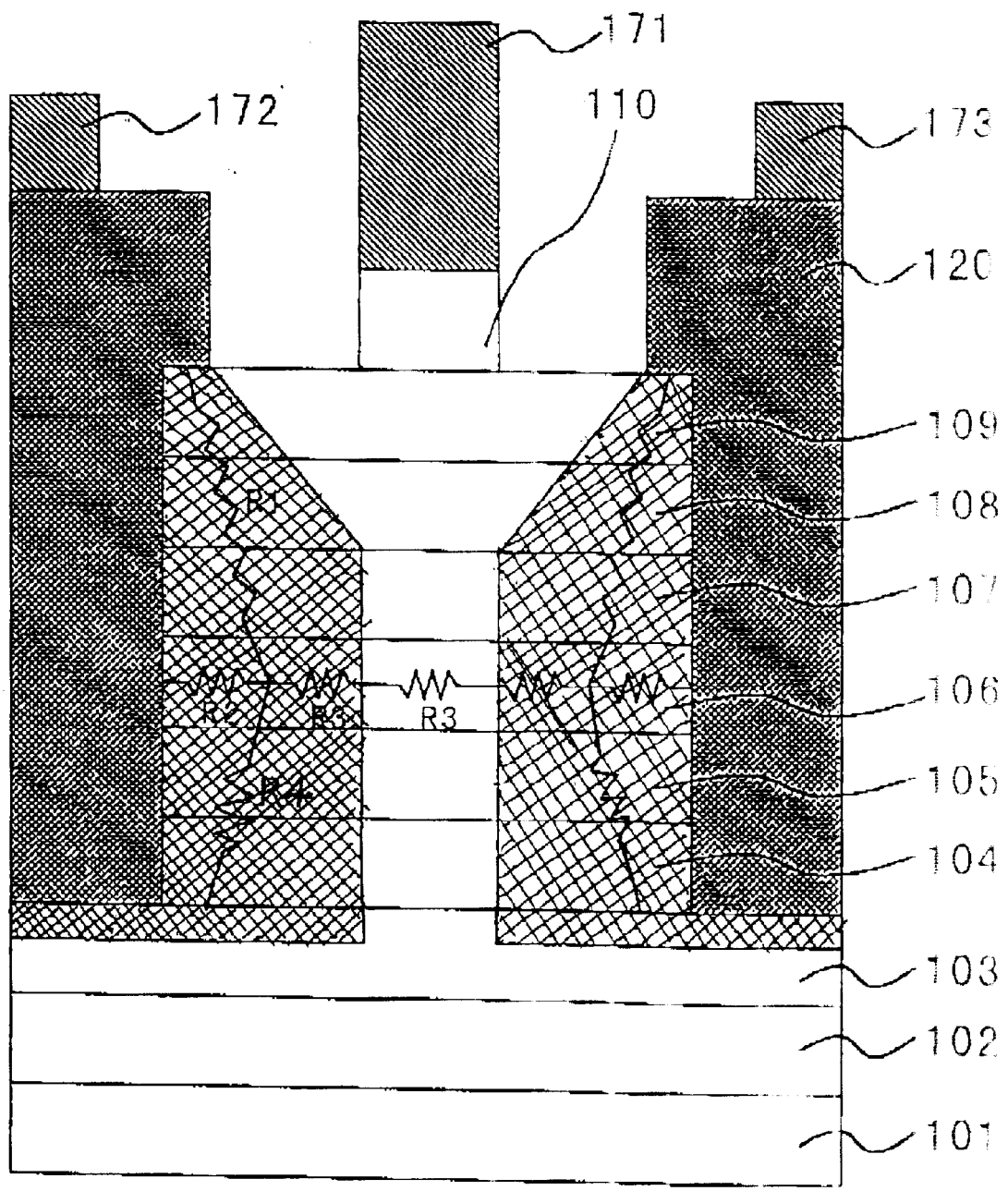
FIG. 5 is a fragmentary cross sectional elevation view illustrative of a second novel compound semiconductor field effect transistor in a second embodiment in accordance with the present invention.

SECOND EMBODIMENT:

A second embodiment according to the present invention will be described in detail with reference to the drawings. FIG. 5 is a fragmentary cross sectional elevation view illustrative of a second novel compound semiconductor field effect transistor in a second embodiment in accordance with the present invention. A GaAs buffer layer 102 having a thickness of 400 nanometers is provided on a top surface of a semi-insulating GaAs substrate 101. An $Al_{0.2}Ga_{0.8}As$ buffer layer 103 having a thickness of 100 nanometers is provided on a top surface of the GaAs buffer layer 102. A multi-layer structure is selectively provided on a predetermined region of the top surface of the $Al_{0.2}Ga_{0.8}As$ buffer layer 103. The multi-layer structure comprises laminations of the following six layers. An Si-doped $Al_{0.2}Ga_{0.8}As$ electron donor layer 104 having a thickness of 4 nanometers and an Si impurity concentration of 4E18 $cm^{-3}$ is selectively provided on the predetermined region of the top surface of the $Al_{0.2}Ga_{0.8}As$ buffer layer 103. An undoped $Al_{0.2}Ga_{0.8}As$ spacer layer 105 having a thickness of 2 nanometers is provided on a top surface of the Si-doped $Al_{0.2}Ga_{0.8}As$ electron donor layer 104. An undoped $In_{0.2}Ga_{0.8}As$ channel layer 106 having a thickness of 15 nanometers is provided on a top surface of the undoped $Al_{0.2}Ga_{0.8}As$ spacer layer 105. An undoped $Al_{0.2}Ga_{0.8}As$ spacer layer 107 having a thickness of 2 nanometers is provided on a top surface of the undoped $In_{0.2}Ga_{0.8}As$ channel layer 106. An Si-doped $Al_{0.2}Ga_{0.8}As$ electron donor layer 108 having a thickness of 12 nanometers and an Si impurity concentration of 4E18 $cm^{-3}$ is selectively provided on a top surface of the undoped $Al_{0.2}Ga_{0.8}As$ spacer layer 107. An undoped $Al_{0.2}Ga_{0.8}As$ layer 109 having a thickness of 15 nanometers is provided on a top surface of the Si-doped $Al_{0.2}Ga_{0.8}As$ electron donor layer 108. The multi-layer structure thus comprises the above lamination structure of the six layers, for example, the Si-doped $Al_{0.2}Ga_{0.8}As$ electron donor layer 104, the undoped $Al_{0.2}Ga_{0.8}As$ spacer layer 105, the undoped $In_{0.2}Ga_{0.8}As$ channel layer 106, the undoped $Al_{0.2}Ga_{0.8}As$ spacer layer 107, the Si-doped $Al_{0.2}Ga_{0.8}As$ electron donor layer 108, and the undoped $Al_{0.2}Ga_{0.8}As$ layer 109. A C-doped GaAs layer 110 having a thickness of 50 nanometers is selectively provided on a predetermined region of a top surface of the undoped $Al_{0.2}Ga_{0.8}As$ layer 109 or the top surface of the multi-layer structure. A gate electrode 171 is provided on the C-doped GaAs layer 110.

A first ohmic contact layer 120-1 is selectively provided over a predetermined region of the top surface of the $Al_{0.2}Ga_{0.8}As$ buffer layer 103, so that the first ohmic contact layer 120-1 extends in contact with an entire of a first side face of the multi-layer structure. The first ohmic contact layer 120-1 may comprise an Si-doped GaAs layer having an impurity concentration of 4E18 $cm^{-3}$. The first ohmic contact layer 120-1 has a top surface which is higher in level than the top surface of the multi-layer structure.

The first ohmic contact layer 120-1 has a first top-extending portion which extends over a first side region of the top surface of the multi-layer structure. The first top-extending portion continuously extends from an edge of the top surface of the multi-layer structure toward the C-doped GaAs layer 110, provided that a first inside edge of the first top-extending portion of the first ohmic contact layer 120-1 is distanced from the C-doped GaAs layer 110 and from the gate electrode 171. The first top-extending portion of the first ohmic contact layer 120-1 has a first lateral length which is defined between the first edge of the top surface of the multi-layer structure to the first inside edge of the first top-extending portion. It is preferable that the first lateral length of the first top-extending portion of the first ohmic contact layer 120-1 is not less than a thickness of the multi-layer structure or a total thickness of the above six layers 104, 105, 106, 107, 108 and 109 but not more than a half of a first distance defined between the gate electrode 171 and the first edge of the top surface of the multi-layer structure. Namely, it is preferable that the first inside edge of the first top-extending portion of the first ohmic contact layer 120-1 is positioned outside the half position between the edge of the gate electrode 171 and the first edge of the top surface of the multi-layer structure and inside the lateral distance from the first edge of the top surface of the multi-layer structure, wherein the lateral distance corresponds to the thickness of the multi-layer structure or the total thickness of the above six layers 104, 105, 106, 107, 108 and 109. It is most preferable that the first lateral length of the first top-extending portion of the first ohmic contact layer 120-1 is about a half of a first distance defined between the gate electrode 171 and the first edge of the top surface of the multi-layer structure. Namely, the first inside edge of the first top-extending portion of the first ohmic contact layer 120-1 is positioned at an intermediate point between the edge of the gate electrode 171 and the first edge of the top surface of the multi-layer structure. A source electrode 172 is provided on a top surface of the first ohmic contact layer 120-1. The first ohmic contact layer 120-1 in contact with the first side face of the multi-layer structure provides a primary current path between the channel layer 106 and the source electrode 172. As described above, the thickness of the channel layer 106 is extremely thin and the contact resistance between the source electrode 172 and the channel layer 106 is not sufficiently low. However, the first ohmic contact layer 120-1 has the first top-extending portion in contact with the part of the top surface of the multi-layer structure. The first top-extending portion of the first ohmic contact layer 120-1 provides a secondary current path between the source electrode 172 and the channel layer 106. In the drawing, the primary current path is represented by "R2" and "R3", whilst the secondary current path is represented by "R1". The further provision of the secondary current path in addition to the primary current path surely reduces the contact resistance between the source electrode 172 and the channel layer 106. Namely, the first top-extending portion of the first ohmic contact layer 120-1 provides the additional current path for electron current between the source electrode 172 and the channel layer 106, whereby the further reduction in the contact resistance between the source electrode 172 and the channel layer 106 is surely obtained.

The first ohmic contact layer 120-1 further has first side-extending portions which extend to and in contact with first predetermined regions of two adjacent side faces to the above first side face of the multi-layer structure. The first side-extending portions continuously extend from two vertically extending opposite edges of the first side face of the multi-layer structure inwardly. Each of the first side-extending portions of the first ohmic contact layer 120-1 varies in lateral length over level, wherein the lateral length is defined between the vertically extending edge of the first side face of the multi-layer structure and the first inside edge of the first side-extending portion. Each of the first side-extending portions of the first ohmic contact layer 120-1 extends between the top and bottom levels of the multi-layer structure. At the top level of the first side-extending portions, the lateral length of each of the first side-extending portions of the first ohmic contact layer 120-1 is minimum for keeping a sufficient distance from the gate electrode 171, wherein the inside edge of the first side-extending portion of the first ohmic contact layer 120-1 is aligned to the inside edge of the first top-extending portion of the first ohmic contact layer 120-1. As the level is dropped from the top level and approaches the same level as the spacer layer 107 overlying the channel layer 106, the lateral length of each of the first side-extending portions of the first ohmic contact layer 120-1 proportionally increases to the maximum length to form a tapered shape for keeping the sufficient distance from the gate electrode 171. As the level is further dropped from the same level as the spacer layer 107 to the bottom level of the multi-layer structure, the lateral length of each of the first side-extending portions of the first ohmic contact layer 120-1 remains unchanged at the maximum, provided that the maximum lateral length of each of the first side-extending portions of the first ohmic contact layer 120-1 is less than a half of the distance between the first and second side faces opposite to each other of the multi-layer structure. At the top level, the lateral length of each of the first side-extending portions of the first ohmic contact layer 120-1 is preferably not less than the thickness of the multi-layer structure or the total thickness of the above six layers 104, 105, 106, 107, 108 and 109 but not more than a half of the first distance defined between the gate electrode 171 and the first edge of the top surface of the multi-layer structure. It is most preferable that the lateral length of each of the first side-extending portions of the first ohmic contact layer 120-1 is about a half of a first distance defined between the gate electrode 171 and the first edge of the top surface of the multi-layer structure. The first side-extending portions of the first ohmic contact layer 120-1 surround the channel layer 106 and increases the contact area with the channel layer 106 for further reducing the contact resistance. The first ohmic contact layer 120-1 in contact with the first side face of the multi-layer structure provides the primary current path between the channel layer 106 and the source electrode 172. As described above, the thickness of the channel layer 106 is extremely thin and the contact resistance between the source electrode 172 and the channel layer 106 is not sufficiently low. However, the first ohmic contact layer 120-1 has the first side-extending portions in contact with the channel layer 106 to increase the contact area with the channel layer 106. The first side extending portions of the first ohmic contact layer 120-1 make wide the primary current path between the source electrode 172 and the channel layer 106. The primary current path exists not only through the first side face of the multi-layer structure but also through the two adjacent side faces to the first side faces. The further increase of the primary current path surely reduces the contact resistance between the source electrode 172 and the channel layer 106. Namely, the first side-extending portions of the first ohmic contact layer 120-1 provide the additional current path for electron current between the source electrode 172 and the channel layer 106, whereby the further reduction in the contact resistance between the source electrode 172 and the channel layer 106 is surely obtained.

The first ohmic contact layer 120-1 further more has a first bottom-extending portion which extends under the bottom surface of the multi-layer structure. The first bottom-extending portion continuously extends from an edge of the bottom surface of the multi-layer structure inwardly, provided that the inside edge of the first bottom-extending portion of the first ohmic contact layer 120-1 is aligned to the inside edge of each of the first side-extending portions of the first ohmic contact layer 120-1. The first bottom-extending portion of the first ohmic contact layer 120-1 has a lateral length which is defined between the first edge of the bottom surface of the multi-layer structure to the first inside edge of the first bottom-extending portion. The lateral length of the first bottom-extending portion of the first ohmic contact layer 120-1 is the same as the maximum lateral length of each of the first side-extending portions of the first ohmic contact layer 120-1, provided that the lateral length of the first bottom-extending portion of the first ohmic contact layer 120-1 is less than a half of the distance defined between the first and second side faces opposite to each other of the multi-layer structure. The first ohmic contact layer 120-1 in contact with the first side face of the multi-layer structure provides the primary current path between the channel layer 106 and the source electrode 172. As described above, the thickness of the channel layer 106 is extremely thin and the contact resistance between the source electrode 172 and the channel layer 106 is not sufficiently low. However, the first ohmic contact layer 120-1 has the first bottom-extending portion in contact with the part of the bottom surface of the multi-layer structure. The first bottom-extending portion of the first ohmic contact layer 120-1 provides another secondary current path between the source electrode 172 and the channel layer 106. In the drawing, the primary current path is represented by "R2" and "R3", whilst the another secondary current path is represented by "R4". The further provision of the other secondary current path in addition to the primary current path surely reduces the contact resistance between the source electrode 172 and the channel layer 106. Namely, the first bottom-extending portion of the first ohmic contact layer 120-1 provides the additional current path for electron current between the source electrode 172 and the channel layer 106, whereby the further reduction in the contact resistance between the source electrode 172 and the channel layer 106 is surely obtained.

A second ohmic contact layer 120-2 is selectively provided over another predetermined region of the top surface of the $Al_{0.2}Ga_{0.8}As$ buffer layer 103, so that the second ohmic contact layer 120-2 extends in contact with an entire of a second side face of the multi-layer structure. The second ohmic contact layer 120-2 may comprise an Si-doped GaAs layer having an impurity concentration of $4E18$ $cm^{-3}$. The second ohmic contact layer 120-2 has a top surface which is higher in level than the top surface of the multi-layer structure. The second ohmic contact layer 120-2 has a second top-extending portion which extends over a second side region of the top surface of the multi-layer structure. The second top-extending portion continuously extends from an edge of the top surface of the multi-layer structure toward the C-doped GaAs layer 110, provided that a second inside edge of the second top-extending portion of the second ohmic contact layer 120-2 is distanced from the C-doped GaAs layer 110 and from the gate electrode 171. The second top-extending portion of the second ohmic contact layer 120-2 has a second lateral length which is defined between the second edge of the top surface of the multi-layer structure to the second inside edge of the second top-extending portion. It is preferable that the second lateral length of the second top-extending portion of the second ohmic contact layer 120-2 is not less than a thickness of the multi-layer structure or a total thickness of the above six layers 104, 105, 106, 107, 108 and 109 but not more than a half of a second distance defined between the gate electrode 171 and the second edge of the top surface of the multi-layer structure. Namely, it is preferable that the second inside edge of the second top-extending portion of the second ohmic contact layer 120-2 is positioned outside the half position between the edge of the gate electrode 171 and the second edge of the top surface of the multi-layer structure and inside the lateral distance from the second edge of the top surface of the multi-layer structure, wherein the lateral distance corresponds to the thickness of the multi-layer structure or the total thickness of the above six layers 104, 105, 106, 107, 108 and 109. It is most preferable that the second lateral length of the second top-extending portion of the second ohmic contact layer 120-2 is about a half of a second distance defined between the gate electrode 171 and the second edge of the top surface of the multi-layer structure. Namely, the second inside edge of the second top-extending portion of the second ohmic contact layer 120-2 is positioned at an intermediate point between the edge of the gate electrode 171 and the second edge of the top surface of the multi-layer structure. A drain electrode 173 is provided on a top surface of the second ohmic contact layer 120-2. The second ohmic contact layer 120-2 in contact with the second side face of the multi-layer structure provides a primary current path between the channel layer 106 and the drain electrode 173. As described above, the thickness of the channel layer 106 is extremely thin and the contact resistance between the drain electrode 173 and the channel layer 106 is not sufficiently low. However, the second ohmic contact layer 120-2 has the second top-extending portion in contact with the part of the top surface of the multi-layer structure. The second top-extending portion of the second ohmic contact layer 120-2 provides a secondary current path between the drain electrode 173 and the channel layer 106. In the drawing, the primary current path is represented by "R2" and "R3", whilst the secondary current path is represented by "R1". The further provision of the secondary current path in addition to the primary current path surely reduces the contact resistance between the drain electrode 173 and the channel layer 106. Namely, the second top-extending portion of the second ohmic contact layer 120-2 provides the additional current path for electron current between the drain electrode 173 and the channel layer 106, whereby the further reduction in the contact resistance between the drain electrode 173 and the channel layer 106 is surely obtained.

The second ohmic contact layer 120-2 further has second side-extending portions which extend to and in contact with second predetermined regions of two adjacent side faces to the above second side face of the multi-layer structure. The second side-extending portions continuously extend from two vertically extending opposite edges of the second side face of the multi-layer structure inwardly. Each of the second side-extending portions of the second ohmic contact layer 120-2 varies in lateral length over level, wherein the lateral length is defined between the vertically extending edge of the second side face of the multi-layer structure and the second inside edge of the second side-extending portion. Each of the second side-extending portions of the second ohmic contact layer 120-2 extends between the top and bottom levels of the multi-layer structure. At the top level of the second side-extending portions, the lateral length of each of the second side-extending portions of the second ohmic contact layer 120-2 is minimum for keeping a sufficient distance from the gate electrode 171, wherein the inside edge of the second side-extending portion of the second ohmic contact layer 120-2 is aligned to the inside edge of the second top-extending portion of the second ohmic contact layer 120-2. As the level is dropped from the top level and approaches the same level as the spacer layer 107 overlying the channel layer 106, the lateral length of each of the second side-extending portions of the second ohmic contact layer 120-2 proportionally increases to the maximum length to form a tapered shape for keeping the sufficient distance from the gate electrode 171. As the level is further dropped from the same level as the spacer layer 107 to the bottom level of the multi-layer structure, the lateral length of each of the second side-extending portions of the second ohmic contact layer 120-2 remains unchanged at the maximum, provided that the maximum lateral length of each of the second side-extending portions of the second ohmic contact layer 120-2 is less than a half of the distance between the first and second side faces opposite to each other of the multi-layer structure. At the top level, the lateral length of each of the second side-extending portions of the second ohmic contact layer 120-2 is preferably not less than the thickness of the multi-layer structure or the total thickness of the above six layers 104, 105, 106, 107, 108 and 109 but not more than a half of the second distance defined between the gate electrode 171 and the second edge of the top surface of the multi-layer structure. It is most preferable that the lateral length of each of the second side-extending portions of the second ohmic contact layer 120-2 is about a half of a second distance defined between the gate electrode 171 and the second edge of the top surface of the multi-layer structure. The second side-extending portions of the second ohmic contact layer 120-2 surround the channel layer 106 and increases the contact area with the channel layer 106 for further reducing the contact resistance. The second ohmic contact layer 120-2 in contact with the second side face of the multi-layer structure provides the primary current path between the channel layer 106 and the drain electrode 173. As described above, the thickness of the channel layer 106 is extremely thin and the contact resistance between the drain electrode 173 and the channel layer 106 is not sufficiently low. However, the second ohmic contact layer 120-2 has the second side-extending portions in contact with the channel layer 106 to increase the contact area with the channel layer 106. The second side-extending portions of the second ohmic contact layer 120-2 make wide the primary current path between the drain electrode 173 and the channel layer 106. The primary current path exists not only through the second side face of the multi-layer structure but also through the two adjacent side faces to the second side faces. The further increase of the primary current path surely reduces the contact resistance between the drain electrode 173 and the channel layer 106. Namely, the second side-extending portions of the second ohmic contact layer 120-2 provide the additional current path for electron current between the drain electrode 173 and the channel layer 106, whereby the farther reduction in the contact resistance between the drain electrode 173 and the channel layer 106 is surely obtained.

The second ohmic contact layer 120-2 further more has a second bottom-extending portion which extends under the bottom surface of the multi-layer structure. The second bottom-extending portion continuously extends from an edge of the bottom surface of the multi-layer structure inwardly, provided that the inside edge of the second bottom-extending portion of the second ohmic contact layer 120-2 is aligned to the inside edge of each of the second side-extending portions of the second ohmic contact layer 120-2. The second bottom-extending portion of the second ohmic contact layer 120-2 has a lateral length which is defined between the second edge of the bottom surface of the multi-layer structure to the second inside edge of the second bottom-extending portion. The lateral length of the second bottom-extending portion of the second ohmic contact layer 120-2 is the same as the maximum lateral length of each of the second side-extending portions of the second ohmic contact layer 120-2, provided that the lateral length of the second bottom-extending portion of the second ohmic contact layer 120-2 is less than a half of the distance defined between the first and second side faces opposite to each other of the multi-layer structure. The second ohmic contact layer 120-2 in contact with the second side face of the multi-layer structure provides the primary current path between the channel layer 106 and the drain electrode 173. As described above, the thickness of the channel layer 106 is extremely thin and the contact resistance between the drain electrode 173 and the channel layer 106 is not sufficiently low. However, the second ohmic contact layer 120-2 has the second bottom-extending portion in contact with the part of the bottom surface of the multi-layer structure. The second bottom-extending portion of the second ohmic contact layer 120-2 provides another secondary current path between the drain electrode 173 and the channel layer 106. In the drawing, the primary current path is represented by "R2" and "R3", whilst the another secondary current path is represented by "R4". The further provision of the other secondary current path in addition to the primary current path surely reduces the contact resistance between the drain electrode 173 and the channel layer 106. Namely, the second bottom-extending portion of the second ohmic contact layer 120-2 provides the additional current path for electron current between the drain electrode 173 and the channel layer 106, whereby the further reduction in the contact resistance between the drain electrode 173 and the channel layer 106 is surely obtained.

As described above, the above first and second top-extending portions, the first and second side-extending portions and the first and second bottom-extending portions of the first and second ohmic contact layers 120-1 and 120-2 may provide a reduction in contact resistance between the source and drain electrodes 172 and 173 through the channel region.

In this embodiment, the above described novel ohmic contact layer structure is applied to the p-n junction field effect transistor of the Group III–V compound semiconductors. It is, however, possible to apply the above described novel ohmic contact layer structure to other semiconductor devices, such as high electron mobility transistor and heterojunction field effect transistor.

As described above, the top layer 109 of the multi-layer structure comprises the undoped $Al_{0.2}Ga_{0.8}As$ layer, wherein the compositional index of Al is 0.2. It is, however, more effective that the above novel ohmic contact structure is applied to when the compositional index of Al is not less than 0.3.

Figure 6:
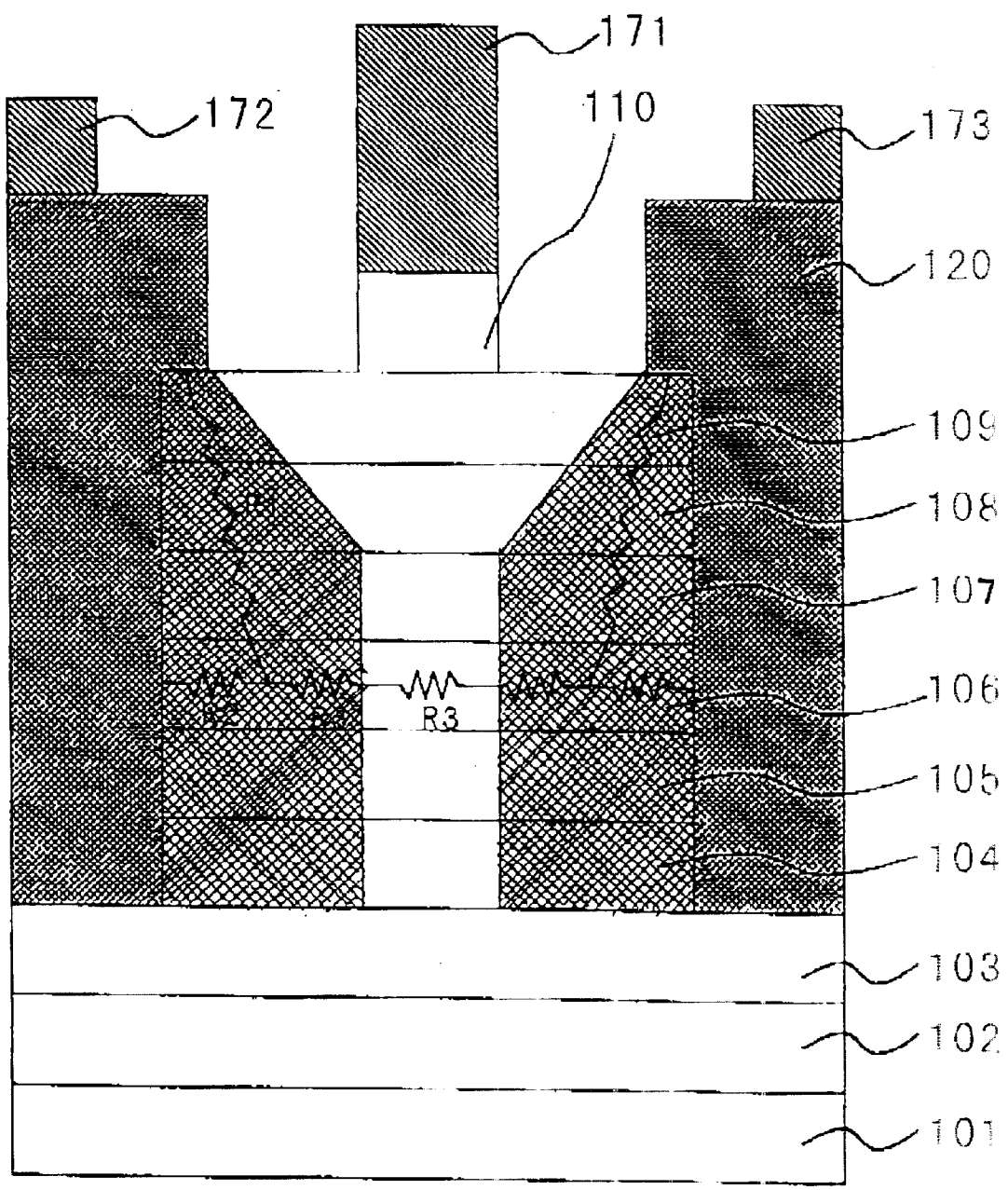
FIG. 6 is a fragmentary cross sectional elevation view illustrative of a third novel compound semiconductor field effect transistor in a third embodiment in accordance with the present invention.

THIRD EMBODIMENT:

A third embodiment according to the present invention will be described in detail with reference to the drawings. FIG. 6 is a fragmentary cross sectional elevation view illustrative of a third novel compound semiconductor field effect transistor in a third embodiment in accordance with the present invention. A GaAs buffer layer 102 having a thickness of 400 nanometers is provided on a top surface of a semi-insulating GaAs substrate 101. An $Al_{0.2}Ga_{0.8}As$ buffer layer 103 having a thickness of 100 nanometers is provided on a top surface of the GaAs buffer layer 102. A multi-layer structure is selectively provided on a predetermined region of the top surface of the $Al_{0.2}Ga_{0.8}As$ buffer layer 103. The multi-layer structure comprises laminations of the following six layers. An Si-doped $Al_{0.2}Ga_{0.8}As$ electron donor layer 104 having a thickness of 4 nanometers and an Si impurity concentration of 4E18 $cm^{-3}$ is selectively provided on the predetermined region of the top surface of the $Al_{0.2}Ga_{0.8}As$ buffer layer 103. An undoped $Al_{0.2}Ga_{0.8}As$ spacer layer 105 having a thickness of 2 nanometers is provided on a top surface of the Si-doped $Al_{0.2}Ga_{0.8}As$ electron donor layer 104. An undoped $In_{0.2}Ga_{0.8}As$ channel layer 106 having a thickness of 15 nanometers is provided on a top surface of the undoped $Al_{0.2}Ga_{0.8}As$ spacer layer 105. An undoped $Al_{0.2}Ga_{0.8}As$ spacer layer 107 having a thickness of 2 nanometers is provided on a top surface of the undoped $In_{0.2}Ga_{0.8}As$ channel layer 106. An Si-doped $Al_{0.2}Ga_{0.8}As$ electron donor layer 108 having a thickness of 12 nanometers and an Si impurity concentration of 4E18 $cm^{-3}$ is selectively provided on a top surface of the undoped $Al_{0.2}Ga_{0.8}As$ spacer layer 107. An undoped $Al_{0.2}Ga_{0.8}As$ layer 109 having a thickness of 15 nanometers is provided on a top surface of the Si-doped $Al_{0.2}Ga_{0.8}As$ electron donor layer 108. The multi-layer structure thus comprises the above lamination structure of the six layers, for example, the Si-doped $Al_{0.2}Ga_{0.8}As$ electron donor layer 104, the undoped $Al_{0.2}Ga_{0.8}As$ spacer layer 105, the undoped $In_{0.2}Ga_{0.8}As$ channel layer 106, the undoped $Al_{0.2}Ga_{0.8}As$ spacer layer 107, the Si-doped $Al_{0.2}Ga_{0.8}As$ electron donor layer 108, and the undoped $Al_{0.2}Ga_{0.8}As$ layer 109. A C-doped GaAs layer 110 having a thickness of 50 nanometers is selectively provided on a predetermined region of a top surface of the undoped $Al_{0.2}Ga_{0.8}As$ layer 109 or the top surface of the multi-layer structure. A gate electrode 171 is provided on the C-doped GaAs layer 110.

A first ohmic contact layer 120-1 is selectively provided over a predetermined region of the top surface of the $Al_{0.2}Ga_{0.8}As$ buffer layer 103, so that the first ohmic contact layer 120-1 extends in contact with an entire of a first side face of the multi-layer structure. The first ohmic contact layer 120-1 may comprise an Si-doped GaAs layer having an impurity concentration of 4E18 $cm^{-3}$. The first ohmic contact layer 120-1 has a top surface which is higher in level than the top surface of the multi-layer structure.

The first ohmic contact layer 120-1 has a first top-extending portion which extends over a first side region of the top surface of the multi-layer structure. The first top-extending portion continuously extends from an edge of the top surface of the multi-layer structure toward the C-doped GaAs layer 110, provided that a first inside edge of the first top-extending portion of the first ohmic contact layer 120-1 is distanced from the C-doped GaAs layer 110 and from the gate electrode 171. The first top-extending portion of the first ohmic contact layer 120-1 has a first lateral length which is defined between the first edge of the top surface of the multi-layer structure to the first inside edge of the first top-extending portion. It is preferable that the first lateral length of the first top-extending portion of the first ohmic contact layer 120-1 is not less than a thickness of the multi-layer structure or a total thickness of the above six layers 104, 105, 106, 107, 108 and 109 but not more than a half of a first distance defined between the gate electrode 171 and the first edge of the top surface of the multi-layer structure. Namely, it is preferable that the first inside edge of the first top-extending portion of the first ohmic contact layer 120-1 is positioned outside the half position between the edge of the gate electrode 171 and the first edge of the top surface of the multi-layer structure and inside the lateral distance from the first edge of the top surface of the multi-layer structure, wherein the lateral distance corresponds to the thickness of the multi-layer structure or the total thickness of the above six layers 104, 105, 106, 107, 108 and 109. It is most preferable that the first lateral length of the first top-extending portion of the first ohmic contact layer 120-1 is about a half of a first distance defined between the gate electrode 171 and the first edge of the top surface of the multi-layer structure. Namely, the first inside edge of the first top-extending portion of the first ohmic contact layer 120-1 is positioned at an intermediate point between the edge of the gate electrode 171 and the first edge of the top surface of the multi-layer structure. A source electrode 172 is provided on a top surface of the first ohmic contact layer 120-1. The first ohmic contact layer 120-1 in contact with the first side face of the multi-layer structure provides a primary current path between the channel layer 106 and the source electrode 172. As described above, the thickness of the channel layer 106 is extremely thin and the contact resistance between the source electrode 172 and the channel layer 106 is not sufficiently low. However, the first ohmic contact layer 120-1 has the first top-extending portion in contact with the part of the top surface of the multi-layer structure. The first top-extending portion of the first ohmic contact layer 120-1 provides a secondary current path between the source electrode 172 and the channel layer 106. In the drawing, the primary current path is represented by "R2" and "R3", whilst the secondary current path is represented by "R1". The further provision of the secondary current path in addition to the primary current path surely reduces the contact resistance between the source electrode 172 and the channel layer 106. Namely, the first top-extending portion of the first ohmic contact layer 120-1 provides the additional current path for electron current between the source electrode 172 and the channel layer 106, whereby the further reduction in the contact resistance between the source electrode 172 and the channel layer 106 is surely obtained.

The first ohmic contact layer 120-1 further has first side-extending portions which extend to and in contact with first predetermined regions of two adjacent side faces to the above first side face of the multi-layer structure. The first side-extending portions continuously extend from two vertically extending opposite edges of the first side face of the multi-layer structure inwardly. Each of the first side-extending portions of the first ohmic contact layer 120-1 varies in lateral length over level, wherein the lateral length is defined between the vertically extending edge of the first side face of the multi-layer structure and the first inside edge of the first side-extending portion. Each of the first side-extending portions of the first ohmic contact layer 120-1 extends between the top and bottom levels of the multi-layer structure. At the top level of the first side-extending portions, the lateral length of each of the first side-extending portions of the first ohmic contact layer 120-1 is minimum for keeping a sufficient distance from the gate electrode 171, wherein the inside edge of the first side-extending portion of the first ohmic contact layer 120-1 is aligned to the inside edge of the first top-extending portion of the first ohmic contact layer 120-1. As the level is dropped from the top level and approaches the same level as the spacer layer 107 overlying the channel layer 106, the lateral length of each of the first side-extending portions of the first ohmic contact layer 120-1 proportionally increases to the maximum length to form a tapered shape for keeping the sufficient distance from the gate electrode 171. As the level is further dropped from the same level as the spacer layer 107 to the bottom level of the multi-layer structure, the lateral length of each of the first side-extending portions of the first ohmic contact layer 120-1 remains unchanged at the maximum, provided that the maximum lateral length of each of the first side-extending portions of the first ohmic contact layer 120-1 is less than a half of the distance between the first and second side faces opposite to each other of the multi-layer structure. At the top level, the lateral length of each of the first side-extending portions of the first ohmic contact layer 120-1 is preferably not less than the thickness of the multi-layer structure or the total thickness of the above six layers 104, 105, 106, 107, 108 and 109 but not more than a half of the first distance defined between the gate electrode 171 and the first edge of the top surface of the multi-layer structure. It is most preferable that the lateral length of each of the first side-extending portions of the first ohmic contact layer 120-1 is about a half of a first distance defined between the gate electrode 171 and the first edge of the top surface of the multi-layer structure. The first side-extending portions of the first ohmic contact layer 120-1 surround the channel layer 106 and increases the contact area with the channel layer 106 for further reducing the contact resistance. The first ohmic contact layer 120-1 in contact with the first side face of the multi-layer structure provides the primary current path between the channel layer 106 and the source electrode 172. As described above, the thickness of the channel layer 106 is extremely thin and the contact resistance between the source electrode 172 and the channel layer 106 is not sufficiently low. However, the first ohmic contact layer 120-1 has the first side-extending portions in contact with the channel layer 106 to increase the contact area with the channel layer 106. The first side-extending portions of the first ohmic contact layer 120-1 make wide the primary current path between the source electrode 172 and the channel layer 106. The primary current path exists not only through the first side face of the multi-layer structure but also through the two adjacent side faces to the first side faces. The further increase of the primary current path surely reduces the contact resistance between the source electrode 172 and the channel layer 106. Namely, the first side-extending portions of the first ohmic contact layer 120-1 provide the additional current path for electron current between the source electrode 172 and the channel layer 106, whereby the further reduction in the contact resistance between the source electrode 172 and the channel layer 106 is surely obtained.

A second ohmic contact layer 120-2 is selectively provided over another predetermined region of the top surface of the $Al_{0.2}Ga_{0.8}As$ buffer layer 103, so that the second ohmic contact layer 120-2 extends in contact with an entire of a second side face of the multi-layer structure. The second ohmic contact layer 120-2 may comprise an Si-doped GaAs layer having an impurity concentration of $4E18$ $cm^{-3}$. The second ohmic contact layer 120-2 has a top surface which is higher in level than the top surface of the multi-layer structure. The second ohmic contact layer 120-2 has a second top-extending portion which extends over a second side region of the top surface of the multi-layer structure. The second top-extending portion continuously extends from an edge of the top surface of the multi-layer structure toward the C-doped GaAs layer 110, provided that a second inside edge of the second top-extending portion of the second ohmic contact layer 120-2 is distanced from the C-doped GaAs layer 110 and from the gate electrode 171. The second top-extending portion of the second ohmic contact layer 120-2 has a second lateral length which is defined between the second edge of the top surface of the multi-layer structure to the second inside edge of the second top-extending portion. It is preferable that the second lateral length of the second top-extending portion of the second ohmic contact layer 120-2 is not less than a thickness of the multi-layer structure or a total thickness of the above six layers 104, 105, 106, 107, 108 and 109 but not more than a half of a second distance defined between the gate electrode 171 and the second edge of the top surface of the multi-layer structure. Namely, it is preferable that the second inside edge of the second top-extending portion of the second ohmic contact layer 120-2 is positioned outside the half position between the edge of the gate electrode 171 and the second edge of the top surface of the multi-layer structure and inside the lateral distance from the second edge of the top surface of the multi-layer structure, wherein the lateral distance corresponds to the thickness of the multi-layer structure or the total thickness of the above six layers 104, 105, 106, 107, 108 and 109. It is most preferable that the second lateral length of the second top-extending portion of the second ohmic contact layer 120-2 is about a half of a second distance defined between the gate electrode 171 and the second edge of the top surface of the multi-layer structure. Namely, the second inside edge of the second top-extending portion of the second ohmic contact layer 120-2 is positioned at an intermediate point between the edge of the gate electrode 171 and the second edge of the top surface of the multi-layer structure A drain electrode 173 is provided on a top surface of the second ohmic contact layer 120-2. The second ohmic contact layer 120-2 in contact with the second side face of the multi-layer structure provides a primary current path between the channel layer 106 and the drain electrode 173. As described above, the thickness of the channel layer 106 is extremely thin and the contact resistance between the drain electrode 173 and the channel layer 106 is not sufficiently low. However, the second ohmic contact layer 120-2 has the second top-extending portion in contact with the part of the top surface of the multi-layer structure. The second top-extending portion of the second ohmic contact layer 120-2 provides a secondary current path between the drain electrode 173 and the channel layer 106. In the drawing, the primary current path is represented by "R2" and "R3", whilst the secondary current path is represented by "R1". The further provision of the secondary current path in addition to the primary current path surely reduces the contact resistance between the drain electrode 173 and the channel layer 106. Namely, the second top-extending portion of the second ohmic contact layer 120-2 provides the additional current path for electron current between the drain electrode 173 and the channel layer 106, whereby the further reduction in the contact resistance between the drain electrode 173 and the channel layer 106 is surely obtained.

The second ohmic contact layer 120-2 further has second side-extending portions which extend to and in contact with second predetermined regions of two adjacent side faces to the above second side face of the multi-layer structure. The second side-extending portions continuously extend from two vertically extending opposite edges of the second side face of the multi-layer structure inwardly. Each of the second side-extending portions of the second ohmic contact layer 120-2 varies in lateral length over level, wherein the lateral length is defined between the vertically extending edge of the second side face of the multi-layer structure and the second inside edge of the second side-extending portion. Each of the second side-extending portions of the second ohmic contact layer 120-2 extends between the top and bottom levels of the multi-layer structure. At the top level of the second side-extending portions, the lateral length of each of the second side-extending portions of the second ohmic contact layer 120-2 is minimum for keeping a sufficient distance from the gate electrode 171, wherein the inside edge of the second side-extending portion of the second ohmic contact layer 120-2 is aligned to the inside edge of the second top-extending portion of the second ohmic contact layer 120-2. As the level is dropped from the top level and approaches the same level as the spacer layer 107 overlying the channel layer 106, the lateral length of each of the second side-extending portions of the second ohmic contact layer 120-2 proportionally increases to the maximum length to form a tapered shape for keeping the sufficient distance from the gate electrode 171. As the level is further dropped from the same level as the spacer layer 107 to the bottom level of the multi-layer structure, the lateral length of each of the second side-extending portions of the second ohmic contact layer 120-2 remains unchanged at the maximum, provided that the maximum lateral length of each of the second side-extending portions of the second ohmic contact layer 120-2 is less than a half of the distance between the first and second side faces opposite to each other of the multi-layer structure. At the top level, the lateral length of each of the second side-extending portions of the second ohmic contact layer 120-2 is preferably not less than the thickness of the multi-layer structure or the total thickness of the above six layers 104, 105, 106, 107, 108 and 109 but not more than a half of the second distance defined between the gate electrode 171 and the second edge of the top surface of the multi-layer structure. It is most preferable that the lateral length of each of the second side-extending portions of the second ohmic contact layer 120-2 is about a half of a second distance defined between the gate electrode 171 and the second edge of the top surface of the multi-layer structure. The second side-extending portions of the second ohmic contact layer 120-2 surround the channel layer 106 and increases the contact area with the channel layer 106 for further reducing the contact resistance. The second ohmic contact layer 120-2 in contact with the second side face of the multi-layer structure provides the primary current path between the channel layer 106 and the drain electrode 173. As described above, the thickness of the channel layer 106 is extremely thin and the contact resistance between the drain electrode 173 and the channel layer 106 is not sufficiently low. However, the second ohmic contact layer 120-2 has the second side-extending portions in contact with the channel layer 106 to increase the contact area with the channel layer 106. The second side-extending portions of the second ohmic contact layer 120-2 make wide the primary current path between the drain electrode 173 and the channel layer 106. The primary current path exists not only through the second side face of the multi-layer structure but also through the two adjacent side faces to the second side faces. The further increase of the primary current path surely reduces the contact resistance between the drain electrode 173 and the channel layer 106. Namely, the second side-extending portions of the second ohmic contact layer 120-2 provide the additional current path for electron current between the drain electrode 173 and the channel layer 106, whereby the further reduction in the contact resistance between the drain electrode 173 and the channel layer 106 is surely obtained.

As described above, the above first and second top-extending portions, and the first and second side-extending portions of the first and second ohmic contact layers 120-1 and 120-2 may provide a reduction in contact resistance between the source and drain electrodes 172 and 173 through the channel region, In this embodiment, the above described novel ohmic contact layer structure is applied to the p-n junction field effect transistor of the Group III–V compound semiconductors. It is, however, possible to apply the above described novel ohmic contact layer structure to other semiconductor devices, such as high electron mobility transistor and heterojunction field effect transistor.

As described above, the top layer 109 of the multi-layer structure comprises the undoped $Al_{0.2}Ga_{0.8}As$ layer, wherein the compositional index of Al is 0.2. It is, however, more effective that the above novel ohmic contact structure is applied to when the compositional index of Al is not less than 0.3.

Figure 7:
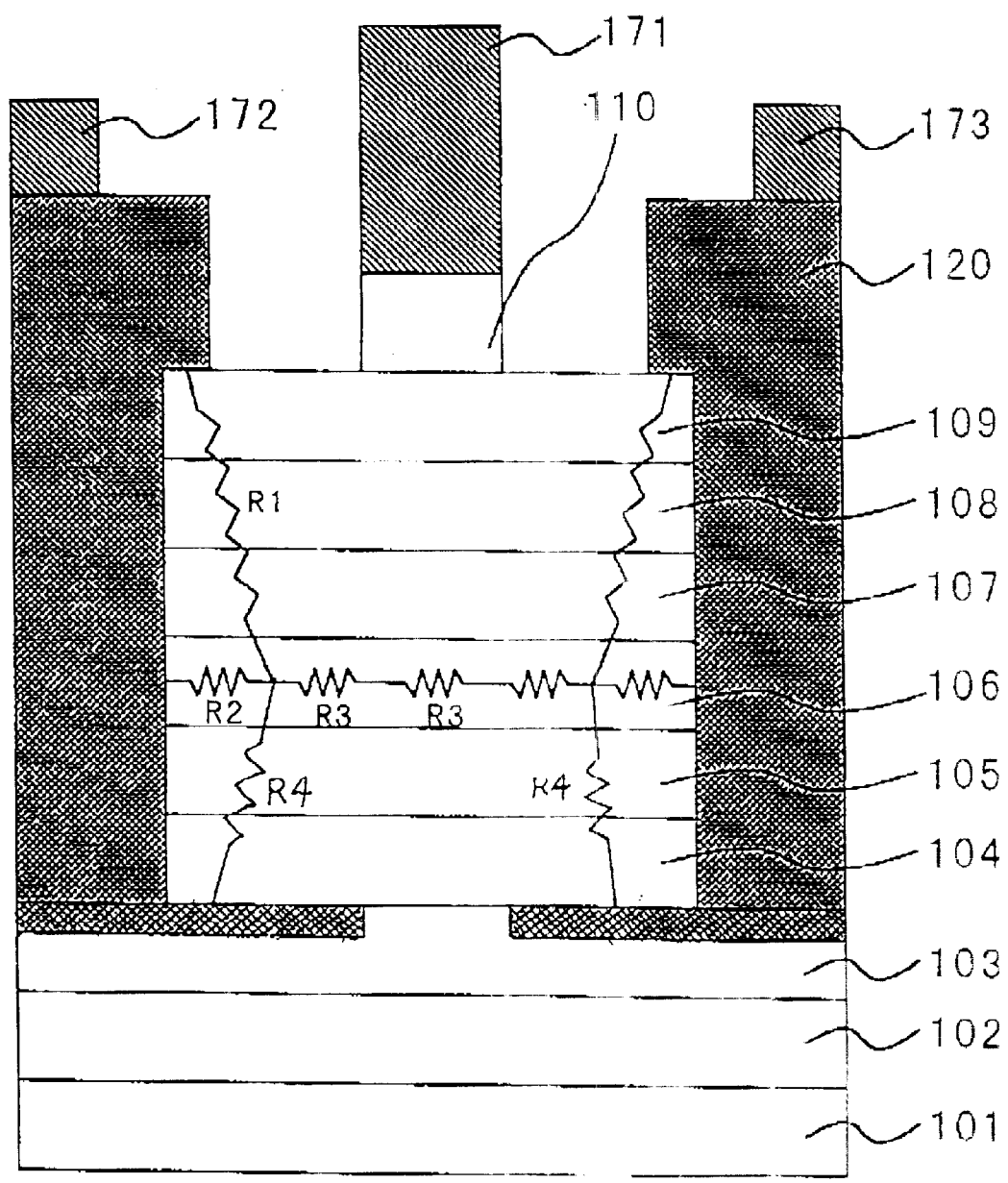
FIG. 7 is a fragmentary cross sectional elevation view illustrative of a fourth novel compound semiconductor field effect transistor in a fourth embodiment in accordance with the present invention.

FOURTH EMBODIMENT:

A fourth embodiment according to the present invention will be described in detail with reference to the drawings. FIG. 7 is a fragmentary cross sectional elevation view illustrative of a fourth novel compound semiconductor field effect transistor in a fourth embodiment in accordance with the present invention. A GaAs buffer layer 102 having a thickness of 400 nanometers is provided on a top surface of a semi-insulating GaAs substrate 101. An $Al_{0.2}Ga_{0.8}As$ buffer layer 103 having a thickness of 100 nanometers is provided on a top surface of the GaAs buffer layer 102. A multi-layer structure is selectively provided on a predetermined region of the top surface of the $Al_{0.2}Ga_{0.8}As$ buffer layer 103. The multi-layer structure comprises laminations of the following six layers. An Si-doped $Al_{0.2}Ga_{0.8}As$ electron donor layer 104 having a thickness of 4 nanometers and an Si impurity concentration of 4E18 $cm^{-3}$ is selectively provided on the predetermined region of the top surface of the $Al_{0.2}Ga_{0.8}As$ buffer layer 103. An undoped $Al_{0.2}Ga_{0.8}As$ spacer layer 105 having a thickness of 2 nanometers is provided on a top surface of the Si-doped $Al_{0.2}Ga_{0.8}As$ electron donor layer 104. An undoped $In_{0.2}Ga_{0.8}As$ channel layer 106 having a thickness of 15 nanometers is provided on a top surface of the undoped $Al_{0.2}Ga_{0.8}As$ spacer layer 105. An undoped $Al_{0.2}Ga_{0.8}As$ spacer layer 107 having a thickness of 2 nanometers is provided on a top surface of the undoped $In_{0.2}Ga_{0.8}As$ channel layer 106. An Si-doped $Al_{0.2}Ga_{0.8}As$ electron donor layer 108 having a thickness of 12 nanometers and an Si impurity concentration of 4E18 $cm^{-3}$ is selectively provided on a top surface of the undoped $Al_{0.2}Ga_{0.8}As$ spacer layer 107. An undoped $Al_{0.2}Ga_{0.8}As$ layer 109 having a thickness of 15 nanometers is provided on a top surface of the Si-doped $Al_{0.2}Ga_{0.8}As$ electron donor layer 108. The multi-layer structure thus comprises the above lamination structure of the six layers, for example, the Si-doped $Al_{0.2}Ga_{0.8}As$ electron donor layer 104, the undoped $Al_{0.2}Ga_{0.8}As$ spacer layer 105, the undoped $In_{0.2}Ga_{0.8}As$ channel layer 106, the undoped $Al_{0.2}Ga_{0.8}As$ spacer layer 107, the Si-doped $Al_{0.2}Ga_{0.8}As$ electron donor layer 108, and the undoped $Al_{0.2}Ga_{0.8}As$ layer 109. A C-doped GaAs layer 110 having a thickness of 50 nanometers is selectively provided on a predetermined region of a top surface of the undoped $Al_{0.2}Ga_{0.8}As$ layer 109 or the top surface of the multi-layer structure. A gate electrode 171 is provided on the C-doped GaAs layer 110.

A first ohmic contact layer 120-1 is selectively provided over a predetermined region of the top surface of the $Al_{0.2}Ga_{0.8}As$ buffer layer 103, so that the first ohmic contact layer 120-1 extends in contact with an entire of a first side face of the multi-layer structure. The first ohmic contact layer 120-1 may comprise an Si-doped GaAs layer having an impurity concentration of 4E18 $cm^{-3}$. The first ohmic contact layer 120-1 has a top surface which is higher in level than the top surface of the multi-layer structure.

The first ohmic contact layer 120-1 has a first top-extending portion which extends over a first side region of the top surface of the multi-layer structure. The first top-extending portion continuously extends from an edge of the top surface of the multi-layer structure toward the C-doped GaAs layer 110, provided that a first inside edge of the first top-extending portion of the first ohmic contact layer 120-1 is distanced from the C-doped GaAs layer 110 and from the gate electrode 171. The first top-extending portion of the first ohmic contact layer 120-1 has a first lateral length which is defined between the first edge of the top surface of the multi-layer structure to the first inside edge of the first top-extending portion. It is preferable that the first lateral length of the first top-extending portion of the first ohmic contact layer 120-1 is not less than a thickness of the multi-layer structure or a total thickness of the above six layers 104, 105, 106, 107, 108 and 109 but not more than a half of a first distance defined between the gate electrode 171 and the first edge of the top surface of the multi-layer structure. Namely, it is preferable that the first inside edge of the first top-extending portion of the first ohmic contact layer 120-1 is positioned outside the half position between the edge of the gate electrode 171 and the first edge of the top surface of the multi-layer structure and inside the lateral distance from the first edge of the top surface of the multi-layer structure, wherein the lateral distance corresponds to the thickness of the multi-layer structure or the total thickness of the above six layers 104, 105, 106, 107, 108 and 109. It is most preferable that the first lateral length of the first top-extending portion of the first ohmic contact layer 120-1 is about a half of a first distance defined between the gate electrode 171 and the first edge of the top surface of the multi-layer structure. Namely, the first inside edge of the first top-extending portion of the first ohmic contact layer 120-1 is positioned at an intermediate point between the edge of the gate electrode 171 and the first edge of the top surface of the multi-layer structure. A source electrode 172 is provided on a top surface of the first ohmic contact layer 120-1. The first ohmic contact layer 120-1 in contact with the first side face of the multi-layer structure provides a primary current path between the channel layer 106 and the source electrode 172. As described above, the thickness of the channel layer 106 is extremely thin and the contact resistance between the source electrode 172 and the channel layer 106 is not sufficiently low. However, the first ohmic contact layer 120-1 has the first top-extending portion in contact with the part of the top surface of the multi-layer structure. The first top-extending portion of the first ohmic contact layer 120-1 provides a secondary current path between the source electrode 172 and the channel layer 106. In the drawing, the primary current path is represented by "R2" and "R3", whilst the secondary current path is represented by "R1". The further provision of the secondary current path in addition to the primary current path surely reduces the contact resistance between the source electrode 172 and the channel layer 106. Namely, the first top-extending portion of the first ohmic contact layer 120-1 provides the additional current path for electron current between the source electrode 172 and the channel layer 106, whereby the further reduction in the contact resistance between the source electrode 172 and the channel layer 106 is surely obtained.

The first ohmic contact layer 120-1 further more has a first bottom-extending portion which extends under the bottom surface of the multi-layer structure. The first bottom-extending portion continuously extends from an edge of the bottom surface of the multi-layer structure inwardly. The first bottom-extending portion of the first ohmic contact layer 120-1 has a lateral length which is defined between the first edge of the bottom surface of the multi-layer structure to the first inside edge of the first bottom-extending portion. The lateral length of the first bottom-extending portion of the first ohmic contact layer 120-1 is less than a half of the distance defined between the first and second side faces opposite to each other of the multi-layer structure. The first ohmic contact layer 120-1 in contact with the first side face of the multi-layer structure provides the primary current path between the channel layer 106 and the source electrode 172. As described above, the thickness of the channel layer 106 is extremely thin and the contact resistance between the source electrode 172 and the channel layer 106 is not sufficiently low. However, the first ohmic contact layer 120-1 has the first bottom-extending portion in contact with the pan of the bottom surface of the multi-layer structure. The first bottom-extending portion of the first ohmic contact layer 120-1 provides another secondary current path between the source electrode 172 and the channel layer 106. In the drawing, the primary current path is represented by "R2" and "R3", whilst the another secondary current path is represented by "R4". The further provision of the other secondary current path in addition to the primary current path surely reduces the contact resistance between the source electrode 172 and the channel layer 106. Namely, the first bottom-extending portion of the first ohmic contact layer 120-1 provides the additional current path for electron current between the source electrode 172 and the channel layer 106, whereby the further reduction in the contact resistance between the source electrode 172 and the channel layer 106 is surely obtained.

A second ohmic contact layer 120-2 is selectively provided over another predetermined region of the top surface of the $Al_{0.2}Ga_{0.8}As$ buffer layer 103, so that the second ohmic contact layer 120-2 extends in contact with an entire of a second side face of the multi-layer structure. The second ohmic contact layer 120-2 may comprise an Si-doped GaAs layer having an impurity concentration of $4E18$ $cm^{-3}$. The second ohmic contact layer 120-2 has a top surface which is higher in level than the top surface of the multi-layer structure. The second ohmic contact layer 120-2 has a second top-extending portion which extends over a second side region of the top surface of the multi-layer structure. The second top-extending portion continuously extends from an edge of the top surface of the multi-layer structure toward the C-doped GaAs layer 110, provided that a second inside edge of the second top-extending portion of the second ohmic contact layer 120-2 is distanced from the C-doped GaAs layer 110 and from the gate electrode 171. The second top-extending portion of the second ohmic contact layer 120-2 has a second lateral length which is defined between the second edge of the top surface of the multi-layer structure to the second inside edge of the second top-extending portion. It is preferable that the second lateral length of the second top-extending portion of the second ohmic contact layer 120-2 is not less than a thickness of the multi-layer structure or a total thickness of the above six layers 104, 105, 106, 107, 108 and 109 but not more than a half of a second distance defined between the gate electrode 171 and the second edge of the top surface of the multi-layer structure. Namely, it is preferable that the second inside edge of the second top-extending portion of the second ohmic contact layer 120-2 is positioned outside the half position between the edge of the gate electrode 171 and the second edge of the top surface of the multi-layer structure and inside the lateral distance from the second edge of the top surface of the multi-layer structure, wherein the lateral distance corresponds to the thickness of the multi-layer structure or the total thickness of the above six layers 104, 105, 106, 107, 108 and 109. It is most preferable that the second lateral length of the second top-extending portion of the second ohmic contact layer 120-2 is about a halt of a second distance defined between the gate electrode 171 and the second edge of the top surface of the multi-layer structure. Namely, the second inside edge of the second top-extending portion of the second ohmic contact layer 120-2 is positioned at an intermediate point between the edge of the gate electrode 171 and the second edge of the top surface of the multi-layer structure. A drain electrode 173 is provided on a top surface of the second ohmic contact layer 120-2. The second ohmic contact layer 120-2 in contact with the second side face of the multi-layer structure provides a primary current path between the channel layer 106 and the drain electrode 173. As described above, the thickness of the channel layer 106 is extremely thin and the contact resistance between the drain electrode 173 and the channel layer 106 is not sufficiently low. However, the second ohmic contact layer 120-2 has the second top-extending portion in contact with the part of the top surface of the multi-layer structure. The second top-extending portion of the second ohmic contact layer 120-2 provides a secondary current path between the drain electrode 173 and the channel layer 106. In the drawing, the primary current path is represented by "R2" and "R3", whilst the secondary current path is represented by "R1". The further provision of the secondary current path in addition to the primary current path surely reduces the contact resistance between the drain electrode 173 and the channel layer 106. Namely, the second top-extending portion of the second ohmic contact layer 120-2 provides the additional current path for electron current between the drain electrode 173 and the channel layer 106, whereby the further reduction in the contact resistance between the drain electrode 173 and the channel layer 106 is surely obtained.

The second ohmic contact layer 120-2 further more has a second bottom-extending portion which extends under the bottom surface of the multi-layer structure. The second bottom-extending portion continuously extends from an edge of the bottom surface of the multi-layer structure inwardly. The second bottom-extending portion of the second ohmic contact layer 120-2 has a lateral length which is defined between the second edge of the bottom surface of the multi-layer structure to the second inside edge of the second bottom-extending portion. The lateral length of the second bottom-extending portion of the second ohmic contact layer 120-2 is less than a half of the distance defined between the first and second side faces opposite to each other of the multi-layer structure. The second ohmic contact layer 120-2 in contact with the second side face of the multi-layer structure provides the primary current path between the channel layer 106 and the drain electrode 173. As described above, the thickness of the channel layer 106 is extremely thin and the contact resistance between the drain electrode 173 and the channel layer 106 is not sufficiently low. However, the second ohmic contact layer 120-2 has the second bottom-extending portion in contact with the part of the bottom surface of the multi-layer structure. The second bottom-extending portion of the second ohmic contact layer 120-2 provides another secondary current path between the drain electrode 173 and the channel layer 106. In the drawing, the primary current path is represented by "R2" and "R3", whilst the another secondary current path is represented by "R4". The further provision of the other secondary current path in addition to the primary current path surely reduces the contact resistance between the drain electrode 173 and the channel layer 106. Namely, the second bottom-extending portion of the second ohmic contact layer 120-2 provides the additional current path for electron current between the drain electrode 173 and the channel layer 106, whereby the further reduction in the contact resistance between the drain electrode 173 and the channel layer 106 is surely obtained.

As described above, the above first and second top-extending portions, and the first and second bottom-extending portions of the first and second ohmic contact layers 120-1 and 120-2 may provide a reduction in contact resistance between the source and drain electrodes 172 and 173 through the channel region.

In this embodiment, the above described novel ohmic contact layer structure is applied to the p-n junction field effect transistor of the Group III–V compound semiconductors. It is, however, possible to apply the above described novel ohmic contact layer structure to other semiconductor devices, such as high electron mobility transistor and heterojunction field effect transistor.

As described above, the top layer 109 of the multi-layer structure comprises the undoped $Al_{0.2}Ga_{0.8}As$ layer, wherein the compositional index of Al is 0.2. It is, however, more effective that the above novel ohmic contact structure is applied to when the compositional index of Al is not less than 0.3.

Figure 8:
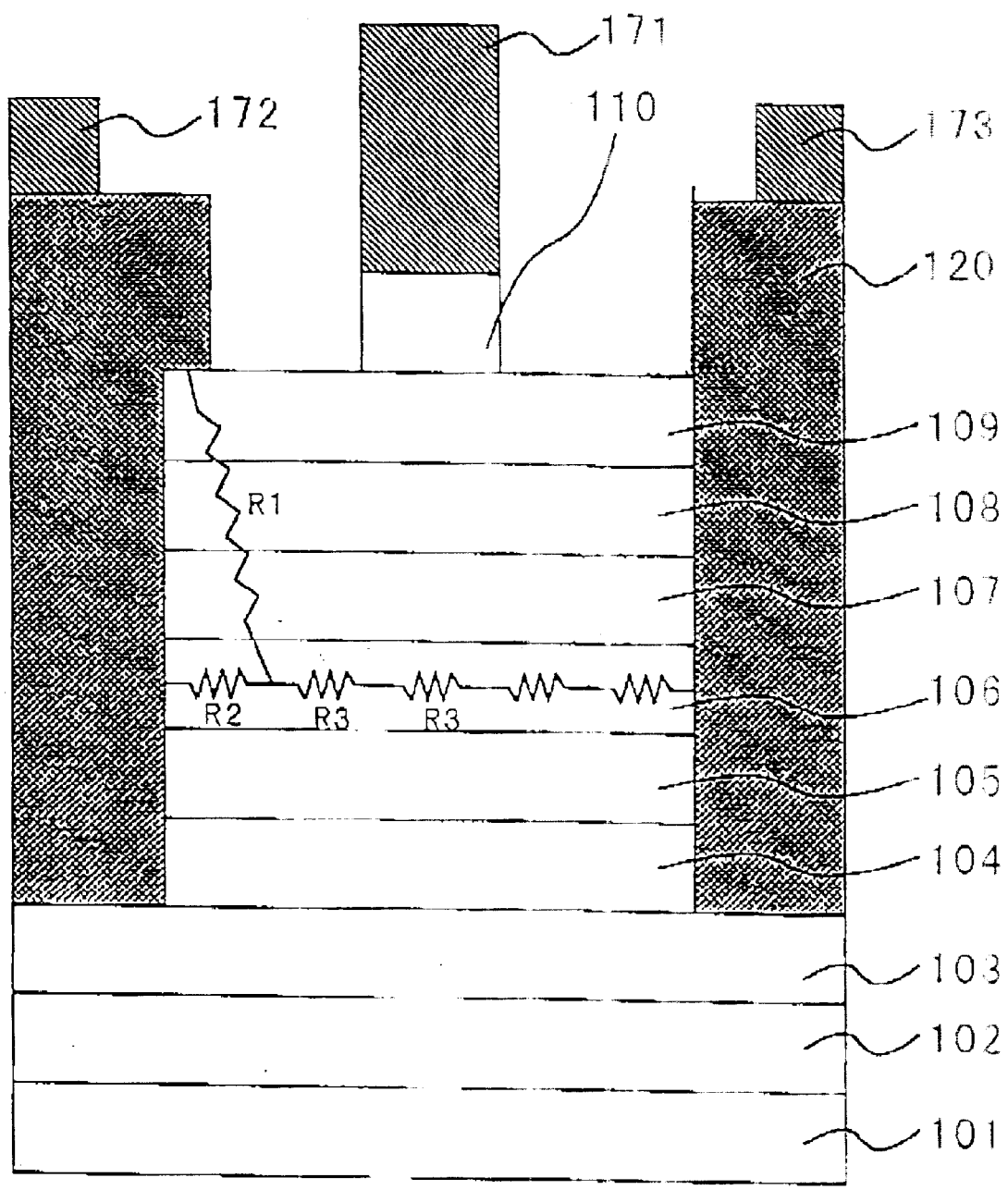
FIG. 8 is a fragmentary cross sectional elevation view illustrative of a fifth novel compound semiconductor field effect transistor in a fifth embodiment in accordance with the present invention.

FIFTH EMBODIMENT:

A fifth embodiment according to the present invention will be described in detail with reference to the drawings. FIG. 8 is a fragmentary cross sectional elevation view illustrative of a fifth novel compound semiconductor field effect transistor in a fifth embodiment in accordance with the present invention. A GaAs buffer layer 102 having a thickness of 400 nanometers is provided on a top surface of a semi-insulating GaAs substrate 101. An $Al_{0.2}Ga_{0.8}As$ buffer layer 103 having a thickness of 100 nanometers is provided on a top surface of the GaAs buffer layer 102. A multi-layer structure is selectively provided on a predetermined region of the top surface of the $Al_{0.2}Ga_{0.8}As$ buffer layer 103. The multi-layer structure comprises laminations of the following six layers. An Si-doped $Al_{0.2}Ga_{0.8}As$ electron donor layer 104 having a thickness of 4 nanometers and an Si impurity concentration of 4E18 cm$^{-3}$ is selectively provided on the predetermined region of the top surface of the $Al_{0.2}Ga_{0.8}As$ buffer layer 103. An undoped $Al_{0.2}Ga_{0.8}As$ spacer layer 105 having a thickness of 2 nanometers is provided on a top surface of the Si-doped $Al_{0.2}Ga_{0.8}As$ electron donor layer 104. An undoped $In_{0.2}Ga_{0.8}As$ channel layer 106 having a thickness of 15 nanometers is provided on a top surface of the undoped $Al_{0.2}Ga_{0.8}As$ spacer layer 105. An undoped $A_{0.2}Ga_{0.8}As$ spacer layer 107 having a thickness of 2 nanometers is provided on a top surface of the undoped $In_{0.2}Ga_{0.8}As$ channel layer 106. An Si-doped $Al_{0.2}Ga_{0.8}As$ electron donor layer 108 having a thickness of 12 nanometers and an Si impurity concentration of 4E18 cm$^{-3}$ is selectively provided on a top surface of the undoped $Al_{0.2}Ga_{0.8}As$ spacer layer 107. An undoped $Al_{0.2}Ga_{0.8}As$ layer 109 having a thickness of 15 nanometers is provided on a top surface of the Si-doped $Al_{0.2}Ga_{0.8}As$ electron donor layer 108. The multi-layer structure thus comprises the above lamination structure of the six layers, for example, the Si-doped $Al_{0.2}Ga_{0.8}As$ electron donor layer 104, the undoped $Al_{0.2}Ga_{0.8}As$ spacer layer 105, the undoped $In_{0.2}Ga_{0.8}As$ channel layer 106, the undoped $Al_{2.0}Ga_{0.8}As$ spacer layer 107, the Si-doped $Al_{0.2}Ga_{0.8}As$ electron donor layer 108, and the undoped $Al_{0.2}Ga_{0.8}As$ layer 109. A C-doped GaAs layer 110 having a thickness of 50 nanometers is selectively provided on a predetermined region of a top surface of the undoped $Al_{0.2}Ga_{0.8}As$ layer 109 or the top surface of the multi-layer structure. A gate electrode 171 is provided on the C-doped GaAs layer 110.

A first ohmic contact layer 120-1 is selectively provided over a predetermined region of the top surface of the $Al_{0.2}Ga_{0.8}As$ buffer layer 103, so that the first ohmic contact layer 120-1 extends in contact with an entire of a first side face of the multi-layer structure. The first ohmic contact layer 120-1 may comprise an Si-doped GaAs layer having an impurity concentration of 4E18 cm$^{-3}$. The first ohmic contact layer 120-1 has a top surface which is higher in level than the top surface of the multi-layer structure. The fist ohmic contact layer 120-1 has a first top-extending portion which extends over a first side region of the top surface of the multi-layer structure. The first top-extending portion continuously extends from an edge of the top surface of the multi-layer structure toward the C-doped GaAs layer 110, provided that a first inside edge of the first top-extending portion of the first ohmic contact layer 120-1 is distanced from the C-doped GaAs layer 110 and from the gate electrode 171. The first top-extending portion of the first ohmic contact layer 120-1 has a first lateral length which is defined between the first edge of the top surface of the multi-layer structure to the first inside edge of the first top-extending portion. It is preferable that the first lateral length of the first top-extending portion of the first ohmic contact layer 120-1 is not less than a thickness of the multi-layer structure or a total thickness of the above six layers 104, 105, 106, 107, 108 and 109 but not more than a half of a first distance defined between the gate electrode 171 and the first edge of the top surface of the multi-layer structure. Namely, it is preferable that the first inside edge of the first top-extending portion of the first ohmic contact layer 120-1 is positioned outside the half position between the edge of the gate electrode 171 and the first edge of the top surface of the multi-layer structure and inside the lateral distance from the first edge of the top surface of the multi-layer structure, wherein the lateral distance corresponds to the thickness of the multi-layer structure or the total thickness of the above six layers 104, 105, 106, 107, 108 and 109. It is most preferable that the first lateral length of the first top-extending portion of the first ohmic contact layer 120-1 is about a half of a first distance defined between the gate electrode 171 and the first edge of the top surface of the multi-layer structure. Namely, the first inside edge of the first top-extending portion of the first ohmic contact layer 120-1 is positioned at an intermediate point between the edge of the gate electrode 171 and the first edge of the top surface of the multi-layer structure. A source electrode 172 is provided on a top surface of the first ohmic contact layer 120-1. The first ohmic contact layer 120-1 in contact with the first side face of the multi-layer structure provides a primary current path between the channel layer 106 and the source electrode 172. As described above, the thickness of the channel layer 106 is extremely thin and the contact resistance between the source electrode 172 and the channel layer 106 is not sufficiently low. However, the first ohmic contact layer 120-1 has the first top-extending portion in contact with the part of the top surface of the multi-layer structure. The first top-extending portion of the first ohmic contact layer 120-1 provides a secondary current path between the source electrode 172 and the channel layer 106. In the drawing, the primary current path is represented by "R2" and "R3", whilst the secondary current path is represented by "R1". The further provision of the secondary current path in addition to the primary current path surely reduces the contact resistance between the source electrode 172 and the channel layer 106. Namely, the first top-extending portion of the first ohmic contact layer 120-1 provides the additional current path for electron current between the source electrode 172 and the channel layer 106, whereby the further reduction in the contact resistance between the source electrode 172 and the channel layer 106 is surely obtained.

A second ohmic contact layer 120-2 is selectively provided over another predetermined region of the top surface of the $Al_{0.2}Ga_{0.8}As$ buffer layer 103, so that the second ohmic contact layer 120-2 extends in contact with an entire of a second side face of the multi-layer structure. The second ohmic contact layer 120-2 may comprise an Si-doped GaAs layer having an impurity concentration of 4E18 cm$^{-3}$. The second ohmic contact layer 120-2 has a top surface which is higher in level than the top surface of the multi-layer structure. A drain electrode 173 is provided on a top surface of the second ohmic contact layer 120-2.

As described above, the above first top-extending portion of the first ohmic contact layer 120-1 may provide a reduction in contact resistance between the source and drain electrodes 172 and 173 through the channel region.

In this embodiment, the above described novel ohmic contact layer structure is applied to the p-n junction field effect transistor of the Group III–V compound semiconductors. It is, however, possible to apply the above described novel ohmic contact layer structure to other semiconductor devices, such as high electron mobility transistor and heterojunction field effect transistor.

As described above, the top layer 109 of the multi-layer structure comprises the undoped $Al_{0.2}Ga_{0.8}As$ layer, wherein the compositional index of Al is 0.2. It is, however, more effective that the above novel ohmic contact structure is applied to when the compositional index of Al is not less than 0.3.

Figure 9:
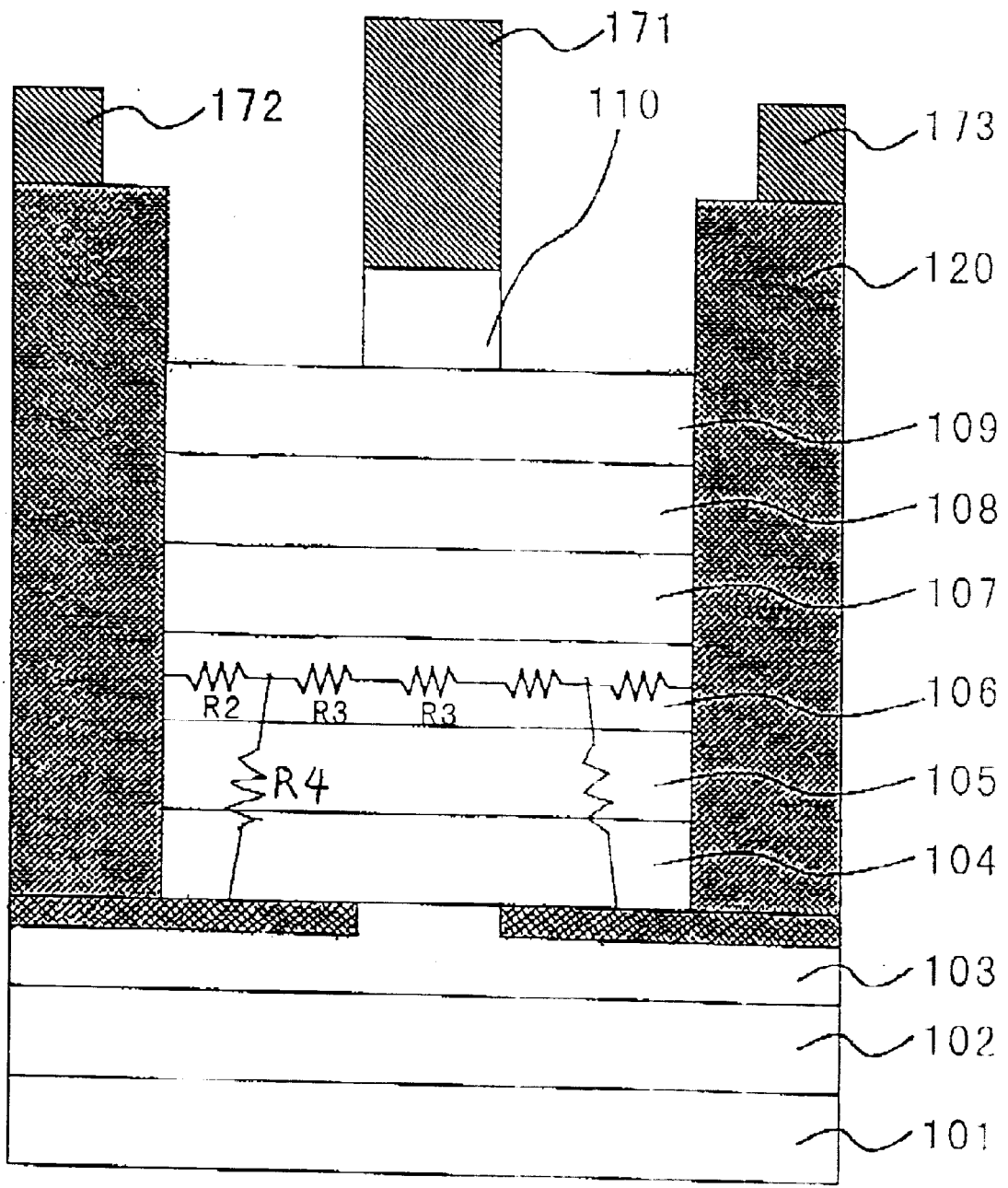
FIG. 9 is a fragmentary cross sectional elevation view illustrative of a sixth novel compound semiconductor field effect transistor in a sixth embodiment in accordance with the present invention.

SIXTH EMBODIMENT:

A sixth embodiment according to the present invention will be described in detail with reference to the drawings. FIG. 9 is a fragmentary cross sectional elevation view illustrative of a sixth novel compound semiconductor field effect transistor in a sixth embodiment in accordance with the present invention. A GaAs buffer layer 102 having a thickness of 400 nanometers is provided on a top surface of a semi-insulating GaAs substrate 101. An $Al_{0.2}Ga_{0.8}As$ buffer layer 103 having a thickness of 100 nanometers is provided on a top surface of the GaAs buffer layer 102. A multi-layer structure is selectively provided on a predetermined region of the top surface of the $Al_{0.2}Ga_{0.8}As$ buffer layer 103. The multi-layer structure comprises laminations of the following six layers. An Si-doped $Al_{0.2}Ga_{0.8}As$ electron donor layer 104 having a thickness of 4 nanometers and an Si impurity concentration of 4E18 cm$^{-3}$ is selectively provided on the predetermined region of the top surface of the $Al_{0.2}Ga_{0.8}As$ buffer layer 103. An undoped $Al_{0.2}Ga_{0.8}As$ spacer layer 105 having a thickness of 2 nanometers is provided on a top surface of the Si-doped $Al_{0.2}Ga_{0.8}As$ electron donor layer 104. An undoped $In_{0.2}Ga_{0.8}As$ channel layer 106 having a thickness of 15 nanometers is provided on a top surface of the undoped $Al_{0.2}Ga_{0.8}As$ spacer layer 105. An undoped $Al_{0.2}Ga_{0.8}As$ spacer layer 107 having a thickness of 2 nanometers is provided on a top surface of the undoped $In_{0.2}Ga_{0.8}As$ channel layer 106. An Si-doped $Al_{0.2}Ga_{0.8}As$ electron donor layer 108 having a thickness of 12 nanometers and an Si impurity concentration of 4E18 cm$^{-3}$ is selectively provided on a top surface of the undoped $Al_{0.2}Ga_{0.8}As$ spacer layer 107. An undoped $Al_{0.2}Ga_{0.8}As$ layer 109 having a thickness of 15 nanometers is provided on a top surface of the Si-doped $Al_{0.2}Ga_{0.8}As$ electron donor layer 108. The multi-layer structure thus comprises the above lamination structure of the six layers, for example, the Si-doped $Al_{0.2}Ga_{0.8}As$ electron donor layer 104, the undoped $Al_{0.2}Ga_{0.8}As$ spacer layer 105, the undoped $In_{0.2}Ga_{0.8}As$ channel layer 106, the undoped $Al_{0.2}Ga_{0.8}As$ spacer layer 107, the Si-doped $Al_{0.2}Ga_{0.8}As$ electron donor layer 108, and the undoped $Al_{0.2}Ga_{0.8}As$ layer 109. A C-doped GaAs layer 110 having a thickness of 50 nanometers is selectively provided on a predetermined region of a top surface of the undoped $Al_{0.2}Ga_{0.8}As$ layer 109 or the top surface of the multi-layer structure. A gate electrode 171 is provided on the C-doped GaAs layer 110.

A first ohmic contact layer 120-1 is selectively provided over a predetermined region of the top surface of the $Al_{0.2}Ga_{0.8}As$ buffer layer 103, so that the first ohmic contact layer 120-1 extends in contact with an entire of a first side face of the multi-layer structure. The first ohmic contact layer 120-1 may comprise an Si-doped GaAs layer having an impurity concentration of 4E18 cm$^{-3}$. The first ohmic contact layer 120-1 has a top surface which is higher in level than the top surface of the multi-layer structure.

The first ohmic contact layer 120-1 farther more has a first bottom-extending portion which extends under the bottom surface of the multi-layer structure. The first bottom-extending portion continuously extends from an edge of the bottom surface of the multi-layer structure inwardly. The first bottom-extending portion of the first ohmic contact layer 120-1 has a lateral length which is defined between the first edge of the bottom surface of the multi-layer structure to the first inside edge of the first bottom-extending portion. The lateral length of the first bottom-extending portion of the first ohmic contact layer 120-1 is less than a half of the distance defined between the first and second side faces opposite to each other of the multi-layer structure. The first ohmic contact layer 120-1 in contact with the first side face of the multi-layer structure provides the primary current path between the channel layer 106 and the source electrode 172. As described above, the thickness of the channel layer 106 is extremely thin and the contact resistance between the source electrode 172 and the channel layer 106 is not sufficiently low. However, the first ohmic contact layer 120-1 has the first bottom-extending portion in contact with the part of the bottom surface of the multi-layer structure. The first bottom-extending portion of the first ohmic contact layer 120-1 provides a secondary current path between the source electrode 172 and the channel layer 106. In the drawing, the primary current path is represented by "R2" and "R3", whilst the another secondary current path is represented by "R4". The further provision of the other secondary current path in addition to the primary current path surely reduces the contact resistance between the source electrode 172 and the channel layer 106. Namely, the first bottom-extending portion of the first ohmic contact layer 120-1 provides the additional current path for electron current between the source electrode 172 and the channel layer 106, whereby the further reduction in the contact resistance between the source electrode 172 and the channel layer 106 is surely obtained.

A second ohmic contact layer 120-2 is selectively provided over another predetermined region of the top surface of the $Al_{0.2}Ga_{0.8}As$ buffer layer 103, so that the second ohmic contact layer 120-2 extends in contact with an entire of a second side face of the multi-layer structure. The second ohmic contact layer 120-2 may comprise an Si-doped GaAs layer having an impurity concentration of 4E18 cm$^{-3}$. The second ohmic contact layer 120-2 has a top surface which is higher in level than the top surface of the multi-layer structure.

The second ohmic contact layer 120-2 further more has a second bottom-extending portion which extends under the bottom surface of the multi-layer structure. The second bottom-extending portion continuously extends from an edge of the bottom surface of the multi-layer structure inwardly. The second bottom-extending portion of the second ohmic contact layer 120-2 has a lateral length which is defined between the second edge of the bottom surface of the multi-layer structure to the second inside edge of the second bottom-extending portion. The lateral length of the second bottom-extending portion of the second ohmic contact layer 120-2 is less than a half of the distance defined between the first and second side faces opposite to each other of the multi-layer structure. The second ohmic contact layer 120-2 in contact with the second side face of the multi-layer structure provides the primary current path between the channel layer 106 and the drain electrode 173. As described above, the thickness of the channel layer 106 is extremely thin and the contact resistance between the drain electrode 173 and the channel layer 106 is not sufficiently low. However, the second ohmic contact layer 120-2 has the second bottom-extending portion in contact with the part of the bottom surface of the multi-layer structure. The second bottom-extending portion of the second ohmic contact layer 120-2 provides another secondary current path between the drain electrode 173 and the channel layer 106. In the drawing, the primary current path is represented by "R2" and "R3", whilst the another secondary current path is represented by "R4". The further provision of the other secondary current path in addition to the primary current path surely reduces the contact resistance between the drain electrode 173 and the channel layer 106. Namely, the second bottom-extending portion of the second ohmic contact layer 120-2 provides the additional current path for electron current between the drain electrode 173 and the channel layer 106, whereby the further reduction in the contact resistance between the drain electrode 173 and the channel layer 106 is surely obtained.

As described above, the above first and second bottom-extending portions of the first and second ohmic contact layers 120-1 and 120-2 may provide a reduction in contact resistance between the source and drain electrodes 172 and 173 through the channel region.

In this embodiment, the above described novel ohmic contact layer structure is applied to the p-n junction field effect transistor of the Group III–V compound semiconductors. It is, however, possible to apply the above described novel ohmic contact layer structure to other semiconductor devices, such as high electron mobility transistor and heterojunction field effect transistor.

Figure 10:
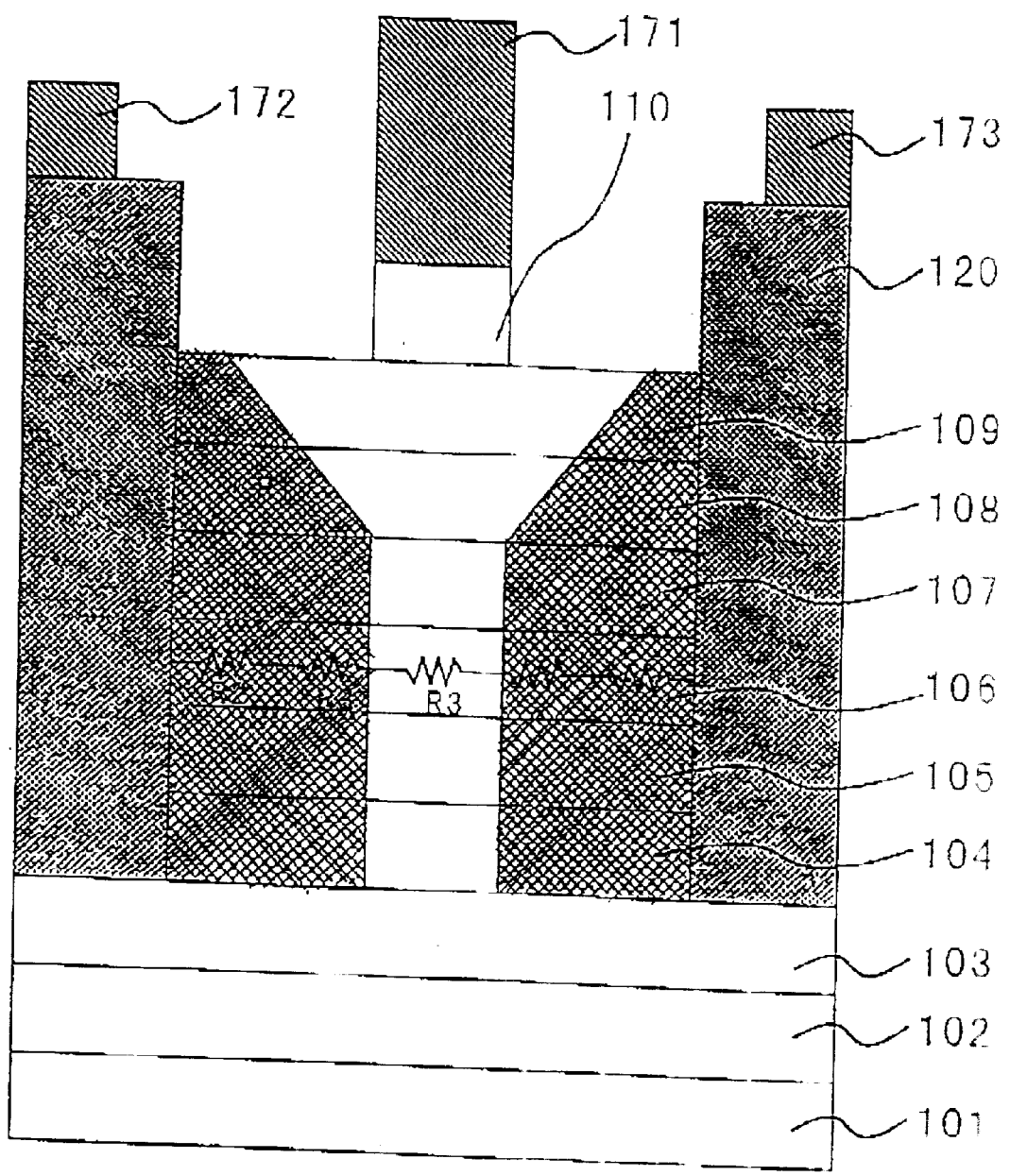
FIG. 10 is a fragmentary cross sectional elevation view illustrative of a seventh novel compound semiconductor field effect transistor in a seventh embodiment in accordance with the present invention.

SEVENTH EMBODIMENT:

A seventh embodiment according to the present invention will be described in detail with reference to the drawings. FIG. 10 is a fragmentary cross sectional elevation view illustrative of a seventh novel compound semiconductor field effect transistor in a seventh embodiment in accordance with the present invention. A GaAs buffer layer 102 having a thickness of 400 nanometers is provided on a top surface of a semi-insulating GaAs substrate 101. An $Al_{0.2}Ga_{0.8}As$ buffer layer 103 having a thickness of 100 nanometers is provided on a top surface of the GaAs buffer layer 102. A multi-layer structure is selectively provided on a predetermined region of the top surface of the $Al_{0.2}Ga_{0.8}As$ buffer layer 103. The multi-layer structure comprises laminations of the following six layers. An Si-doped $Al_{0.2}Ga_{0.8}As$ electron donor layer 104 having a thickness of 4 nanometers and an Si impurity concentration of 4E18 $cm^{-3}$ is selectively provided on the predetermined region of the top surface of the $Al_{0.2}Ga_{0.8}As$ buffer layer 103. An undoped $Al_{0.2}Ga_{0.8}As$ spacer layer 105 having a thickness of 2 nanometers is provided on a top surface of the Si-doped $Al_{0.2}Ga_{0.8}As$ electron donor layer 104. An undoped $In_{0.2}Ga_{0.8}As$ channel layer 106 having a thickness of 15 nanometers is provided on a top surface of the undoped $Al_{0.2}Ga_{0.8}As$ spacer layer 105. An undoped $Al_{0.2}Ga_{0.8}As$ spacer layer 107 having a thickness of 2 nanometers is provided on a top surface of the undoped $In_{0.2}Ga_{0.8}As$ channel layer 106. An Si-doped $Al_{0.2}Ga_{0.8}As$ electron donor layer 108 having a thickness of 12 nanometers and an Si impurity concentration of 4E18 $cm^{-3}$ is selectively provided on a top surface of the undoped $Al_{0.2}Ga_{0.8}As$ spacer layer 107. An undoped $Al_{0.2}Ga_{0.8}As$ layer 109 having a thickness of 15 nanometers is provided on a top surface of the Si-doped $Al_{0.2}Ga_{0.8}As$ electron donor layer 108. The multi-layer structure thus comprises the above lamination structure of the six layers, for example, the Si-doped $Al_{0.2}Ga_{0.8}As$ electron donor layer 104, the undoped $Al_{0.2}Ga_{0.8}As$ spacer layer 105, the undoped $In_{0.2}Ga_{0.8}As$ channel layer 106, the undoped $Al_{0.2}Ga_{0.8}As$ spacer layer 107, the Si-doped $Al_{0.2}Ga_{0.8}As$ electron donor layer 108, and the undoped $Al_{0.2}Ga_{0.8}As$ layer 109. A C-doped GaAs layer 110 having a thickness of 50 nanometers is selectively provided on a predetermined region of a top surface of the undoped $Al_{0.2}Ga_{0.8}As$ layer 109 or the top surface of the multi-layer structure. A gate electrode 171 is provided on the C-doped GaAs layer 110.

A first ohmic contact layer 120-1 is selectively provided over a predetermined region of the top surface of the $Al_{0.2}Ga_{0.8}As$ buffer layer 103, so that the first ohmic contact layer 120-1 extends in contact with an entire of a first side face of the multi-layer structure. The first ohmic contact layer 120-1 may comprise an Si-doped GaAs layer having an impurity concentration of 4E18 $cm^{-3}$. The first ohmic contact layer 120-1 has a top surface which is higher in level than the top surface of the multi-layer structure.

The first ohmic contact layer 120-1 further has first side extending portions which extend to and in contact with first predetermined regions of two adjacent side faces to the above first side face of the multi-layer structure. The first side-extending portions continuously extend from two vertically extending opposite edges of the first side face of the multi-layer structure inwardly. Each of the first side-extending portions of the first ohmic contact layer 120-1 varies in lateral length over level, wherein the lateral length is defined between the vertically extending edge of the first side face of the multi-layer structure and the first inside edge of the first side-extending portion. Each of the first side-extending portions of the first ohmic contact layer 120-1 extends between the top and bottom levels of the multi-layer structure. At the top level of the first side-extending portions, the lateral length of each of the first side-extending portions of the first ohmic contact layer 120-1 is minimum for keeping a sufficient distance from the gate electrode 171. As the level is dropped from the top level and approaches the same level as the spacer layer 107 overlying the channel layer 106, the lateral length of each of the first side-extending portions of the first ohmic contact layer 120-1 proportionally increases to the maximum length to form a tapered shape for keeping the sufficient distance from the gate electrode 171. As the level is further dropped from the same level as the spacer layer 107 to the bottom level of the multi-layer structure, the lateral length of each of the first side-extending portions of the first ohmic contact layer 120-1 remains unchanged at the maximum, provided that the maximum lateral length of each of the first side-extending portions of the first ohmic contact layer 120-1 is less than a half of the distance between the first and second side faces opposite to each other of the multi-layer structure. At the top level, the lateral length of each of the first side-extending portions of the first ohmic contact layer 120-1 is preferably not less than the thickness of the multi-layer structure or the total thickness of the above six layers 104, 105, 106, 107, 108 and 109 but not more than a half of the first distance defined between the gate electrode 171 and the first edge of the top surface of the multi-layer structure. It is most preferable that the lateral length of each of the first side-extending portions of the first ohmic contact layer 120-1 is about a half of a first distance defined between the gate electrode 171 and the first edge of the top surface of the multi-layer structure. The first side-extending portions of the first ohmic contact layer 120-1 surround the channel layer 106 and increases the contact area with the channel layer 106 for further reducing the contact resistance. The first ohmic contact layer 120-1 in contact with the first side face of the multi-layer structure provides the primary current path between the channel layer 106 and the source electrode 172. As described above, the thickness of the channel layer 106 is extremely thin and the contact resistance between the source electrode 172 and the channel layer 106 is not sufficiently low. However, the first ohmic contact layer 120-1 has the first side-extending portions in contact with the channel layer 106 to increase the contact area with the channel layer 106. The first side-extending portions of the first ohmic contact layer 120-1 make wide the primary current path between the source electrode 172 and the channel layer 106. The primary current path exists not only through the first side face of the multi-layer structure but also through the two adjacent side faces to the first side faces. The further increase of the primary current path surely reduces the contact resistance between the source electrode 172 and the channel layer 106. Namely, the first side-extending portions of the first ohmic contact layer 120-1 provide the additional current path for electron current between the source electrode 172 and the channel layer 106, whereby the further reduction in the contact resistance between the source electrode 172 and the channel layer 106 is surely obtained.

A second ohmic contact layer 120-2 is selectively provided over another predetermined region of the top surface of the $Al_{0.2}Ga_{0.8}As$ buffer layer 103, so that the second ohmic contact layer 120-2 extends in contact with an entire of a second side face of the multi-layer structure. The second ohmic contact layer 120-2 may comprise an Si-doped GaAs layer having an impurity concentration of $4E18$ $cm^{-3}$. The second ohmic contact layer 120-2 has a top surface which is higher in level than the top surface of the multi-layer structure.

The second ohmic contact layer 120-2 further has second side-extending portions which extend to and in contact with second predetermined regions of two adjacent side faces to the above second side face of the multi-layer structure. The second side-extending portions continuously extend from two vertically extending opposite edges of the second side face of the multi-layer structure inwardly. Each of the second side-extending portions of the second ohmic contact layer 120-2 varies in lateral length over level, wherein the lateral length is defined between the vertically extending edge of the second side face of the multi-layer structure and the second inside edge of the second side-extending portion. Each of the second side-extending portions of the second ohmic contact layer 120-2 extends between the top and bottom levels of the multi-layer structure. At the top level of the second side-extending portions, the lateral length of each of the second side-extending portions of the second ohmic contact layer 120-2 is minimum for keeping a sufficient distance from the gate electrode 171. As the level is dropped from the top level and approaches the same level as the spacer layer 107 overlying the channel layer 106, the lateral length of each of the second side-extending portions of the second ohmic contact layer 120-2 proportionally increases to the maximum length to form a tapered shape for keeping the sufficient distance from the gate electrode 171. As the level is further dropped from the same level as the spacer layer 107 to the bottom level of the multi-layer structure, the lateral length of each of the second side-extending portions of the second ohmic contact layer 120-2 remains unchanged at the maximum, provided that the maximum lateral length of each of the second side-extending portions of the second ohmic contact layer 120-2 is less than a half of the distance between the first and second side faces opposite to each other of the multi-layer structure. At the top level, the lateral length of each of the second side-extending portions of the second ohmic contact layer 120-2 is preferably not less than the thickness of the multi-layer structure or the total thickness of the above six layers 104, 105, 106, 107, 108 and 109 but not more than a half of the second distance defined between the gate electrode 171 and the second edge of the top surface of the multi-layer structure. It is most preferable that the lateral length of each of the second side-extending portions of the second ohmic contact layer 120-2 is about a half of a second distance defined between the gate electrode 171 and the second edge of the top surface of the multi-layer structure. The second side-extending portions of the second ohmic contact layer 120-2 surround the channel layer 106 and increases the contact area with the channel layer 106 for further reducing the contact resistance. The second ohmic contact layer 120-2 in contact with the second side face of the multi-layer structure provides the primary current path between the channel layer 106 and the drain electrode 173. As described above, the thickness of the channel layer 106 is extremely thin and the contact resistance between the drain electrode 173 and the channel layer 106 is not sufficiently low. However, the second ohmic contact layer 120-2 has the second side-extending portions in contact with the channel layer 106 to increase the contact area with the channel layer 106. The second side-extending portions of the second ohmic contact layer 120-2 make wide the primary current path between the drain electrode 173 and the channel layer 106. The primary current path exists not only through the second side face of the multi-layer structure but also through the two adjacent side faces to the second side faces. The further increase of the primary current path surely reduces the contact resistance between the drain electrode 173 and the channel layer 106. Namely, the second side-extending portions of the second ohmic contact layer 120-2 provide the additional current path for electron current between the drain electrode 173 and the channel layer 106, whereby the further reduction in the contact resistance between the drain electrode 173 and the channel layer 106 is surely obtained.

As described above, the above first and second side-extending portions of the first and second ohmic contact layers 120-1 and 120-2 may provide a reduction in contact resistance between the source and drain electrodes 172 and 173 through the channel region.

In this embodiment, the above described novel ohmic contact layer structure is applied to the p-n junction field effect transistor of the Group III–V compound semiconductors. It is, however, possible to apply the above described novel ohmic contact layer structure to other semiconductor devices, such as high electron mobility transistor and heterojunction field effect transistor.

EIGHTH EMBODIMENT:

An eighth embodiment according to the present invention will be described in detail with reference to the drawings.

Figure 11:
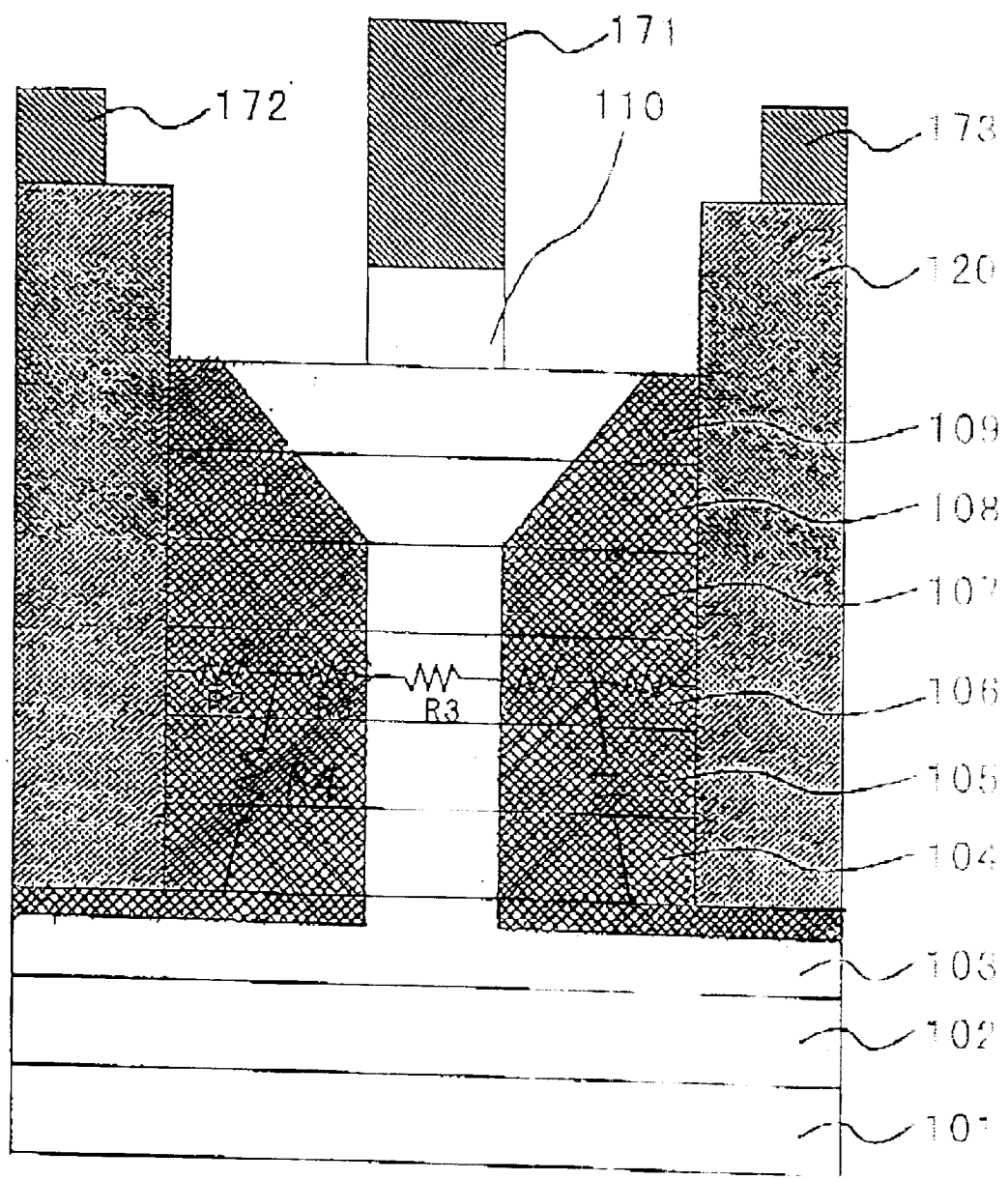
FIG. 11 is a fragmentary cross sectional elevation view illustrative of an eighth novel compound semiconductor field effect transistor in an eighth embodiment in accordance with the present invention.

FIG. 11 is a fragmentary cross sectional elevation view illustrative of an eighth novel compound semiconductor field effect transistor in an eighth embodiment in accordance with the present invention. A GaAs buffer layer 102 having a thickness of 400 nanometers is provided on a top surface of a semi insulating GaAs substrate 101. An $Al_{0.2}Ga_{0.8}As$ buffer layer 103 having a thickness of 100 nanometers is provided on a top surface of the GaAs buffer layer 102. A multi-layer structure is selectively provided on a predetermined region of the top surface of the $Al_{0.2}Ga_{0.8}As$ buffer layer 103. The multi-layer structure comprises laminations of the following six layers. An Si-doped $Al_{0.2}Ga_{0.8}As$ electron donor layer 104 having a thickness of 4 nanometers and an Si impurity concentration of $4E18$ $cm^{-3}$ is selectively provided on the predetermined region of the top surface of the $Al_{0.2}Ga_{0.8}As$ buffer layer 103. An undoped $Al_{0.2}Ga_{0.8}As$ spacer layer 105 having a thickness of 2 nanometers is provided on a top surface of the Si-doped $Al_{0.2}Ga_{0.8}As$ electron donor layer 104. An undoped $In_{0.2}Ga_{0.8}As$ channel layer 106 having a thickness of 15 nanometers is provided on a top surface of the undoped $Al_{0.2}Ga_{0.8}As$ spacer layer 105. An undoped $Al_{0.2}Ga_{0.8}As$ spacer layer 107 having a thickness of 2 nanometers is provided on a top surface of the undoped $In_{0.2}Ga_{0.8}As$ channel layer 106. An Si-doped $Al_{0.2}Ga_{0.8}As$ electron donor layer 108 having a thickness of 12 nanometers and an Si impurity concentration of $4E18$ $cm^{-3}$ is selectively provided on a top surface of the undoped $Al_{0.2}Ga_{0.8}As$ spacer layer 107. An undoped $Al_{0.2}Ga_{0.8}As$ layer 109 having a thickness of 15 nanometers is provided on a top surface of the Si-doped $Al_{0.2}Ga_{0.8}As$ electron donor layer 108. The multi-layer structure thus comprises the above lamination structure of the six layers, for example, the Si-doped $Al_{0.2}Ga_{0.8}As$ electron donor layer 104, the undoped $Al_{0.2}Ga_{0.8}As$ spacer layer 105, the undoped $In_{0.2}Ga_{0.8}As$ channel layer 106, the undoped $Al_{0.2}Ga_{0.8}As$ spacer layer 107, the Si-doped $Al_{0.2}Ga_{0.8}As$ electron donor layer 108, and the undoped $Al_{0.2}Ga_{0.8}As$ layer 109. A C-doped GaAs layer 110 having a thickness of 50 nanometers is selectively provided on a predetermined region of a top surface of the undoped $Al_{0.2}Ga_{0.8}As$ layer 109 or the top surface of the multi-layer structure. A gate electrode 171 is provided on the C-doped GaAs layer 110.

A first ohmic contact layer 120-1 is selectively provided over a predetermined region of the top surface of the $Al_{0.2}Ga_{0.8}As$ buffer layer 103, so that the first ohmic contact layer 120-1 extends in contact with an entire of a first side face of the multi-layer structure. The first ohmic contact layer 120-1 may comprise an Si-doped GaAs layer having an impurity concentration of $4E18$ $cm^{-3}$. The first ohmic contact layer 120-1 has a top surface which is higher in level than the top surface of the multi-layer structure.

The first ohmic contact layer 120-1 further has first side-extending portions which extend to and in contact with first predetermined regions of two adjacent side faces to the above first side face of the multi-layer structure. The first side-extending portions continuously extend from two vertically extending opposite edges of the first side face of the multi-layer structure inwardly. Each of the first side-extending portions of the first ohmic contact layer 120-1 varies in lateral length over level, wherein the lateral length is defined between the vertically extending edge of the first side face of the multi-layer structure and the first inside edge of the first side-extending portion. Each of the first side-extending portions of the first ohmic contact layer 120-1 extends between the top and bottom levels of the multi-layer structure. At the top level of the first side-extending portions, the lateral length of each of the first side-extending portions of the first ohmic contact layer 120-1 is minimum for keeping a sufficient distance from the gate electrode 171. As the level is dropped from the top level and approaches the same level as the spacer layer 107 overlying the channel layer 106, the lateral length of each of the first side-extending portions of the first ohmic contact layer 120-1 proportionally increases to the maximum length to form a tapered shape for keeping the sufficient distance from the gate electrode 171. As the level is further dropped from the same level as the spacer layer 107 to the bottom level of the multi-layer structure, the lateral length of each of the first side-extending portions of the first ohmic contact layer 120-1 remains unchanged at the maximum, provided that the maximum lateral length of each of the first side-extending portions of the first ohmic contact layer 120-1 is less than a half of the distance between the first and second side faces opposite to each other of the multi-layer structure. At the top level, the lateral length of each of the first side-extending portions of the first ohmic contact layer 120-1 is preferably not less than the thickness of the multi-layer structure or the total thickness of the above six layers 104, 105, 106, 107, 108 and 109 but not more than a half of the first distance defined between the gate electrode 171 and the first edge of the top surface of the multi-layer structure. It is most preferable that the lateral length of each of the first side-extending portions of the first ohmic contact layer 120-1 is about a half of a first distance defined between the gate electrode 171 and the first edge of the top surface of the multi-layer structure. The first side-extending portions of the first ohmic contact layer 120-1 surround the channel layer 106 and increases the contact area with the channel layer 106 for further reducing the contact resistance. The first ohmic contact layer 120-1 in contact with the first side face of the multi-layer structure provides the primary current path between the channel layer 106 and the source electrode 172. As described above, the thickness of the channel layer 106 is extremely thin and the contact resistance between the source electrode 172 and the channel layer 106 is not sufficiently low. However, the first ohmic contact layer 120-1 has the first side-extending portions in contact with the channel layer 106 to increase the contact area with the channel layer 106. The first side-extending portions of the first ohmic contact layer 120-1 make wide the primary current path between the source electrode 172 and the channel layer 106. The primary current path exists not only through the first side face of the multi-layer structure but also through the two adjacent side faces to the first side faces. The further increase of the primary current path surely reduces the contact resistance between the source electrode 172 and the channel layer 106. Namely, the first side-extending portions of the first ohmic contact layer 120-1 provide the additional current path for electron current between the source electrode 172 and the channel layer 106, whereby the further reduction in the contact resistance between the source electrode 172 and the channel layer 106 is surely obtained.

The first ohmic contact layer 120-1 further more has a first bottom-extending portion which extends under the bottom surface of the multi-layer structure. The first bottom-extending portion continuously extends from an edge of the bottom surface of the multi-layer structure inwardly, provided that the inside edge of the first bottom-extending portion of the first ohmic contact layer 120-1 is aligned to the inside edge of each of the first side-extending portions of the first ohmic contact layer 120-1. The first bottom-extending portion of the first ohmic contact layer 120-1 has a lateral length which is defined between the first edge of the bottom surface of the multi-layer structure to the first inside edge of the first bottom-extending portion. The lateral length of the first bottom-extending portion of the first ohmic contact layer 120-1 is the same as the maximum lateral length of each of the first side-extending portions of the first ohmic contact layer 120-1, provided that the lateral length of the first bottom-extending portion of the first ohmic contact layer 120-1 is less than a half of the distance defined between the first and second side faces opposite to each other of the multi-layer structure. The first ohmic contact layer 120-1 in contact with the first side face of the multi-layer structure provides the primary current path between the channel layer 106 and the source electrode 172. As described above, the thickness of the channel layer 106 is extremely thin and the contact resistance between the source electrode 172 and the channel layer 106 is not sufficiently low. However, the first ohmic contact layer 120-1 has the first bottom-extending portion in contact with the part of the bottom surface of the multi-layer structure. The first bottom-extending portion of the first ohmic contact layer 120-1 provides another secondary current path between the source electrode 172 and the channel layer 106. In the drawing, the primary current path is represented by "R2" and "R3", whilst the another secondary current path is represented by "R4". The further provision of the other secondary current path in addition to the primary current path surely reduces the contact resistance between the source electrode 172 and the channel layer 106. Namely, the first bottom-extending portion of the first ohmic contact layer 120-1 provides the additional current path for electron current between the source electrode 172 and the channel layer 106, whereby the further reduction in the contact resistance between the source electrode 172 and the channel layer 106 is surely obtained.

A second ohmic contact layer 120-2 is selectively provided over another predetermined region of the top surface of the $Al_{0.2}Ga_{0.8}As$ buffer layer 103, so that the second ohmic contact layer 120-2 extends in contact with an entire of a second side face of the multi-layer structure. The second ohmic contact layer 120-2 may comprise an Si-doped GaAs layer having an impurity concentration of 4E18 $cm^{-3}$. The second ohmic contact layer 120-2 has a top surface which is higher in level than the top surface of the multi-layer structure.

The second ohmic contact layer 120-2 further has second side-extending portions which extend to and in contact with second predetermined regions of two adjacent side faces to the above second side face of the multi-layer structure. The second side-extending portions continuously extend from two vertically extending opposite edges of the second side face of the multi-layer structure inwardly. Each of the second side-extending portions of the second ohmic contact layer 120-2 varies in lateral length over level, wherein the lateral length is defined between the vertically extending edge of the second side face of the multi-layer structure and the second inside edge of the second side-extending portion. Each of the second side-extending portions of the second ohmic contact layer 120-2 extends between the top and bottom levels of the multi-layer structure. At the top level of the second side-extending portions, the lateral length of each of the second side-extending portions of the second ohmic contact layer 120-2 is minimum for keeping a sufficient distance from the gate electrode 171. As the level is dropped from the top level and approaches the same level as the spacer layer 107 overlying the channel layer 106, the lateral length of each of the second side-extending portions of the second ohmic contact layer 120-2 proportionally increases to the maximum length to form a tapered shape for keeping the sufficient distance from the gate electrode 171. As the level is further dropped from the same level as the spacer layer 107 to the bottom level of the multi-layer structure, the lateral length of each of the second side-extending portions of the second ohmic contact layer 120-2 remains unchanged at the maximum, provided that the maximum lateral length of each of the second side-extending portions of the second ohmic contact layer 120-2 is less than a half of the distance between the first and second side faces opposite to each other of the multi-layer structure. At the top level, the lateral length of each of the second side-extending portions of the second ohmic contact layer 120-2 is preferably not less than the thickness of the multi-layer structure or the total thickness of the above six layers 104, 105, 106, 107, 108 and 109 but not more than a half of the second distance defined between the gate electrode 171 and the second edge of the top surface of the multi-layer structure. It is most preferable that the lateral length of each of the second side-extending portions of the second ohmic contact layer 120-2 is about a half of a second distance defined between the gate electrode 171 and the second edge of the top surface of the multi-layer structure. The second side-extending portions of the second ohmic contact layer 120-2 surround the channel layer 106 and increases the contact area with the channel layer 106 for further reducing the contact resistance. The second ohmic contact layer 120-2 in contact with the second side face of the multi-layer structure provides the primary current path between the channel layer 106 and the drain electrode 173. As described above, the thickness of the channel layer 106 is extremely thin and the contact resistance between the drain electrode 173 and the channel layer 106 is not sufficiently low. However, the second ohmic contact layer 120-2 has the second side-extending portions in contact with the channel layer 106 to increase the contact area with the channel layer 106. The second side-extending portions of the second ohmic contact layer 120-2 make wide the primary current path between the drain electrode 173 and the channel layer 106. The primary current path exists not only through the second side face of the multi-layer structure but also through the two adjacent side faces to the second side faces. The further increase of the primary current path surely reduces the contact resistance between the drain electrode 173 and the channel layer 106. Namely, the second side-extending portions of the second ohmic contact layer 120-2 provide the additional current path for electron current between the drain electrode 173 and the channel layer 106, whereby the further reduction in the contact resistance between the drain electrode 173 and the channel layer 106 is surely obtained.

The second ohmic contact layer 120-2 further more has a second bottom-extending portion which extends under the bottom surface of the multi-layer structure. The second bottom-extending portion continuously extends from an edge of the bottom surface of the multi-layer structure inwardly, provided that the inside edge of the second bottom-extending portion of the second ohmic contact layer 120-2 is aligned to the inside edge of each of the second side-extending portions of the second ohmic contact layer 120-2. The second bottom-extending portion of the second ohmic contact layer 120-2 has a lateral length which is defined between the second edge of the bottom surface of the multi-layer structure to the second inside edge of the second bottom-extending portion. The lateral length of the second bottom-extending portion of the second ohmic contact layer 120-2 is the same as the maximum lateral length of each of the second side-extending portions of the second ohmic contact layer 120-2, provided that the lateral length of the second bottom-extending portion of the second ohmic contact layer 120-2 is less than a half of the distance defined between the first and second side faces opposite to each other of the multi-layer structure. The second ohmic contact layer 120-2 in contact with the second side face of the multi-layer structure provides the primary current path between the channel layer 106 and the drain electrode 173. As described above, the thickness of the channel layer 106 is extremely thin and the contact resistance between the drain electrode 173 and the channel layer 106 is not sufficiently low. However, the second ohmic contact layer 120-2 has the second bottom-extending portion in contact with the par of the bottom surface of the multi-layer structure. The second bottom-extending portion of the second ohmic contact layer 120-2 provides another secondary current path between the drain electrode 173 and the channel layer 106. In the drawing, the primary current path is represented by "R2" and "R3", whilst the another secondary current path is represented by "R4". The further provision of the other secondary current path in addition to the primary current path surely reduces the contact resistance between the drain electrode 173 and the channel layer 106. Namely, the second bottom-extending portion of the second ohmic contact layer 120-2 provides the additional current path for electron current between the drain electrode 173 and the channel layer 106, whereby the further reduction in the contact resistance between the drain electrode 173 and the channel layer 106 is surely obtained.

As described above, the above first and second side-extending portions and the first and second bottom-extending portions of the first and second ohmic contact layers 120-1 and 120-2 may provide a reduction in contact resistance between the source and drain electrodes 172 and 173 through the channel region.

In this embodiment, the above described novel ohmic contact layer structure is applied to the p-n junction field effect transistor of the Group III–V compound semiconductors. It is, however, possible to apply the above described novel ohmic contact layer structure to other semiconductor devices, such as high electron mobility transistor and heterojunction field effect transistor.

Figure 12:
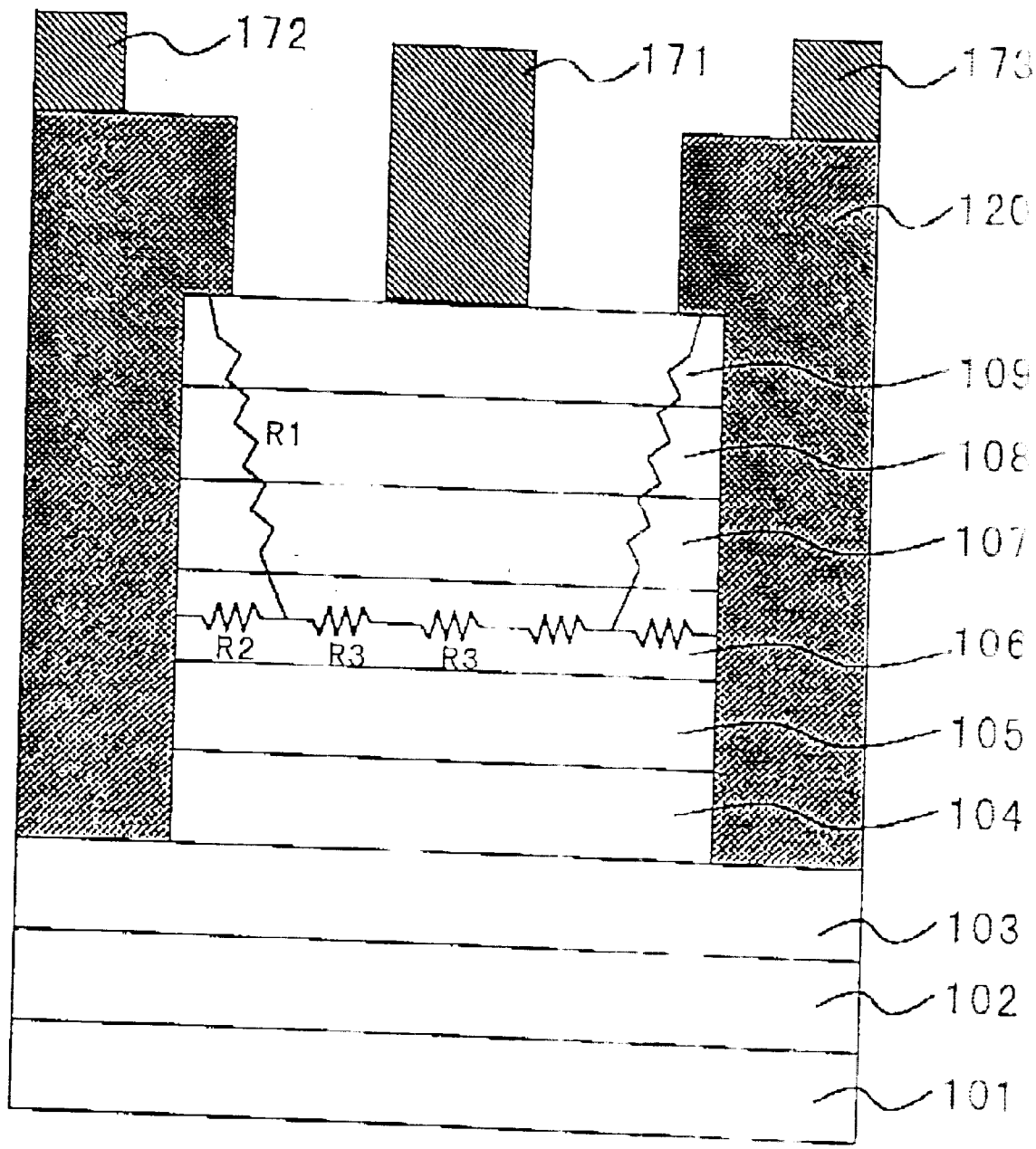
FIG. 12 is a fragmentary cross sectional elevation view illustrative of a ninth novel compound semiconductor field effect transistor in a ninth embodiment in accordance with the present invention.

NINTH EMBODIMENT:

A ninth embodiment according to the present invention will be described in detail with reference to the drawings. FIG. 12 is a fragmentary cross sectional elevation view illustrative of a ninth novel compound semiconductor field effect transistor in a ninth embodiment in accordance with the present invention. A GaAs buffer layer 102 having a thickness of 400 nanometers is provided on a top surface of a semi-insulating GaAs substrate 101. An $Al_{0.2}Ga_{0.8}As$ buffer layer 103 having a thickness of 100 nanometers is provided on a top surface of the GaAs buffer layer 102. A multi-layer structure is selectively provided on a predetermined region of the top surface of the $Al_{0.2}Ga_{0.8}As$ buffer layer 103. The multi-layer structure comprises laminations of the following six layers. An Si-doped $Al_{0.2}Ga_{0.8}As$ electron donor layer 104 having a thickness of 4 nanometers and an Si impurity concentration of 4E18 $cm^{-3}$ is selectively provided on the predetermined region of the top surface of the $Al_{0.2}Ga_{0.8}As$ buffer layer 103. An undoped $Al_{0.2}Ga_{0.8}As$ spacer layer 105 having a thickness of 2 nanometers is provided on a top surface of the Si-doped $Al_{0.2}Ga_{0.8}As$ electron donor layer 104. An undoped $In_{0.2}Ga_{0.8}As$ channel layer 106 having a thickness of 15 nanometers is provided on a top surface of the undoped $Al_{0.2}Ga_{0.8}As$ spacer layer 105. An undoped $Al_{0.2}Ga_{0.8}As$ spacer layer 107 having a thickness of 2 nanometers is provided on a top surface of the undoped $In_{0.2}Ga_{0.8}As$ channel layer 106. An Si-doped $Al_{0.2}Ga_{0.8}As$ electron donor layer 108 having a thickness of 12 nanometers and an Si impurity concentration of 4E18 $cm^{-3}$ is selectively provided on a top surface of the undoped $Al_{0.2}Ga_{0.8}As$ spacer layer 107. An undoped $Al_{0.2}Ga_{0.8}As$ layer 109 having a thickness of 15 nanometers is provided on a top surface of the Si-doped $Al_{0.2}Ga_{0.8}As$ electron donor layer 108. The multi-layer structure thus comprises the above lamination structure of the six layers, for example, the Si-doped $Al_{0.2}Ga_{0.8}As$ electron donor layer 104, the undoped $Al_{0.2}Ga_{0.8}As$ spacer layer 105, the undoped $In_{0.2}Ga_{0.8}As$ channel layer 106, the undoped $Al_{0.2}Ga_{0.8}As$ spacer layer 107, the Si-doped $Al_{0.2}Ga_{0.8}As$ electron donor layer 108, and the undoped $Al_{0.2}Ga_{0.8}As$ layer 109. A gate electrode 171 is selectively provided on a predetermined region of a top surface of the undoped $Al_{0.2}Ga_{0.8}As$ layer 109 or the top surface of the multi-layer structure.

A first ohmic contact layer 120-1 is selectively provided over a predetermined region of the top surface of the $Al_{0.2}Ga_{0.8}As$ buffer layer 103, so that the first ohmic contact layer 120-1 extends in contact with an entire of a first side face of the multi-layer structure. The first ohmic contact layer 120-1 may comprise an Si-doped GaAs layer having an impurity concentration of 4E18 $cm^{-3}$. The first ohmic contact layer 120-1 has a top surface which is higher in level than the top surface of the multi-layer structure. The first ohmic contact layer 120-1 has a first top-extending portion which extends over a first side region of the top surface of the multi-layer structure. The first top-extending portion continuously extends from an edge of the top surface of the multi-layer structure toward the gate electrode 171, provided that a first inside edge of the first top-extending portion of the first ohmic contact layer 120-1 is distanced from the gate electrode 171. The first top-extending portion of the first ohmic contact layer 120-1 has a first lateral length which is defined between the first edge of the top surface of the multi-layer structure to the first inside edge of the first top-extending portion. It is preferable that the first lateral length of the first top-extending portion of the first ohmic contact layer 120-1 is not less than a thickness of the multi-layer structure or a total thickness of the above six layers 104, 105, 106, 107, 108 and 109 but not more than a half of a first distance defined between the gate electrode 171 and the first edge of the top surface of the multi-layer structure. Namely, it is preferable that the first inside edge of the first top-extending portion of the first ohmic contact layer 120-1 is positioned outside the half position between the edge of the gate electrode 171 and the first edge of the top surface of the multi-layer structure and inside the lateral distance from the first edge of the top surface of the multi-layer structure, wherein the lateral distance corresponds to the thickness of the multi-layer structure or the total thickness of the above six layers 104, 105, 106, 107, 108 and 109. It is most preferable that the first lateral length of the first top-extending portion of the first ohmic contact layer 120-1 is about a half of a first distance defined between the gate electrode 171 and the first edge of the top surface of the multi-layer structure. Namely, the first inside edge of the first top-extending portion of the first ohmic contact layer 120-1 is positioned at an intermediate point between the edge of the gate electrode 171 and the first edge of the top surface of the multi-layer structure. A source electrode 172 is provided on a top surface of the first ohmic contact layer 120-1. The first ohmic contact layer 120-1 in contact with the first side face of the multi-layer structure provides a primary current path between the channel layer 106 and the source electrode 172. As described above, the thickness of the channel layer 106 is extremely thin and the contact resistance between the source electrode 172 and the channel layer 106 is not sufficiently low. However, the first ohmic contact layer 120-1 has the first top-extending portion in contact with the part of the top surface of the multi-layer structure. The first top-extending portion of the first ohmic contact layer 120-1 provides a secondary current path between the source electrode 172 and the channel layer 106. In the drawing, the primary current path is represented by "R2" and "R3", whilst the secondary current path is represented by "R1". The further provision of the secondary current path in addition to the primary current path surely reduces the contact resistance between the source electrode 172 and the channel layer 106. Namely, the first top-extending portion of the first ohmic contact layer 120-1 provides the additional current path for electron current between the source electrode 172 and the channel layer 106, whereby the further reduction in the contact resistance between the source electrode 172 and the channel layer 106 is surely obtained.

A second ohmic contact layer 120-2 is selectively provided over another predetermined region of the top surface of the $Al_{0.2}Ga_{0.8}As$ buffer layer 103, so that the second ohmic contact layer 120-2 extends in contact with an entire of a second side face of the multi-layer structure. The second ohmic contact layer 120-2 may comprise an Si-doped GaAs layer having an impurity concentration of $4E18\ cm^{-3}$. The second ohmic contact layer 120-2 has a top surface which is higher in level than the top surface of the multi-layer structure. The second ohmic contact layer 120-2 has a second top-extending portion which extends over a second side region of the top surface of the multi-layer structure. The second top-extending portion continuously extends from an edge of the top surface of the multi-layer structure toward the gate electrode 171, provided that a second inside edge of the second top-extending portion of the second ohmic contact layer 120-2 is distanced from the gate electrode 171. The second top-extending portion of the second ohmic contact layer 120-2 has a second lateral length which is defined between the second edge of the top surface of the multi-layer structure to the second inside edge of the second top-extending portion. It is preferable that the second lateral length of the second top-extending portion of the second ohmic contact layer 120-2 is not less than a thickness of the multi-layer structure or a total thickness of the above six layers 104, 105, 106, 107, 108 and 109 but not more than a half of a second distance defined between the gate electrode 171 and the second edge of the top surface of the multi-layer structure. Namely, it is preferable that the second inside edge of the second top-extending portion of the second ohmic contact layer 120-2 is positioned outside the half position between the edge of the gate electrode 171 and the second edge of the top surface of the multi-layer structure and inside the lateral distance from the second edge of the top surface of the multi-layer structure, wherein the lateral distance corresponds to the thickness of the multi-layer structure or the total thickness of the above six layers 104, 105, 106, 107, 108 and 109. It is most preferable that the second lateral length of the second top-extending portion of the second ohmic contact layer 120-2 is about a half of a second distance defined between the gate electrode 171 and the second edge of the top surface of the multi-layer structure. Namely, the second inside edge of the second top-extending portion of the second ohmic contact layer 120-2 is positioned at an intermediate point between the edge of the gate electrode 171 and the second edge of the top surface of the multi-layer structure. A drain electrode 173 is provided on a top surface of the second ohmic contact layer 120-2. The second ohmic contact layer 120-2 in contact with the second side face of the multi-layer structure provides a primary current path between the channel layer 106 and the drain electrode 173. As described above, the thickness of the channel layer 106 is extremely thin and the contact resistance between the drain electrode 173 and the channel layer 106 is not sufficiently low. However, the second ohmic contact layer 120-2 has the second top-extending portion in contact with the part of the top surface of the multi-layer structure. The second top-extending portion of the second ohmic contact layer 120-2 provides a secondary current path between the drain electrode 173 and the channel layer 106. In the drawing, the primary current path is represented by "R2" and "R3", whilst the secondary current path is represented by "R1". The further provision of the secondary current path in addition to the primary current path surely reduces the contact resistance between the drain electrode 173 and the channel layer 106. Namely, the second top-extending portion of the second ohmic contact layer 120-2 provides the additional current path for electron current between the drain electrode 173 and the channel layer 106, whereby the further reduction in the contact resistance between the drain electrode 173 and the channel layer 106 is surely obtained.

As described above, the above first and second top-extending portions of the first and second ohmic contact layers 120-1 and 120-2 may provide a reduction in contact resistance, for example, about 0.1 ohm millimeter between the source and drain electrodes 172 and 173 through the channel region.

As described above, the top layer 109 of the multi-layer structure comprises the undoped $Al_{0.2}Ga_{0.8}As$ layer, wherein the compositional index of Al is 0.2. It is, however, more effective that the above novel ohmic contact structure is applied to when the compositional index of Al is not less than 0.3.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A structure of a semiconductor device, said structure comprising:
   a compound semiconductor multi-layer structure having at least a channel region;
   a gate electrode provided on said compound semiconductor multi-layer structure;
   an ohmic contact layer of a first material provided adjacent to a first side face of said multi-layer structure said ohmic contact layer being in contact with at least a part of said first side face; and
   at least one electrode being in contact with said ohmic contact layer, said at least one electrode being spatially separated from said compound semiconductor multi-layer structure by said ohmic contact layer,
   wherein said ohmic contact layer has a top extending portion which extends in contact with a part of a top surface of said multi-layer structure,
   wherein said top extending portion of said ohmic contact layer extends continuously from an edge of said top surface of said multi-layer structure inwardly, wherein said top extending portion of said ohmic contact layer has a first lateral length which is defined between an inside edge of said top extending portion and said edge of said top surface of said multi-layer structure, and said first lateral length is not less than a total thickness of said multi-layer structure, and wherein said first lateral length is not more than a half of a distance between said edge of said top surface of said multi-layer structure and an edge of said gate electrode.

2. The structure as claimed in claim 1, wherein said gate electrode is provided on said top surface of said multi-layer structure.

3. The structure as claimed in claim 1, wherein said multi-layer structure has a top layer comprising an AlGaAs layer having Al-index of not less than 0.3.

4. The structure as claimed in claim 1, wherein said ohmic contact layer comprises a compound semiconductor layer.

5. The structure as claimed in claim 1, wherein said ohmic contact layer farther has at least a side extending portion which extends in contact with at least a part of at least one of two adjacent side faces to said first side face of said multi-layer structure.

6. The structure as claimed in claim 5, wherein said side extending portion of said ohmic contact layer is in contact with at least said channel region.

7. The structure as claimed in claim 5, wherein said ohmic contact layer has two of said side extending portion extending in contact with both said two adjacent side faces from a bottom level to a top level of said multi-layer structure.

8. The structure as claimed in claim 5, wherein said at least side extending portion of said ohmic contact layer extends continuously from an edge of said adjacent side face of said multi-layer structure inwardly.

9. The structure as claimed in claim 8, wherein said at least side extending portion of said ohmic contact layer increases in lateral length from a top level toward the same level as said channel region, so that said at least side extending portion has a maximum lateral length in the same level as said channel region.

10. The structure as claimed in claim 1, wherein said ohmic contact layer moreover has a bottom extending portion which extends in contact with at least a part of a bottom face of said multi-layer structure.

11. The structure as claimed in claim 10, wherein said bottom extending portion of said ohmic contact layer extends continuously from a bottom edge of said bottom face of said multi-layer structure inwardly.

12. The structure as claimed in claim 1, wherein said ohmic contact layer further more has a top extending portion which extends in contact with a part of a top surface of said multi-layer structure, and said ohmic contact layer furthermore has said two side extending portions which extend in contact with at least parts of two adjacent side faces to said first side face of said multi-layer structure from a bottom level to a top level of said multi-layer structure, and said ohmic contact layer moreover has a bottom extending portion which extends in contact with at least a part of a bottom face of said multi-layer structure.

13. The structure as claimed in claim 12, wherein said top extending portion of said ohmic contact layer extends continuously from an edge of said top surface of said multi-layer structure inwardly, and said two side extending portions extend continuously from edges of said adjacent side faces of said multi-layer structure inwardly so that said two side extending portions increase in lateral length from a top level toward the same level as said channel region, whereby said at least side extending portion has a maximum lateral length in the same level as said channel region, and also wherein said bottom extending portion of said ohmic contact layer extends continuously from a bottom edge of said bottom face of said multi-layer structure inwardly.

14. The structure as claimed in claim 1, wherein said multi-layer structure and said at least ohmic contact layer are provided over a buffer layer which is provided over a semiconductor substrate.

15. A semiconductor device comprising:

a semiconductor substrate;

at least a buffer layer extending over said semiconductor substrate;

a multi-layer structure selectively provided over said buffer layer, and said multi-layer structure having at least a channel region;

a first ohmic contact layer selectively provided over said buffer layer and extending in contact with a first side face of said multi-layer structure;

a second ohmic contact layer selectively provided on said buffer layer and extending in contact with a second side face of said multi-layer structure, and said second side face being positioned in opposite side to said first side face;

a gate electrode provided over a top surface of said multi-layer structure; and source and drain electrodes being in contact with said first and second ohmic contact layers, respectively, said source and drain electrodes being spatially separated from said multi-layer structure by said first and second ohmic contact layers, wherein said first ohmic contact layer has a first top extending portion which extends in contact with a first part of said top surface of said multi-layer structure continuously from a first edge of said top surface inwardly, so that said first top extending portion has a first inside edge distanced from said gate electrode, wherein said second ohmic contact layer has a second top extending portion which extends in contact with a second part of said top surface of said multi-layer structure continuously from a second edge of said top surface inwardly, so that said second top extending portion has a second inside edge distanced from said gate electrode, wherein said first top extending portion of said first ohmic contact layer has a first lateral length which is defined between said first inside edge of said first top extending portion and said first edge of said top surface of said multi-layer structure and said first lateral length is not less than a total thickness of said multi-layer structure, and said first lateral length is not more than a half of a first distance between said first edge of said top surface of said multi-layer structure and a first side edge of said gate electrode, and wherein said second top extending portion of said second ohmic contact layer has a second lateral length which is defined between said second inside edge of said second top extending portion and said second edge of said top surface of said multi-layer structure, and said second lateral length is not less than said total thickness of said multi-layer structure, and said second lateral length is not more than a half of a second distance between said second edge of said top surface of said multi-layer structure and a second side edge of said gate electrode.

16. The semiconductor device as claimed in claim 15, wherein said first top extending portion of said ohmic contact layer has a first lateral length which is defined between said first inside edge of said top extending portion and said first edge of said top surface of said multi-layer structure, and said first lateral length is not less than a total thickness of said multi-layer structure, and said first lateral length is not more than a half of a first distance between said first edge of said top surface of said multi-layer structure and a first side edge of said gate electrode, as well as wherein said second top extending portion of said ohmic contact layer has a second lateral length which is defined between said second inside edge of said top extending portion and said second edge of said top surface of said multi-layer structure, and said second lateral length is not less than said total thickness of said multi-layer structure, and said second lateral length is not more than a half of a second distance between said second edge of said top surface of said multi-layer structure and a second side edge of said gate electrode.

17. The semiconductor device as claimed in claim 15, wherein said gate electrode is provided on said top surface of said multi-layer structure.

18. The semiconductor device as claimed in claim 15, wherein said multi-layer structure has a top layer comprising an AlGaAs layer having Al-index of not less than 0.3.

19. The semiconductor device as claimed in claim 15, wherein said first and second ohmic contact layers comprise compound semiconductor layers.

20. The semiconductor device as claimed in claim 15, wherein said first ohmic contact layer moreover has a first bottom extending portion which extends in contact with a first part of a bottom face of said multi-layer structure and also extends continuously from a first bottom edge of said bottom face, and wherein said second ohmic contact layer moreover has a second bottom extending portion which extends in contact with a second part of a bottom face of said multi-layer structure and also extends continuously from a second bottom edge of said bottom face.

21. The semiconductor device as claimed in claim 15, wherein said first ohmic contact layer further has first side extending portions which extend in contact with parts of two adjacent side faces to said first side face of said multi-layer structure from a bottom level to a top level of said multi-layer structure, so that said first side extending portions are in contact with at least said channel region, and said first side extending portions extend continuously from first side edges of said two adjacent side faces of said multi-layer structure inwardly, and wherein said second ohmic contact layer further has second side extending portions which extend in contact with parts of two adjacent side faces to said second side face of said multi-layer structure from said bottom level to said top level of said multi-layer structure, so that said second side extending portions are in contact with at least said channel region, and said second side extending portions extend continuously from second side edges of said two adjacent side faces of said multi-layer structure inwardly.

22. The semiconductor device as claimed in claim 21, wherein each of said first side extending portions of said ohmic contact layer increases in lateral length from said top level toward the same level as said channel region, so that each of said first side extending portions has a first maximum lateral length in the same level as said channel region, and wherein each of said second side extending portions of said ohmic contact layer increases in lateral length from said top level toward the same level as said channel region, so that each of said second side extending portions has a second maximum lateral length in the same level as said channel region.

23. The semiconductor device as claimed in claim 22, wherein said first ohmic contact layer moreover has a first bottom extending portion which extends in contact with a first part of a bottom face of said multi-layer structure and also extends continuously from a first bottom edge of said bottom face, and wherein said second ohmic contact layer moreover has a second bottom extending portion which extends in contact with a second part of a bottom face of said multi-layer structure and also extends continuously from a second bottom edge of said bottom face.

* * * * *